US006240541B1

(12) United States Patent
Yasuda et al.

(10) Patent No.: US 6,240,541 B1
(45) Date of Patent: May 29, 2001

(54) INTERACTIVE CIRCUIT DESIGNING APPARATUS WHICH DISPLAYS A RESULT OF COMPONENT PLACEMENT AND WIRE ROUTING FROM A LAYOUT DESIGN UNIT

(75) Inventors: Mitsuru Yasuda; Hiroyuki Sugiyama; Noriyuki Ito; Ryoichi Yamashita; Tadashi Konno; Yasunori Abe; Naomi Bizen; Terunobu Maruyama; Yoshiyuki Kato; Tomoyuki Isomura; Hiroshi Ikeda; Miki Takagi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/227,967

(22) Filed: Jan. 11, 1999

Related U.S. Application Data

(62) Division of application No. 08/574,901, filed on Dec. 19, 1995, now Pat. No. 5,889,677.

(30) Foreign Application Priority Data

Apr. 7, 1995 (JP) .................................................... 7-082871

(51) Int. Cl.[7] ...................................................... G06F 17/50
(52) U.S. Cl. ......................................... 716/6; 716/2; 716/8
(58) Field of Search ........................ 395/500.07, 500.09, 395/500.03, 500.08, 500.1, 500.13, 500.12, 500.02; 716/1, 2, 6, 8, 7, 11, 12

(56) References Cited

U.S. PATENT DOCUMENTS

| | | | |
|---|---|---|---|
| 4,855,726 | 8/1989 | Nishio | 345/133 |
| 4,947,365 | 8/1990 | Masubuchi | 395/500.13 |
| 4,970,664 | 11/1990 | Kaiser et al. | 345/346 |
| 5,038,294 | * 8/1991 | Arakawa et al. | 395/500.13 |
| 5,051,938 | 9/1991 | Hyduke | 395/500.36 |
| 5,077,676 | 12/1991 | Johnson et al. | 395/500.07 |
| 5,111,413 | 5/1992 | Lazansky et al. | 395/500.35 |
| 5,155,836 | 10/1992 | Jordan et al. | 395/500.44 |
| 5,220,512 | 6/1993 | Watkins et al. | 395/500.12 |
| 5,222,030 | 6/1993 | Dangelo et al. | 395/500.12 |
| 5,272,645 | * 12/1993 | Kawakami et al. | 364/491 |
| 5,333,032 | 7/1994 | Matsumoto et al. | 395/500.07 |
| 5,375,069 | * 12/1994 | Satoh et al. | 364/490 |
| 5,381,524 | 1/1995 | Lewis | 345/346 |
| 5,461,576 | * 10/1995 | Tsay et al. | 364/490 |
| 5,483,461 | * 1/1996 | Lee et al. | 364/490 |
| 5,507,029 | 4/1996 | Granato et al. | 395/500.07 |
| 5,541,849 | 7/1996 | Rostoker et al. | 395/500.19 |
| 5,544,067 | 8/1996 | Rostoker et al. | 395/500.35 |
| 5,553,002 | 9/1996 | Dangelo et al. | 395/500.12 |
| 5,555,201 | 9/1996 | Dangelo et al. | 395/500.02 |
| 5,572,436 | 11/1996 | Dangelo et al. | 395/500.19 |
| 5,572,717 | 11/1996 | Pedersen | 713/500 |
| 5,587,923 | * 12/1996 | Wang | 364/490 |
| 5,610,832 | * 3/1997 | Wikle et al. | 364/491 |
| 5,623,418 | 4/1997 | Rostoker et al. | 395/500.02 |
| 5,638,291 | * 6/1997 | Li et al. | 395/500.19 |
| 5,787,268 | * 7/1998 | Sugiyama et al. | 395/500.12 |
| 5,828,580 | * 10/1998 | Ho | 364/489 |
| 5,870,308 | * 2/1999 | Dangelo et al. | 364/489 |

* cited by examiner

Primary Examiner—Kevin J. Teska
Assistant Examiner—Vuthe Siek
(74) Attorney, Agent, or Firm—Armstrong, Westerman, Hattori, McLeland & Naughton

(57) ABSTRACT

A circuit designing apparatus of an interactive type which enables a simplified and highspeed circuit design process while largely reducing a burden on a designer, having a speed analyzing unit for conducting a delay computation for each wiring path on a circuit to be designed and a display control unit for displaying a result of the delay computation by the speed analyzing unit on a display unit. When the speed analyzing unit conducts a delay computation, a delay value of each logic component forming the circuit that is an object of the design is set and altered according to a dullness of a signal waveform inputted to the logic component. The circuit designing apparatus of an interactive type may be applied to a system for conducting a circuit design of an integrated circuit such as an LSI or the like or a printed circuit board.

24 Claims, 33 Drawing Sheets

FIG. 10

| No. | UpDelay [ps] | DnDelay [ps] | Pin Name |
|---|---|---|---|
| 1. | 1746.75 | 1807.73 | ADDR_BUF<8>.CK |
| 2. | 1666.47 | 1752.58 | ADD_BUF<6>.CK |
| 3. | 1665.78 | 1761.79 | ADD_BUF<7>.CK |
| 4. | 1618.76 | 1709.81 | SUB_BUF<0>.CK |
| 5. | 1555.21 | 1436.43 | SUB_BUF<1>.CK |
| ⋮ | ⋮ | ⋮ | ⋮ |

FIG. 11

| No. | UpDelay [ps] | DnDelay [ps] | Pin Name |
|---|---|---|---|
| 1. | 1666.47 | 1752.58 | ADD_BUF<6>.CK |
| 2. | 1665.78 | 1761.79 | ADD_BUF<7>.CK |
| 3. | 1746.75 | 1807.73 | ADDR_BUF<8> CK |
| 4. | 1618.76 | 1709.81 | SUB_BUF<0>.CK |
| 5. | 1555.21 | 1436.43 | SUB_BUF<1>.CK |
| ⋮ | ⋮ | ⋮ | ⋮ |

FIG. 12

| No. | UpDelay [ps] | DnDelay [ps] | Pin Name |
|---|---|---|---|
| 1. | 1746.75 | 1807.73 | ADDR_BUF<8>.CK |
| 2. | 1666.47 | 1752.58 | ADD_BUF<6>.CK |
| 3. | 1665.78 | 1761.79 | ADD_BUF<7>.CK |
| 4. | 1618.76 | 1709.81 | SUB_BUF<0>.CK |
| 5. | 1555.21 | 1436.43 | SUB_BUF<1>.CK |
| ⋮ | ⋮ | ⋮ | ⋮ |

FIG. 13

| No. | UpDelay [ps] | DnDelay [ps] | Pin Name |
|---|---|---|---|
| 1. | 1746.75 | 1807.73 | ADDR_BUF<8>.CK |
| 2. | 1665.78 | 1761.79 | ADD_BUF<7>.CK |
| 3. | 1666.47 | 1752.58 | ADD_BUF<6>.CK |
| 4. | 1618.76 | 1709.81 | SUB_BUF<0>.CK |
| 5. | 1555.21 | 1436.43 | SUB_BUF<1>.CK |
| ⋮ | ⋮ | ⋮ | ⋮ |

| NO. | UpDelay [ps] | DnDelay [ps] | Pin Name |
|---|---|---|---|
| 1~20 | 1746.75~1555.21 | 1807.73~1436.43 | ADD_BUF<8>.CK~ |
| 20~40 | 1554.63~1332.43 | 1423.45~1298.67 | SUB_BUF<4>.CK~ |
| ⋮ | ⋮ | ⋮ | ⋮ |

FIG. 16

| PIN NAME | <MACRO NAME> | NET LENGTH | FAN-OUT/ NET NAME | (UpDelay/ UpTsin/ ,DnDelay/DnTsin) |
|---|---|---|---|---|
| Pad__CLK.X | <> | len=100 | f/O=1 CLK | ( 0.00/ 3.00/*, 0.00/ 3.00/ ) |
| IBUF_CLK.X | <O1EKRVV> | | | ( 0.00/ , 0.00/ ) |
| IBUF_CLK.IT | <O1EKRVV> | len=3234 | f/O=1 I_CLK | ( 144.65/ 3.00/*, 169.02/ 3.00/ ) |
| DIS11.A1 | <O1KDX3> | | | ( 650.43/ , 681.47/ ) |
| DIS11.X | <O1KDX3> | len=481 | f/O=4 -DIS110 | (1226.66/105.87/ , 994.85/ 98.67/*) |
| DIS21.A | <O1K11W> | | | (1229.89/ , 996.97/ ) |
| DIS21.X | <O1K11W> | len=994 | f/O=4 -DIS410 | (1489.08/ 42.32/*,1563.29/ 43.73/ ) |
| AD0 BUF<8>.CK | <O1STF2> | | | (1871.75/ 47.88/*,1985.11/ 73.24/ ) |

NOTE : * REPRESENTS EDGE

```
Pin     : A
Cell    : DIS22
Macro   : O1K2F
Net     : —
Delay   : 1229.89, 996.97
Tsin    : 105.87 , 98.67
```

---

```
From
Pin     : X
Cell    : DIS11
Macro   : O1KDX3
Net     : I_CLK
Delay   : 1226.66, 994.85
Tsin    : 105.87 , 98.67
```

---

```
To
Pin     : X
Cell    : DIS22
Macro   : O1K2F
Net     : -DIS220
Delay   : 1256.45, 1000.21
Tsin    : 105.87, 98.67
```

FIG. 30
| 9 | 10 | 21 | 13 | 14 | 23 |
|---|----|----|----|----|----|
| 11 | 1 | 2 | 22 | 25 | 24 |
| 12 | 3 | 4 | 17 | 5 | 30 |
| 27 | 19 | 20 | 26 | 6 | 29 |
| 18 | 7 | 8 | 15 | 16 | 28 |
FIG. 31(a)
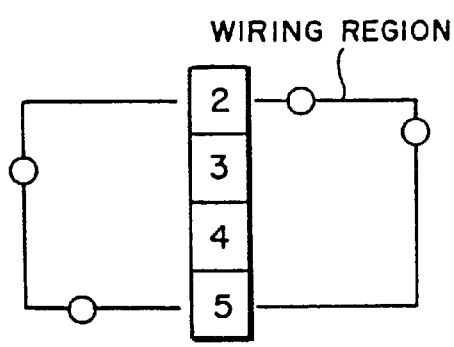
FIG. 31(b)
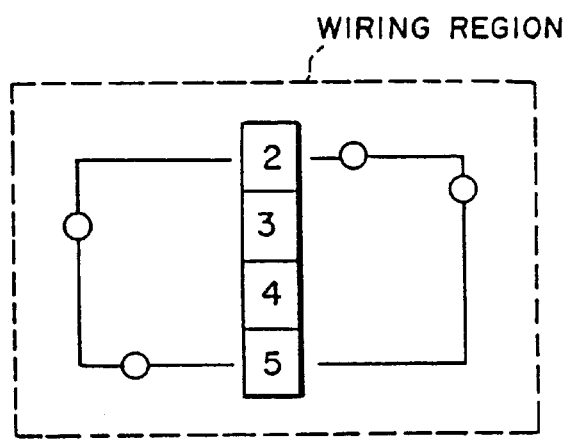

VERTICAL MAIN WIRING LAYER

HORIZONTAL MAIN WIRING LAYER

A-LAYER

B-LAYER

C-LAYER

D-LAYER

```
Overlap Error
 AAA6EA14
 AAA6CA2A
 AAB4EC14      ⟵51
 AAB2CA2A
 ABC5CA2A
 ABD1DA2A
 ACD1EA2A
```

▨ --- PLACEMENT ERROR CELL

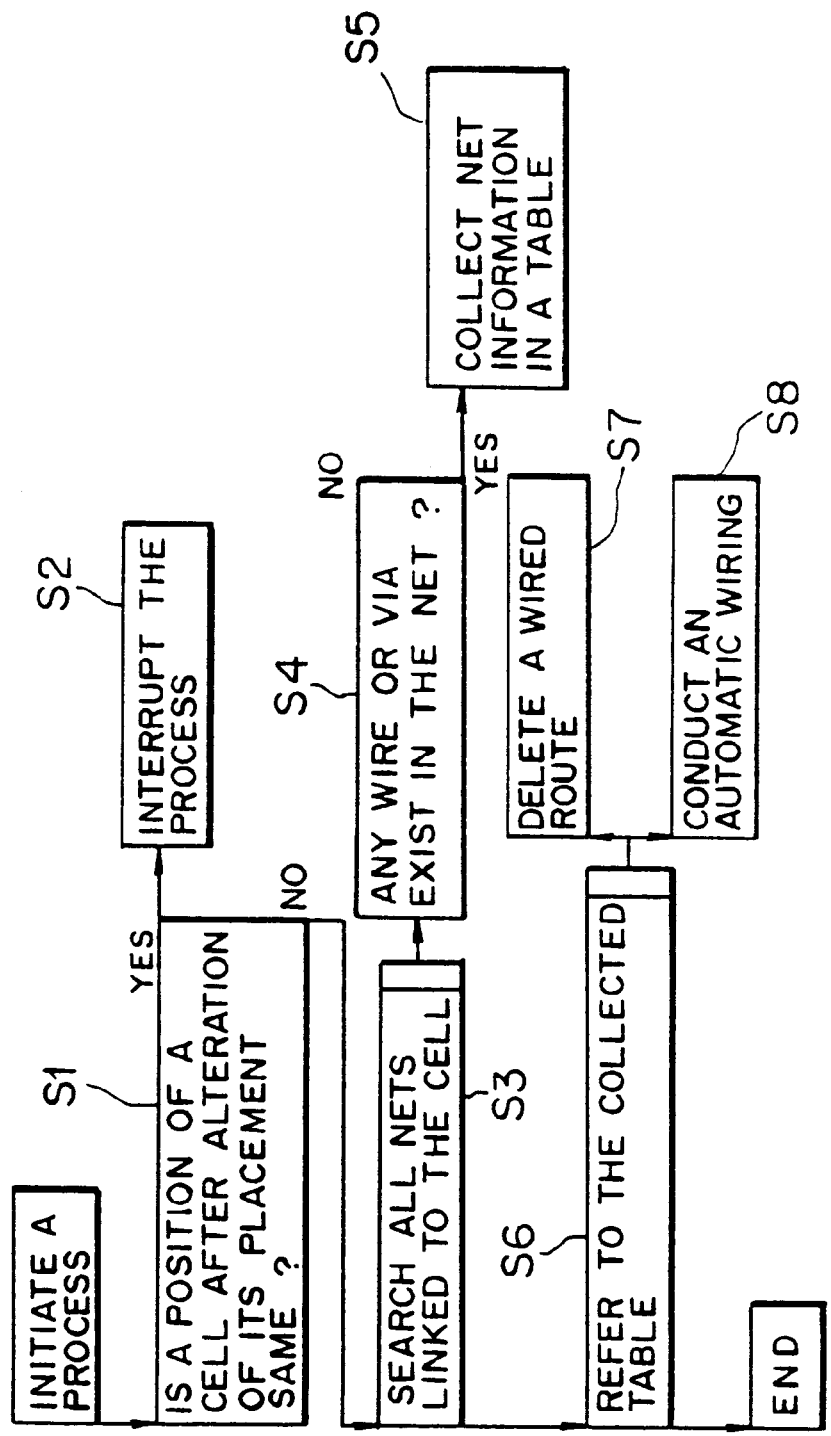

F2   B0   F1

INTERACTIVE CIRCUIT DESIGNING APPARATUS WHICH DISPLAYS A RESULT OF COMPONENT PLACEMENT AND WIRE ROUTING FROM A LAYOUT DESIGN UNIT

This application is a Divisional application of prior application Ser. No. 08/574,901 filed Dec. 19, 1995 now U.S. Pat. No. 5,889,677.

BACKGROUND OF THE INVENTION

1) Field of the Invention

The present invention relates to a circuit designing apparatus of an interactive type which conducts a circuit design of an integrated circuit such as an LSI or a printed circuit board in an interactive form while displaying steps of the circuit design on a display unit such as a display or the like.

2) Description of the Related Art

In general, a logic design, a layout design (a mounting design) or a speed analysis are conducted when a circuit such as an LSI, a printed board, etc. is designed.

More specifically, a logic design for realizing functions demanded by a circuit that is an object of the design is first conducted. A layout design for determining a placement in mounting (physical) of cells (sometimes called elements or gates) such as flip-flops as logic components or wiring between the cells is then conducted on the basis of a result of the logic design.

After the layout design, a speed analysis on the basis of a delay computation is conducted for each path obtained as a result of the design to feed-back a magnitude of a delay obtained as a result of the analysis. The logic design and the layout design are again performed in order to improve a delay of each path. The above logic design, layout design and speed analysis are repeated by trial-and-error until each path has an optimum delay in a try-and-error fashion.

A system (a software) for conducting a logic design, a layout design and a speed analysis in each step has been existing as an interactive logic design system, an interactive layout design system and an interactive speed analysis system, which are not in a system structure suitable for conducting processes in linkage. For this, a circuit design is conducted in a series of processes accompanied by feed-back in the known technique.

In the general circuit designing technique set forth above, the logic design, the layout design and the speed analysis are not linked to each other since they are conducted separately by different systems (softwares). It is thus necessary to repeat each process sequentially, which causes a longer turnaround time and prevents a high-speed design and development of a circuit such as an LSI, a printed circuit board, etc.

There has been proposed a circuit designing apparatus of an interactive type in which a logic design system, a layout design system and a speed analysis system are connected so as to be able to link with each other on occasion.

However, even the circuit designing system of an interactive type in which each of the above systems exist separately or the circuit designing system of an interactive type in which the above systems are connected so as to be associated with each other results in the following various problems.

(1) Recently, integrated circuits, such as LSI circuits have become more microscopic more and more. With this, a problem of a wiring capacitance becomes significant such that a waveform of a signal transferred in a wiring path on a circuit is apt to become rounded.

A binary signal transferred in a circuit rises or falls from one level to another within an extremely short time of about zero in theory. However, if a wiring capacitance increases as stated above, a slew rate of a rise or a fall from one level to another level increases. This slew rate is a measure of a degree of "rounding" in a signal waveform. If rounding occurs, a time (Tsin) required to reach from one level to another level increases, thus a time required to reach a threshold value used to judge as to whether the binary signal is in either one of two levels, as a matter of fact. If a delay value in the event that a signal having such rounding passes through a logic component (referred as a gate, cell or element on occasion) is determined uniformly upon speed analysis as before, a difference between a calculated delay value and an actual delay value becomes extremely large, which prevents an accurate delay computation.

(2) A delay computation by speed analysis is conducted after placement of logic components or after wiring between placed components, in general. There has been no case where the delay computation is conducted in a stage after a logic design. As a circuit that is an object of a design becomes more microscopic and highly integrated, there is a demand to obtain a result of a delay computation in an early stage, that is, a final stage of a logic design so as to take it into account in the design.

(3) In a wiring design of an integrated circuit such as an LSI or the like, data transfer between flip-flops (FFs) that are logic components should meet various timing restrictions (overdelay, racing). It is impossible for the designer to pay attention to wiring paths of all combinations of flip-flops of the number extending, in general, to hundreds of thousands to make a check as to whether a result of the wiring design meets the timing restrictions in any of the above circuit designing apparatus of an interactive type.

(4) If a condition of wiring connections of a circuit that is an object of the design is displayed on a display unit such as a display in a wiring design of an integrated circuit such as an LSI or the like, each of characteristic points for the wiring (vias, pins of logic components, or the like) is displayed in a displaying position proportional to actual coordinate values of the characteristic point. In this case, if there is a large difference in density of existing characteristic points locally, it is difficult to discriminate a detailed part having a high density on the display unit if the whole of the circuit is displayed. If the detailed part is enlarged and displayed, it is difficult to grasp the whole image of the circuit that is the object of the design.

(5) If wiring between logic components is performed after each of the logic components has been placed in a layout design, a part in which a wiring is extremely congested or a part in which a tight restriction to a delay value (a high critical degree) set in advance is imposed on a wiring may occur depending on a condition of placement of the logic components. An actual wiring devoid of a consideration on such parts causes a lot of unroutable parts and degradation of wiring efficiency.

(6) Cell that is a logic component placed on an integrated circuit such as an LSI or the like has been in the same shape and the same size. Once a placing position for a cell is determined, there has occurred no placement error such as cell overlapping or the like. However, there is a case where cells having different sizes are placed on the same circuit with a change in the LSI technology, a placement error such that cells overlap to each other may occur. In the present condition, there is no way for the designer to immediately know such placement error. For this, there is a demand for a development of a technique helpful for the designer to clearly know a condition of occurrence of a placement error.

(7) If a part that has been already wired is re-wired, the designer designates two points that should be re-wired on a wiring path that has been wired, and conducts a re-wiring in a designated wiring length, which imposes a great burden on the designer. In consequence, there is a demand for a simplified, automated re-wiring process.

(8) In the case of replacing a cell that has been placed, a re-wiring of the cell after the replacement cannot be executed unless the designer gives an instruction to re-wire separately even if a net that should be linked to the cell has been wired, which imposes a great burden on the designer. There is therefore a demand for a simplified, automated replacing process.

(9) While plural placement maps of a common circuit are displayed on the display unit, the designer refers to one of these maps and conducts a placing process or a wiring process on the map. However, a result of the process does not reflect on other maps. As a result, there occurs a case where a result of an alteration in design differs from a condition of the design displayed on the placement map, which may cause a confusion of the designer who works out a design in an interactive form by referring the display unit.

(10) With an increase of the number of elements mounted on an integrated circuit such as an LSI or the like, a technique for dividing an inside of the chip into plural hierarchical layout blocks (LSG: Layout SubGroup) to conduct a mounting becomes the main current. At this time, a net connecting divided blocks exists, in general. Therefore, in a hierarchical layout design, an input/output terminal (a virtual block terminal; referred as a temporary terminal, hereinafter) is temporarily provided to each block, the temporary terminal is placed at the time of placement of the inside of each block, an element and the temporary terminal are connected inside the block, and the temporary terminals of respective blocks are wired and connected to connect the blocks.

Upon the hierarchical layout design as above, it is necessary that a temporary terminal is manually placed by the designer in a place that the designer thinks appropriate in consideration of a connection of the temporary terminal and an element in the block or a connection of the temporary terminal and another block. A recent layout design system employs a technique for automatically placing all blocks in consideration on a relation of placement of individual blocks in the entire circuit. However, a manual work including a shift of each temporary terminal is indispensable in order to conduct a placement respecting an intention of the designer. Since this process is conducted in consideration of only placement of blocks, no attention is paid regarding placement of elements inside the block or wiring between the elements.

(11) An input/output terminal of an integrated circuit such as an LSI or the like is placed in a peripheral area of the chip. There has been no freedom to alter its coordinates in a mounting design. To the contrary, by employing a technique for arranging spherical terminals called bumps on the chip surface, it is possible to determine a position of the input/output terminal on the chip, which increases a degree of freedom in placement. With this, it becomes possible to place an input/output circuit that should be connected to the input/output terminal within a region in which a general element is placed close to a position of the input/output terminal.

An increase of a degree of freedom to place the input/output terminal and the input/output circuit sometimes causes a limitation of in wiring length between the input/output terminal and the input/output circuit. In the case of the hierarchical layout design stated above, there is a possibility that the input/output terminal and the input/output circuit belong different layout hierarchical blocks. In such a case, there is no way to examine when an inside of each block is being designed as to whether the wiring length between the input/output terminal and the input/output circuit is below the limit value. Or, there is a possibility that a region in which the input/output circuit should be placed is not definite since a placing position of the input/output terminal is not definite.

SUMMARY OF THE INVENTION

In the light of the various problems described above, an object of the present invention is to provide a circuit designing apparatus of an interactive type which can accomplish a high-speed and accurate delay computation, a timing check on all wiring paths, a simultaneous and clear display of not only a detailed part but also a whole of a circuit that is an object of the design seizable by the designer, an improvement of wiring efficiency, a clear representation of a condition of occurrence of a placement error, simplification and automation of a replacing process or a re-wiring process, a multi-window display without causing a confusion, etc. so as to simplify and speed up a circuit design of an integrated circuit such as an LSI or a printed circuit board while largely reducing a burden on the designer.

According to a first embodiment, a circuit designing apparatus of an interactive type includes a display unit for displaying steps of a circuit design and an input unit for inputting information responsive to display data on the display unit or information necessary for a circuit design in order to conduct the circuit design in an interactive form. This circuit designing apparatus of an interactive type further includes a speed analyzing unit for conducting a delay computation for each wiring path on a circuit that is an object of the design, and a display control unit for displaying a result of the delay computation by the speed analysing unit on the display unit, wherein upon a delay computation by the speed analyzing unit, a delay value of each logic component forming the circuit that is the object of the design is set and altered according to a rounding of a signal waveform inputted to the logic component.

According to a second embodiment, a circuit designing apparatus of an interactive type includes a display unit and an input unit similar to those described above. This circuit designing apparatus of an interactive type further includes a logic design unit for conducting a logic design of a circuit to be designed, a layout design unit for conducting a placement in mounting of each of logic components forming the circuit to be designed on the basis of a result of the logic design by the logic design unit, then wiring between the logic components, a speed analyzing unit for conducting a delay computation for each wiring path on the circuit that is the object of the design, and a display control unit for causing the display unit to display a result of a logic design by the logic design unit, a result of a placement/wiring by the layout design unit and a result of the delay computation by the speed analyzing unit, wherein the above logic design unit, layout design unit and speed analyzing unit are connected so as to be associated with each other on occasion, and the speed analyzing unit estimates and calculates a delay value of a wiring path of the circuit that is the object of the design while estimating a delay value between the logic components on the basis of an empirical delay value set in advance before the layout design unit performs a placement in mounting of each of the logic components after the logic design by the logic design unit.

In the second embodiment, it is possible that before a wiring between the logic components after the placement in mounting of each of the logic components by the layout design unit, the speed analyzing unit estimates and calculates a delay value of a wiring path of the circuit to be designed on the basis of the shortest route between pins that should be connected to each other. It is also alternatively possible that the speed analyzing unit calculates a delay value of a wiring path of the circuit to be designed on the basis of a result of an actual wiring by the layout design unit.

In the second embodiment, a delay value for each logic component may be set and altered according to dullness of a signal waveform inputted to a logic component when the speed analyzing unit conducts a delay computation.

In the first and second embodiments, rounding if of a signal waveform is added in the delay computation as above, the circuit designing apparatus of an interactive type further includes a path trace unit for tracing a wiring path connected to a predetermined pin designated according to an instruction through the input unit from that pin, wherein the speed analyzing unit calculates a degree of rounding of a signal waveform varying, along the wiring path and sets a delay value of a logic component on that wiring path according to the dullness to conduct a delay computation of that wiring path concurrently with a tracing process of the wiring path by the path trace unit.

At this time, the circuit designing apparatus of an interactive type according to the first and second embodiments further includes a timing check unit for checking a timing of supply of a clock signal to each of the logic components, wherein if a clock system supplying a clock signal to each of the logic components has been already designed, the timing check unit designates a clock pin of the clock system on which the check should be made and an initial value and a phase of the clock signal inputted from the clock pin through the input unit, the path trace unit traces a wiring path from that clock pin to search all logic components connected to that clock pin, the speed analyzing unit, at the same time, conducts a delay computation of all wiring paths between that clock pin and respective logic components connected to that clock pin and stores a result of the delay computation as a clock path delay values, and a flag showing that a logic component searched by the path trace unit is an object of a check by the timing check unit is set to each pin of the logic component. After that, the path trace unit conducts a tracing process of a wiring path from a clock input pin of each of all the searched logic components, and activates the timing check unit when the path trace unit traces a pin to which the flag is set in the tracing process. The timing check unit conducts a clock timing check on a logic component to which that pin belongs on the basis of the delay value up to the pin calculated by the speed analyzing unit, the clock path delay value, and an initial value and a phase of a clock signal designated through the input unit.

The circuit designing apparatus of an interactive type according to the first and second inventions may include a delay value setting unit for setting a predetermined delay value to an arbitrary pin traced by the path trace unit according to an instruction through the input unit, wherein the speed analyzing unit adds a predetermined value set by the delay value setting unit as a delay value of a wiring path passing through that pin.

On the other hand, the circuit designing apparatus of an interactive type according to the first and second embodiments may include a timing check unit similar to the above, and a search unit for searching all logic components forming a circuit that is an object to embodiment, each of which having a clock input pin connected to a clock system if the clock system supplying a clock signal to each of the logic components is not yet designed, wherein a flag showing that a logic component searched by the search unit is an object of a check by the timing check unit is set to each pin of the logic component. After that, the path trace unit conducts a tracing process on a wiring path from a clock input pin of each of all the logic components searched by the search unit. If the path trace unit traces a pin to which a flag is set in the tracing process, the path trace unit activates the timing check unit. The timing check unit conducts a clock timing check on a logic component to which that pin belongs on the basis of a delay value up to that pin calculated by the speed analyzing unit.

The circuit designing apparatus of an interactive type according to the first and second embodiments may include a counter for counting the number of times that pin is traced by the path trace unit, wherein the display control unit causes the display unit to display information in terms of a magnitude of frequency of passage of signals through each pin on the basis of a count value of each pin counted by the above counter.

The circuit designing apparatus of an interactive type according to the first and second embodiments may include a region setting unit for setting an executing region in which the path trace unit conducts a tracing process on a wiring path and the speed analyzing unit conducts a delay computing process in response to an instruction through the input unit, wherein the display control unit causes the display unit to display only a result of the process in said executing region set by the region setting unit.

The circuit designing apparatus of an interactive type according to the first and second embodiments may include a trace control unit for switching and controlling an operation of the path trace unit such that the path trace unit conducts a forward trace from a trace start pin if only the trace start pin is designated according to an instruction through the input unit, conducts a backward trace from a trace destination pin if only the trace destination pin is designated according to an instruction through the input unit, and conducts a trace between two points if these two points, that is, a trace start pin and a trace destination pin, are designated according to an instruction through the input unit. In this case, a mode as to whether the speed analyzing unit executes a delay computation after a backward trace when the trace control unit causes the path trace unit to execute a backward trace.

The display control unit may cause the display unit to display a result of a tracing by the path trace unit and a result of a delay computation by the speed analyzing unit as a list of trace destination pins. The display control unit may have a sorting function to sort a display condition of the list according to pin names of the trace destination pins or delay values of the trace destination pins.

In this case, the display control unit causes the display unit to hierarchically display the above list. When information of an upper hierarchy on the display unit is selected according to an instruction through the input unit, the display control unit causes the display unit to display information of a lower hierarchy corresponding to the information of the upper hierarchy selected. In addition, the circuit designing apparatus according to the first and second inventions may include an external file writing unit for writing the list of the trace destination pins displayed on the display unit by the display control unit into an external file.

The display control unit may cause the display unit to display a result of a tracing by the path trace unit as a schematic destination route diagram, in addition, a result of a delay computation by the speed analyzing unit corresponding to the result of the tracing as a graph showing a delay value and an accumulated delay value at a point corresponding to a position in the schematic destination route diagram.

In this case, the display control unit causes the display unit to simultaneously display the schematic destination route diagrams and the graphs of plural wiring paths. The circuit designing apparatus of an interactive type according to the first and second inventions may further include a printing unit for printing out the schematic destination route diagram or the graph displayed on the display unit by the display control unit, or an external file writing unit for writing the schematic destination route diagram or the graph displayed on the display unit by the display control unit into an external file. Further, the display control unit may cause the display unit to display an actual circuit diagram corresponding to the schematic destination route diagram according to an instruction through the input unit. Still further, the display control unit may cause the display unit to display all wiring paths each from a trace start pin to a trace destination pin traced by the path trace unit with a pin name of a pin of each logic component in the form of a tree structure, and if an arbitrary pin is selected on the display of the wiring paths in the form of a tree structure displayed on the display unit according to an instruction through the input unit, the display control unit may cause the display unit to display detailed information including a delay value of the selected pin.

A circuit designing apparatus of an interactive type according to a third embodiment includes a display unit and an input unit similar to those described above. The circuit designing apparatus of an interactive type according to the third embodiment further includes a display control unit for causing the display unit to display a wiring connection condition between characteristic points including a pin of each logic component forming a circuit that is an object of a design. The display control unit sorts coordinates of the characteristic points in the order their ascending or descending for each coordinate axis, substitutes them with coordinate values proportional to that order, and causes the display unit to display the characteristic points.

In this case, points at both ends of a wire connecting pins of the logic components and internal dividing points on the wire are taken out as the characteristic points. If the wiring connection condition displayed on the display unit extends over plural layers, the display control unit may add an offset proportional to the order of a layer on which the characteristic point exists to the substituted coordinate values to cause the display unit to display the characteristic points. Further, it is possible to set an identifier common to before and after the substitution of the coordinates to each characteristic point.

A circuit designing apparatus of an interactive type according to a fourth invention includes a display unit and an input unit similar to those described above. The circuit designing apparatus of an interactive type according to the fourth invention further includes a layout design unit for conducting a placement in mounting of each logic component forming a circuit that is an object of a design on the basis of a result of a logic design, then wiring the logic components, a display control unit for causing the display unit to display a result of a placement/wiring by the layout design unit, and a wiring route estimating unit for virtually wiring between the logic components in a stage where the layout design unit determines a placement in mounting of each of the logic components to estimate a wiring path, wherein the layout design unit determines an order of wiring and a rate of roundabout on the basis of a result of the estimation by the wiring route estimating unit, then conducts an actual wiring between the logic components according to the determined order of wiring and rate of roundabout.

In this case, the circuit designing apparatus of an interactive type according to the fourth invention further includes a congestion degree computing unit for dividing the circuit that is the object of the design into plural grid-like regions, computing a degree of congestion of wiring paths on the circuit that is the object of the design as a rate of the estimated number of used channels on the basis of a result of the estimation by the wiring route estimating unit to the number of usable channel in each grid to rank each grid on the basis of a magnitude of the degree of congestion, wherein the layout designing unit preferentially conducts an actual wiring in a region having a high degree of congestion on the basis of information of the ranking by the congestion degree computing unit.

The circuit designing apparatus of an interactive type according to the fourth invention may include a routability judging unit for judging a routability (possibility of wiring) at a rate of roundabout set in advance on the basis of a result of the estimation by the wiring route estimating unit, wherein if the routability judging unit judges unroutable, the layout design unit determines a routable rate of roundabout.

It is possible that if a wiring by the layout design unit extends over plural layers, the wiring route estimating unit estimates wiring routes on each wiring layer, the congestion degree computing unit computes the degree of congestion on the basis of a result of the estimation for each wiring layer by the wiring route estimating unit, and the layout design unit preferentially conducts an actual wiring of a net having a high degree of necessity of using a channel which is estimated to be in a high degree of congestion on the basis of a magnitude of the degree of congestion of each wiring layer computed by the congestion degree computing unit.

A circuit designing apparatus of an interactive type according to a fifth invention includes a display unit, an input unit, a layout design unit and a display control unit similar to those described above, wherein if a wiring by the layout design unit extends over plural layers and plural wiring layers having the same main wiring direction exist, wiring lengths different from wiring layer from wiring layer having the same main wiring direction are set in advance, and the layout designing unit conducts an actual wiring on a wiring layer selected among the wiring layers according to a wiring direction and a wiring length.

A circuit designing apparatus of an interactive type according to a sixth invention includes a display unit, an input unit, a layout design unit and a display control unit similar to those described above, wherein the layout design unit classifies nets that are objects of a design according to a critical degree to delay, sets a wiring order and a rate of roundabout to each classified nets that are the objects of the wiring, and conducts an actual wiring between logic components according to the wiring order and the rate of roundabout.

In this case, the layout design unit sets a wiring tolerable degree of another net, which will be wired after, in adjacent to a net that is an object of the wiring, then actually wires another net according to the wiring tolerable degree after the actual wiring of the net that is the object of the wiring.

A circuit designing apparatus of an interactive type according to a seventh invention includes a display unit, an input unit, a layout design unit and a display control unit similar to those described above. The circuit designing apparatus of an interactive type according to the seventh invention further includes a placement check unit for checking as to whether a logic component causing a placement error after placement of each of the logic components by the layout design unit exists or not. If the placement check unit judges that a logic component causing a placement error exists, the display control unit causes the display unit to display a list of logic components causing placement errors, and emphatically display the logic components causing the placement errors on a placement map of a circuit that is an object of the design. In this case, the display control unit may make a logic component selected in the list of the logic components according to an instruction through the input unit be emphatically displayed on the placement map.

A circuit designing apparatus of an interactive type according to an eighth invention includes a display unit, an input unit, a layout design unit and a display control unit similar to those described above. The circuit designing apparatus of an interactive type according to the eighth invention further includes a congestion degree computing unit for computing a degree of congestion of wiring on a circuit that is an object of a design on the basis of a result of an actual wiring executed by the layout design unit, wherein if an instruction to conduct a re-wiring adding a designated wiring length of a net that has been already wired is inputted through the input unit, the layout design unit selects a region having a low degree of congestion on the basis of a result of the computation by the congestion degree computing unit, and automatically conducts a designated length wiring adding the designated wiring length of the net that has been already wired in the selected region.

A circuit designing apparatus of an interactive type according to a ninth invention includes a display unit, an input unit, a layout unit and a display control unit similar to those described above, wherein if an instruction to conduct a re-wiring adding a designated wiring length of a net that has been already wired within a predetermined region including that net is inputted through the input unit, the layout design unit automatically conducts a designated length wiring adding the designated wiring length of the net that has been already wired in the predetermined region within the predetermined region.

A circuit designing apparatus of an interactive type according to a tenth invention includes a display unit, an input unit, a layout design unit and a display control unit similar to those described above, wherein when an instruction to alter a placing position of a logic component that has been already placed is inputted through an input unit, the layout design unit automatically re-wires between the logic components after alteration of a placing position of that logic component (after re-placement) and a net if the net that should be linked to that logic component has been already wired.

A circuit designing apparatus of an interactive type according to an eleventh invention includes a display unit, an input unit, a layout design unit and a display control unit similar to those described above, wherein if the layout design unit conducts a placing process or a wiring process on at least one placement map among plural placement maps of a circuit that is an object of a design according to an instruction through the input unit while the display control unit causes the display unit to display the plural placement maps of the circuit that is the object of the design, the display control unit causes a result of the process to be displayed even on another placement map showing a part that is an object of the process in association.

A circuit designing apparatus of an interactive type according to a twelfth invention includes a display unit, an input unit, a layout design unit and a display control unit similar to those described above. The circuit designing apparatus of an interactive type according to the twelfth invention further includes a placing region setting unit for setting a placing region in which a virtual (temporary) block terminal should be placed on a boundary of each layout hierarchy block according to an instruction through the input unit if the layout design unit divides a region that is an object of a design into plural layout hierarchy blocks to conduct a wiring design, wherein the layout design unit conducts a wiring process while placing the virtual block terminal within the placing region set by the placing region setting unit.

In this case, the circuit designing apparatus of an interactive type according to the twelfth invention may include a grouping unit for entering plural virtual block terminals as one group according to an instruction through the input unit, wherein the placing region setting unit sets the placing region for each group entered by the grouping unit according to an instruction through the input unit.

A circuit designing apparatus of an interactive type according to a thirteenth invention includes a display unit, an input unit, a layout design unit and a display control unit similar to those described above. The circuit designing apparatus of an interactive type according to the thirteenth invention further includes a placement forbidden region setting unit for setting a forbidden region in which a virtual (temporary) block terminal is forbidden to be placed on a boundary of each layout hierarchy block according to an instruction through the input unit when the layout design unit divides a region that is an object of a design into plural layout hierarchy blocks to conduct a wiring design, wherein the layout design unit conducts a wiring process while placing the virtual block terminal in a region excepting the forbidden region set by the placement forbidden region setting unit.

A circuit designing apparatus of an interactive type according to a fourteenth invention includes a display unit, an input unit, a layout design unit and a display control unit similar to those described above. The circuit designing apparatus of an interactive type according to the fourteenth invention further includes a placing position determining unit for determining a placing position on a boundary of each layout hierarchy block in which a virtual (temporary) block terminal should be placed when the layout design unit divides a region that is an object of a design into plural layout hierarchy blocks, wherein the placing position determining unit determines a center of gravity of coordinates of pins that are logic components linked to a net connected to a virtual block terminal in a layout hierarchy block in which a placing position of the virtual block terminal should be determined, determines a side of the layout hierarchy block over which a straight line extending from a position of the center of gravity toward a direction of another layout hierarchy block connected to the virtual block terminal crosses, determines a pin of the net closest to the side, and determines a position in which a straight line extending from a position of the pin in a main wiring direction or a sub wiring direction and the side cross as a placing position of the virtual block terminal, and the layout design unit conducts a wiring process between the plural layout hierarchy blocks while placing the virtual block terminal in the placing position determined by the placing position determining unit.

A circuit designing apparatus of an interactive type according to a fifteenth invention includes a display unit, an input unit, a layout design unit and a display control unit similar to those described above. The circuit designing apparatus of an interactive type according to the fifteenth invention further includes a placing position determining unit for determining a placing position on a boundary of each layout hierarchy block in which a virtual (temporary) block terminal should be placed when the layout design unit divides a region that is an object of a design into plural layout hierarchy blocks to conduct a wiring design, wherein the placing position determining unit determines a center of gravity of coordinates of pins that are logic components linked to a net connected to a virtual block terminal in each of the layout hierarchical blocks connected to each other, connecting the centers of gravity determined in respective layout hierarchy blocks with a Steiner tree to estimate a wiring route, and determines a position in which the estimated wiring path crosses a boundary of each the layout hierarchy block as a placing position of the virtual block terminal of each of the layout hierarchy blocks, and the layout design unit conducts a wiring process among the plural layout hierarchy blocks while placing the virtual block terminals in the placing positions determined by the placing position determining unit.

A circuit designing apparatus of an interactive type according to a sixteenth invention includes a display unit, an input unit, a layout unit and a display control unit similar to those described above. The circuit designing apparatus of an interactive type according to the sixteenth invention further includes a placeable position determining unit for determining an input/output terminal placeable position closest to a position of a pin of an input/output circuit if a circuit that is an object of a design is a circuit having an input/output terminal on a chip surface and a placing position of the input/output circuit as a logic component that should be wired and connected to the input/output terminal on the circuit that is the object of the design has been already determined, wherein the layout design unit conducts a wiring process between the input/output terminal placeable position determined by the placeable position determining unit and the pin of the input/output circuit.

A circuit designing apparatus of an interactive type according to a seventeenth invention includes a display unit, an input unit, a layout design unit and a display control unit similar to those described above. The circuit designing apparatus of an interactive type according to the seventeenth invention further includes a limited region setting unit for setting a limited region in which a placing position of an input/output circuit is limited according to an instruction through the input unit if the circuit that is the object of the design is a circuit having an input/output terminal on a chip surface and a placing position of the input/output terminal on the circuit that is the object of the design has been already determined such that a distance between an input/output terminal and a pin of an input/output circuit as a logic components that should be connected to that input/output terminal is below a predetermined value, wherein the layout design unit places the input/output circuit within a limited area set by the restricted region setting unit and conducts a wiring process between the pin of the input/output circuit and the input/output terminal.

In the circuit designing apparatus of an interactive type according to the first invention, a delay value of each logic component forming a circuit that is an object of a design is set and altered according to dullness of a signal waveform inputted to the logic components, whereby the speed analyzing unit may perform a delay computation while taking dullness of a signal waveform into consideration.

In circuit designing apparatus of an interactive type according to the second invention, when the logic design unit, the layout design unit and the speed analyzing unit conduct respective processes, it is possible to shift the process to another process on occasion. In addition, before a placement in mounting after a logic design, the speed analyzing unit may estimate and calculate a delay value of a wiring path of a circuit that is an object of a design so as to take a result of the delay computation into account in an early stage of the circuit design.

The speed analyzing unit may estimate a delay value on the basis of the shortest route between pins that should be connected to each other before a wiring is conducted after a placement in mounting. After an actual wiring, a delay value is calculated on the basis of a result the actual wiring, and a result of the delay computation can be reflected in a placement design or a wiring design.

According to the second invention, a delay value of each logic component forming a circuit that is an object of a design is set and altered according to a dullness of a signal waveform inputted to that logic component so that the speed analyzing unit can conduct a delay computation while taking the dullness of the signal waveform into consideration.

Concurrently with a tracing process of a wiring path by the path trace unit, the speed analyzing unit can conduct a delay computation along the wiring path while taking a change in the dullness of the signal waveform into consideration.

At this time, if a clock system has been already designed, the path trace unit conducts a path tracing from a designated clock pin. At the same time, the speed analyzing unit computes a clock path delay value, and a flag is set to a pin of a logic component connected to a designated clock pin. The path trace unit conducts a tracing process of wiring paths from clock input pins of all logic components, activates the timing check unit every time a pin to which the flag is set is traced to conduct a clock timing check on a logic component to which that pin belongs. Accordingly, it is possible to automatically and one-by-one conduct a clock timing check on wiring paths of all combinations between an enormous number of logic components operative in response to a clock signal from the clock system.

The delay value setting unit sets a predetermined delay value to an arbitrary pin and adds the predetermined delay value upon a delay computation by the speed analyzing unit so that a clock timing check can be conducted simultaneously on wiring paths operating in response to (asynchronous) clock signals having different cycles, and a delay value can be initialized to an arbitrary value at an arbitrary pin.

On the other hand, if the clock system is not yet designed, the search unit searches all logic components connected to the clock system, and a flag is set to a pin of each of the searched logic components. The path trace unit conducts a tracing process of wiring paths from clock input pins of all the logic components, and activates the timing check unit each time a pin to which the flag is set is traced to conduct a clock timing check on the logic component to which that pin belongs. Accordingly, even if the clock system is not yet designed, it is possible to automatically and one-by-one conduct a clock timing check on wiring paths of all combinations between an enormous number of logic components operating in response to a clock signal from the clock system and take a result of the check into consideration in a wiring design of the clock system.

The counter counts how many times a pin of each logic component is traced by the path trace unit, thereby grasping a pin having a high rate of passages of signals on the basis of a count value of the counter at the completion of the trace of all paths. Information in terms of a magnitude of frequency of passages of signals at each pin on the basis of a result of the count is displayed on the display unit. The designer can thereby discriminate a pin having a high frequency of passages of the signals, that is, a pin largely affecting on a delay improvement or the like only by referring to the display unit.

The region setting unit sets an executing region in which a tracing process and a delay computing process are performed. The tracing process and the delay computing process are performed only within the executing region and a result of the process is displayed on the display unit so that it is possible to conduct and display a process only in a region that the designer needs.

The trace control unit allows a selection of either a forward trace or a backward trace or a trace between two points according to an instruction through the input unit to automatically switch and control an operation of the path trace unit. At this time, since a delay computation is unfeasible in terms of a backward trace simultaneously with a path tracing, there is a case where a time for a process increases if a delay computation is always performed. Hence, a mode as to whether a delay computation is conducted in the event of a backward trace is set in advance, whereby a delay computation is conducted only if the designer wants.

A result of a tracing and a result of a delay computation are sorted as a list of trace destination pins and displayed on the display unit. The designer can thereby readily grasp pin names of the trace destination pins or a magnitude of each delay value from a display on the display unit.

At this time, a list of trace destination pins is hierarchically displayed on the display unit and information of a lower hierarchy corresponding to information of an upper hierarchy selected on the display unit is displayed on the display unit, whereby an enormous number of trace destination pins may be displayed compactly on the display unit. The external file writing unit writes the list of the trace destination pins into an external file, thereby storing or saving the list in the external file.

A schematic destination route diagram and a graph showing a delay value and an accumulated delay value at each position in the destination route diagram are displayed on the display unit. The designer can thereby discriminate a part on the wiring path through which a signal needs a longer time to pass at one glance.

At this time, schematic destination route diagrams or graphs of plural wiring paths are displayed simultaneously on the display unit. The designer can thereby compare delay conditions of plural wiring paths while referring them on the display unit.

The printing unit prints out the above schematic destination route diagram or the graph. The designer can thereby examine a delay condition of a wiring path while referring to a result of the print-out. In addition, the external file writing unit writes data of the schematic destination route diagram or the graph into an external file, thereby storing or saving the data in the external file.

According to an instruction through the input unit, an actual circuit diagram corresponding to the schematic destination route diagram is displayed on the display unit. The designer can thereby grasp a position on an actual circuit of the schematic destination route diagram on the display unit. Further, all wiring paths traced by the path trace unit are displayed with pin names in the form of a tree structure on the display unit and detailed information of a pin selected on the display unit according to an instruction through the input unit is displayed on the display unit. The designer can thereby readily acquire detailed information about each of the pins while grasping a whole of that wiring path.

In the above-mentioned circuit designing apparatus of an interactive type according to the third invention, the display control unit sorts coordinates of characteristic points in the order of their ascending or descending for each coordinate axis, substitutes them with coordinate values proportional to that order, and displays them on the display unit. The designer can thereby simultaneously grasp both a detailed part and a whole of a circuit that is an object of the design on the display unit.

At this time, points at both ends of a wire connecting pins and internally dividing points on the wire are taken out and displayed, thereby displaying more clearly a circuit that is an object of the design on the display unit.

If a wiring connection condition extends over plural layers, the display control unit adds an offset proportional to the order of layers to coordinates values after the substitution, and causes the display unit to display the characteristic point. The designer can thereby readily grasp wiring lines overlapping through the layer on the display unit. Further, an identifier common to before the substitution and after the substitution of the coordinates is set in advance, the designer can thereby readily recognize a correspondence between the characteristic point before and the characteristic point after the substitution.

In the above-mentioned circuit designing apparatus of an interactive type according to the fourth invention, the wiring route estimating unit conducts a virtual wiring between logic components in a stage where a placement in mounting is determined to estimate a wiring path, and the layout design unit actually wires the logic components according to a wiring order and a rate of roundabout determined on the basis of a result of the estimation by the wiring route estimating unit so that an efficient actual wiring is feasible while a condition of the wiring is estimated.

At this time, the congestion degree computing unit computes a degree of congestion in each grid on a circuit that is an object of a design as [(the estimated number of used channels on the basis of a result of the estimation by the wiring route estimating unit)/(the number of usable channels in each grid)], besides ranking the degree of congestion. The layout design unit preferentially conducts an actual wiring in a region in which wirings are expected to be congested on the basis of information of the ranking by the congestion degree computing unit so that an efficient actual wiring becomes feasible.

The routability judging unit judges a routability at a rate of roundabout designated in advance on the basis of a result of an estimation by the wiring route estimating unit. If the routability judging unit judges unroutable, the layout design unit determines a routable rate of roundabout to actually wire. It is thereby possible to reduce the number of unroutable parts as many as possible.

If a wiring by the layout design unit extends over plural layers, the wiring route estimating unit estimates wiring routes on each wiring layer, the congestion degree computing unit computes a degree of congestion on the basis of a result of the estimation for each wiring layer, and the layout design unit preferentially conducts an actual wiring of a net having a high degree of necessity of using a channel that is estimated to have a high degree of congestion on the basis of the degree of congestion of each wiring layer computed by the congestion degree computing unit so that an efficient actual wiring becomes feasible.

In the above-mentioned circuit designing apparatus of an interactive type according to the fifth invention, if a wiring by the layout design unit extends over plural layers and plural wiring layers having the same main wiring direction exist, wiring lengths different from wiring layer from wiring layer are designated in advance. The layout design unit conducts an actual wiring on a wiring layer selected among the plural wiring layers according to a wiring direction and a wiring length so that an effective use of each wiring layer becomes possible.

In the above-mentioned circuit designing apparatus of an interactive type according to the sixth invention, the layout design unit classifies nets that are objects of a wiring according to a critical degree to delay, and conducts an actual wiring between logic components in a wiring order and at a rate of roundabout according to the critical degree so that an efficient actual wiring can be conducted while a critical degree is taken into consideration.

At this time, the layout design unit conducts an actual wiring of another net according to the wiring tolerable degree set according to the critical degree so as to prevent a wiring parasitic capacitance from building up in a net having a high critical degree and a delay from increasing.

The above-mentioned circuit designing apparatus of an interactive type according to the seventh invention, if the placing check unit judges that a logic component causing a placement error exists, a list of logic components causing placement errors is displayed on the display unit, and those logic components are emphatically displayed on a placement map on the display unit. The designer can thereby immediately recognize occurrence of a placement error.

At this time, if a specific logic component is selected in a list of logic components according to an instruction through the input unit, it is possible to emphatically display only that logic component on the placement map. The designer can thereby specify the logic component causing a placement error to confirm it on the placement map on the display unit.

The above-mentioned circuit designing apparatus of an interactive type according to the eighth invention, if an instruction to re-wire a net that has been already wired adding a designated wiring length is inputted through the input unit, the layout design unit selects a region having a low degree of congestion on the basis of a result of a computation by the congestion degree computing unit, then a designated length wiring adding the designated wiring length is automatically conducted on the net that has been already wired within that region so that a re-wiring process can be simplified.

In the above-mentioned circuit designing apparatus of an interactive type according to the ninth invention, if an instruction to conduct a re-wiring of a net that has been already wired adding a designated wiring length within a predetermined region including that net is inputted through the input unit, the layout design unit automatically conducts a designated length wiring adding a designated wiring length on the net that has been already wired in the predetermined region within said predetermined region so that a re-wiring process can be simplified.

The above-mentioned circuit designing apparatus of an interactive type according to the tenth invention, if an instruction to alter a placing position of a logic component that has been already placed is inputted through the input unit, the layout design unit automatically re-wires between that logic component after re-placement and a net that should be linked to that logic component if the net has been already wired. Therefore, the designer need not conduct a re-wiring process after re-placement so that a simple re-wiring process is possible.

The above-mentioned circuit designing apparatus of an interactive type according to the eleventh invention, even if a placing process or a wiring process is performed on one placement map when the placement map is displayed in a multi-window, it is possible to display the process in association with another placement map. In addition, it is possible to use simultaneously plural placement maps to perform a placement process or a wiring process.

In the above-mentioned circuit designing apparatus of an interactive type according to the twelfth invention, the layout design unit executes a wiring process while placing a virtual block terminal in a placing region set by the placing region setting unit in a hierarchical layout design so that it is possible to automatically place the virtual block terminal while respecting an intention of the designer. At this time, it is possible to set the placing region for a unit of group entered by the grouping unit so that it is possible to readily instruct to place plural virtual block terminals for signals of the same type within the same placing region.

The above-mentioned circuit designing apparatus of an interactive type according to the thirteenth invention, the layout design unit executes a wiring process while placing a virtual block terminal in a region excepting a forbidden region set by the placement forbidden region setting unit in a hierarchy layout design. It is therefore possible to automatically place the virtual block terminal while respecting an intention of the designer.

In the above-mentioned circuit designing apparatus of an interactive type according to the fourteenth invention, when a hierarchy layout design is conducted, the placing position determining unit determines, on the basis of a center of gravity of coordinates of pins in a certain layout hierarchy block and a direction of another layout hierarchy block that should be connected, a placing position of a virtual block terminal in that layout hierarchy block, and the layout design unit conducts a wiring process between plural layout hierarchy blocks while placing the virtual block terminal in the placing position. It is therefore possible to automatically place a virtual block terminal while taking placement or wiring of logic components in a layout hierarchy block into consideration and respecting an intention of the designer.

The above-mentioned circuit designing apparatus of an interactive type according to the fifteenth invention, the placing position determining unit determines, on the basis of centers of gravity of coordinates of pins in each of layout hierarchy blocks connected to each other and a Steiner tree connecting these centers of gravity, a placing position of a virtual block terminal of each of the layout hierarchy blocks when a hierarchical layout design is conducted, and the layout design unit conducts a wiring process between the plural layout hierarchy blocks while placing the virtual block terminals in the respective placing positions. It is therefore possible to automatically place virtual block terminals while considering placement or wiring of logic components in each layout hierarchy block into consideration and respecting an intention of the designer.

The above-mentioned circuit designing apparatus of an interactive type according to the sixteenth invention, if a circuit having an input/output terminal (a bump) on a chip surface is a circuit that is an object of the design, the placeable position determining unit determines an input/output terminal placeable position closest to a position of a pin of an input/output circuit if the input/output circuit (a logic component) that should be wired and connected to the input/output terminal on the circuit that is the object of the design has been already determined, and the layout design unit conducts a wiring process between the input/output terminal placeable position and the pin of the input/output circuit. It is therefore possible to readily wire a bump and a pin of an input/output circuit in a wiring length within a limit value even in a hierarchy layout design for a bumped circuit.

The above-mentioned circuit designing apparatus of an interactive type according to the seventeenth invention, if a circuit having an input/output terminal (a bump) on a chip surface is a circuit that is an object of a design, the limited region setting unit sets a limited region in which a placing position of an input/output circuit is limited according to an instruction through the input unit if a placing position of the bump on the circuit that is the object of the design has been already determined, and the layout design unit conducts a wiring process between a pin of the input/output circuit and the bump besides placing the input/output circuit within the limited region. It is therefore possible to wire between a bump and a pin of an input/output circuit in wiring length within a limit value even in the case of a hierarchy layout design for a bumped circuit.

As above, the circuit designing apparatus of an interactive type according to this invention may provide the following features and advantages:

(1) Since a delay computing process or a path tracing process is feasible while considering a signal waveform dullness, an accurate and high-speed delay computation is allowed.

(2) By estimating a delay value of a wiring path of a circuit that is an object of the design before a placement in mounting after a logic design, a result of a delay computation is reflected to the circuit design in the stage of the logic design, whereby an extremely efficient design for a more minute and highly-integrated circuit is feasible.

(3) Before a wiring after a placement in mounting, a delay value is estimated on the basis of a shortest route between pins that should be connected to each other. After an actual wiring, a delay value is calculated on the basis of a result of the actual wiring. It is therefore possible to consider a result of the delay computation in a placement design or a wiring design in each stage of a layout design so that a circuit design may be conducted while considering a delay value every occasion.

(4) A clock timing check is automatically and one-by-one conducted on wiring paths of all combinations of an enormous number of logic components operating responsive to a clock signal from a clock system so that an easy and certain timing check on all wiring paths is possible.

(5) It is possible to simultaneously conduct a clock timing check on wiring paths operating responsive to asynchronous clock signals, initialize a delay value at an arbitrary pin, and increase an efficiency of the timing check or realize a control or the like on a path computation (a delay computation).

(6) By counting the number of traces by a counter provided to each pin, the designer can discriminate a pin largely affecting on an improvement of delay or the like, and use a result of the discrimination as a reference when the priority of improvements in placement or wiring is determined.

(7) A tracing process and a delay computing process are conducted and displayed only in a region that the designer demands, whereby data of parts that the designer requires is quickly available, thus an efficient circuit design is possible.

(8) An appropriate tracing technique is automatically selected among three sorts of tracing technique depending on a manner of designating a pin that is an object of the trace through the input unit, and an operation of the path trace unit is thereby switched and controlled.

(9) A result of a trace or a delay computation is displayed as a sorted list, or hierarchically, or a graph on the display unit. The designer can readily grasp the result of the trace or the result of the delay computation from a display on the display unit so as to immediately make various judgements (determination of a part requiring an improvement in placement or wiring, for example) upon a circuit design. It is therefore possible to contribute to simplification of a circuit design or improvement in efficiency of a circuit design.

(10) A display by which a detailed part and a whole of a circuit that is an object of a design can be simultaneously grasped is realized on the display unit. The designer can readily grasp a wiring connection condition of the circuit that is the object of the design from a display on the display unit. It is therefore possible to simplify a circuit design and contribute to an improvement in efficiency of a circuit design.

(11) It is possible to conduct an actual wiring in a wiring order or at a rate of roundabout according to a result of an estimation of a condition of wiring (a degree of congestion) or a critical degree to delay of a net that is an object of a wiring, thereby largely improving a wiring efficiency.

(12) An actual wiring is conducted on a wiring layer selected among plural wiring layers according to a wiring direction or a wiring length, thereby effectively using each wiring layer and improving a wiring efficiency.

(13) If an overlapping placement error or a placement error such as a placement in a reserved region or the like occurs, a condition of occurrence of the placement error is displayed on the display unit to be clarified. The designer can immediately recognize occurrence of a placement error so as to readily and certainly avoid a placement error through a process such as a re-placement.

(14) Re-wiring adding a designated wiring length is automatically conducted on a net that has been already wired according to an instruction through the input unit. It is therefore possible to simplify a re-wiring process, thus largely reducing a burden on the designer.

(15) If a logic component that has been already placed is re-placed, a re-wiring between the logic component after the re-placement and a net is automatically conducted if the net that should be connected to the logic component has been already wired. There is no need for the designer to conduct a re-wiring process after re-placement, thereby simplifying a replacing process, thus largely reducing a burden on the designer.

(16) Even if a placing process or a wiring process is conducted on one placement map, the process can be displayed in association on another placement map. In addition, a placing process or a wiring process can be performed using plural placement maps simultaneously. It is possible to realize a multi-window display without causing a confusion of the designer, and an efficient circuit design utilizing the multi-window display.

(17) In a hierarchical layout design, it is possible to automatically place a virtual block terminal in consideration of placement or wiring of logic components in a layout hierarchy block besides respecting an intention of the designer, thereby largely reducing a burden on the designer to work out a hierarchical layout design.

(18) In the case of a hierarchical layout design of a circuit having an input/output terminal on a chip surface, it is possible to wire between the input/output terminal and a pin of an input/output circuit in a wiring length within a limit value even if the input/output terminal and the input/output circuit belong to different layout hierarchy blocks so as to realize a certain hierarchical layout design.

The circuit designing apparatus of an interactive type of this invention can accomplish a high-speed and accurate delay computation, a timing check on all wiring paths, a simultaneous and clear display of not only a detailed part but also a whole of a circuit that is an object of the design seizable by the designer, an improvement in wiring efficiency, a clear representation of a condition of occurrence of a placement error, simplification and automation of a replacing process or a re-wiring process, a multi-window display without causing a confusion, etc. This invention therefore can simplify and speed up a circuit design of an integrated circuit such as an LSI or a printed circuit board while largely reducing a burden on the designer.

BRIEF DESCRIPTION OF THE DRAWINGS

FIG. 10 shows an example of a list display of a result of a tracing process and a result of a delay computation according to the embodiment;

FIG. 11 shows an example where a list of a result of a tracing process and a result of a delay computation is sorted according pin names;

FIG. 12 shows an example in which a list of a result of a tracing process and a result of a delay computation is sorted in the order of magnitude of upside delay values;

FIG. 13 shows an example where a list of a result of a tracing process and a result of a delay computation in the order of magnitude of downside delay values;

FIG. 16 shows a form in the event of a file output of a destination route display of a wired path according to the embodiment;

FIG. 30 shows a congestion degree map according to the embodiment;

FIGS. 31(a) and 31(b) show an example of determination of a rate of roundabout according to the embodiment;

FIG. 38 is a flowchart for illustrating a procedure of a re-placing process according to the embodiment;

DESCRIPTION OF THE PREFERRED EMBODIMENT

Figure 1:
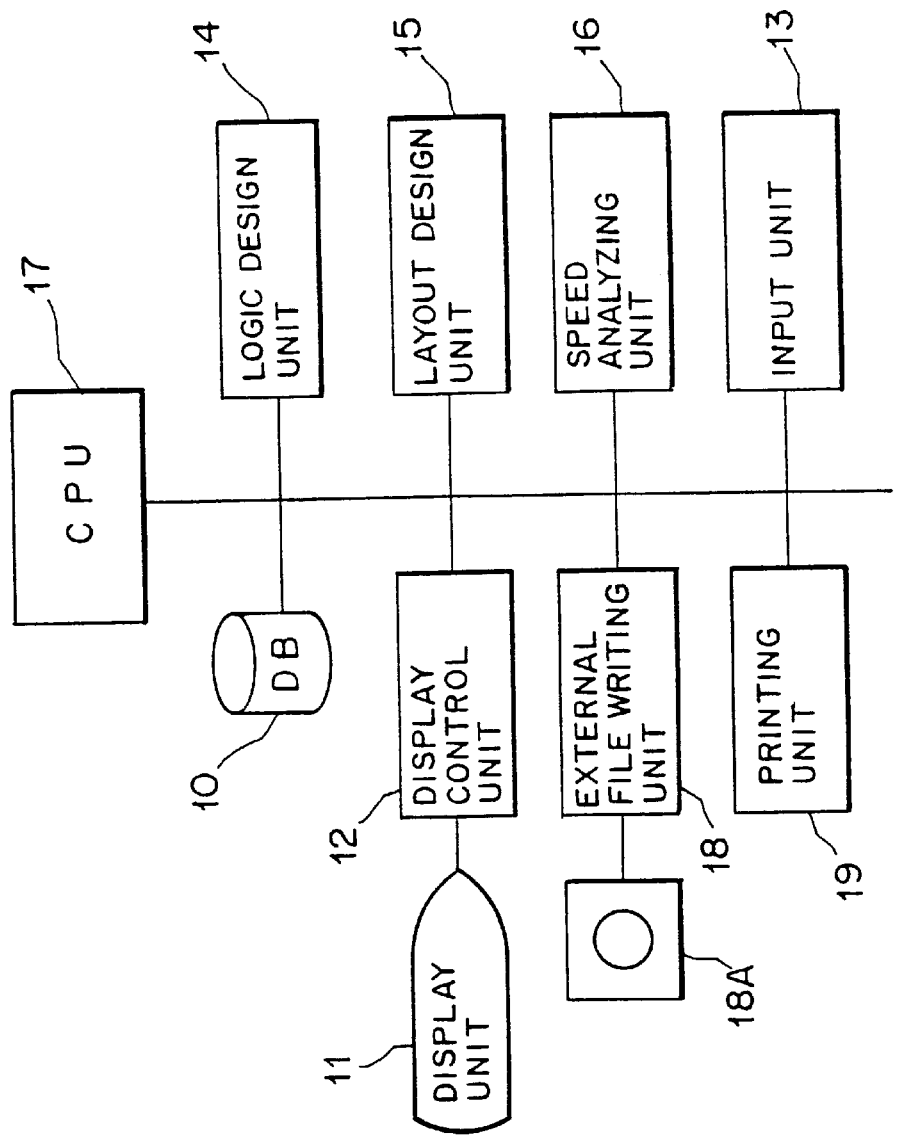
FIG. 1 is a block diagram showing a structure of a circuit designing apparatus of an interactive type as an embodiment of this invention.

Hereinafter, description will be made of an embodiment of this invention referring to the drawings.

(a) Description of a basic structure of an apparatus according to this embodiment FIG. 1 is a block diagram showing a basic structure of a circuit designing apparatus of an interactive type as an embodiment of this invention. In FIG. 1, reference numeral 10 denotes a database (DB) storing therein all information such as logic circuit information, layout information, data for delay computation (described later), etc., 11 denotes a display unit for displaying thereon various circuit design steps which will be described later, 12 denotes a display control unit for controlling a display condition on the display unit 11, and 13 denotes an input unit such as a keyboard, a mouse or the like through which a designer inputs responsive information in response to display data while referring to the display data on the display unit 11.

Reference numeral 14 denotes a logic design unit for conducting a logic design for a circuit that is an object of a design (an integrated circuit such as an LSI or the like in this embodiment). A layout design unit 15 is configured as will be described later with reference to FIG. 3, which conducts a placement in mounting of each logic component (a cell such as a flip-flop or the like in this embodiment, sometimes called a gate or an element) forming the circuit that is an object of the design on the basis of a result of the logic design by the logic design unit 14, after that, conducts a wiring between the cells.

Reference numeral 16 denotes a speed analyzing unit. The speed analyzing unit 16 is configured as will be described with reference to FIG. 2, which conducts a speed analysis on the basis of a delay computation for each path on the circuit that is an object of the design according to a result of the design by the layout design unit 15.

Reference numeral 17 denotes a CPU for collectively managing each unit forming the circuit designing apparatus of an interactive type of this embodiment.

According to this embodiment, the above logic design unit 14, layout design unit 15 and speed analyzing unit 16 are provided within the same system (apparatus), and so connected on occasion as to be associated with each other under a control of a CPU 17. Results of processes by the logic design unit 14, the layout design unit 15 and the speed analyzing unit 16 are displayed on the display unit 11 by the display control unit 12 on occasion, besides stored in the database 10, as will be described later.

Reference numeral 18 denotes an external file writing unit. The external file writing unit 18 writes a destination route diagram or a graph in addition to a list of trace destination pins displayed on the display unit 11 by the display control unit 12 into the external file 18A according to an instruction through the input unit 13, as will be described later. Reference numeral 19 denotes a printing unit which prints out the destination route diagram or the graph in addition to the list of the trace destination pins displayed on the display unit 11 by the display control unit 12 onto a predetermined printing paper according to an instruction through the input unit 13, as will be described later.

Functions of the display control unit 12, the logic design unit 14, the layout design unit 15 and the speed analyzing unit 16 are, in practice, realized by executing a program stored in a ROM (not shown) by the CPU 17 (or another CPU provided in parallel with the CPU 17). In the drawing of this embodiment, the display control unit 12, the logic design unit 14, the layout design unit 15 and the speed analyzing unit 16 or the functions of these units 14 through 16, which will be described later, are shown as blocks in order to clarify each of the functions. Accordingly, the circuit designing apparatus of an interactive type of this embodiment can be realized by using a general computer system having the CPU 17, the ROM (not shown), the database 10, the display unit 11, the input unit 13, the external file writing unit 18, the printing unit 19 and the like.

Figure 2:
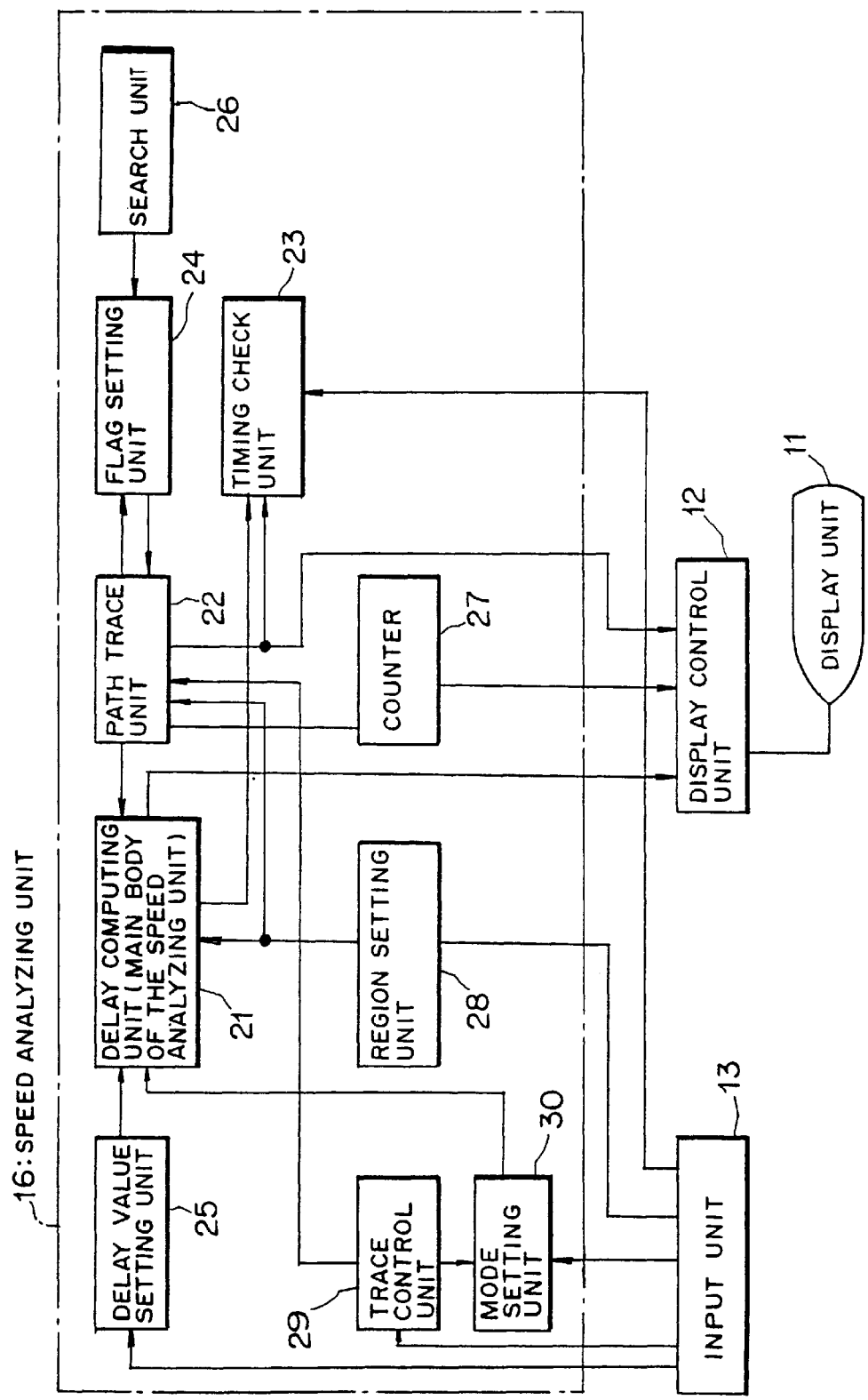
FIG. 2 is a block diagram showing a functional structure of a speed analyzing unit according to the embodiment.

The speed analyzing unit 16 has, as shown in FIG. 2, a delay computing unit 21, a path trace unit 22, a timing check unit 23, a flag setting unit 24, a delay value setting unit 25, a search unit 26, a counter 27, a region setting unit 28, a trace control unit 29 and a mode setting unit 30.

The delay computing unit 21 computes a delay for each wiring path on the circuit that is an object of the design according to a result of design by the layout design unit 15 so as to function as a main body of the speed analyzing unit 16. According to this embodiment, the delay computing unit 21 computes a path delay value of a cell (a gate) forming the circuit that is an object of the design while altering a setting of it according to dullness (a slew rate) of a signal waveform inputted to that cell, as will be described later with reference to FIGS. 4 through 6.

The path trace unit 22 traces a wiring path connected to a predetermined pin of a cell designated by an instruction through the input unit 13 from that pin. Concurrently with a tracing process on a wiring path by the path trace unit 22, the delay computing unit 21 computes dullness of a signal waveform varying along the wiring path in parallel with the tracing process, and computes a delay of the wiring path while altering a setting of a delay value of the cell on the wiring path according to the dullness, in this embodiment.

The trace control unit 29 switches to control an operation of the above-mentioned path trace unit 22. For instance, if only a trace start pin is designated according to an instruction through the input unit 13, the trace control unit 29 switches to control the operation of the path trace unit 22 to conduct a forward trace (a trace from an input side toward an output side) from the trace start pin. If only a trace destination pin is designated according to an instruction through the input unit 13, the trace control unit 29 switches to control the operation of the path trace unit 22 to conduct a backward trace (a trace from an output side toward an input side) from the trace destination pin. If two points, i.e., a trace start pin and a trace destination pin, are designated according to an instruction through the input unit 13, the trace control unit 29 switches to control the operation of the path trace unit 22 to conduct a trace between these two points.

A mode setting unit 30 is provided to such the trace control unit 29. The mode setting unit 30 sets a mode as to whether the delay computing unit 21 conducts a delay computation after completion of a backward trace according to an instruction through the input unit 13 when the trace control unit 29 causes the path trace unit 22 to conduct the backward trace.

The timing check unit 23 checks a timing of supply of a clock signal to each logic components. The flag setting unit 24 sets a flag showing that a cell is an object of a check by the timing check unit 23.

The delay value setting unit 25 sets a predetermined delay value to an arbitrary pin traced by the path trace unit 22 according to an instruction through the input unit 13. The search unit 26 searches all cells each having a clock input pin connected to a clock system if the clock system supplying a clock signal to each cell is not yet designed.

The timing check unit 23, the flag setting unit 24, the delay value setting unit 25 and the search unit 26 check a clock timing for a cell to which a flag set pin belongs, as will be described later. The delay value setting unit 25 fulfills a function to initialize a delay value to an arbitrary value at an arbitrary pin, as will be described later.

The counter 27 is provided to each pin of each cell forming the circuit that is an object of the design to count the number of times each pin is traced by the path trace unit 22. The region setting unit 28 sets a region in which a tracing process of a wiring path by the path trace unit 22 and a delay computing process by the delay computing unit 21 are conducted according to an instruction through the input unit 13.

The display control unit 12 of this embodiment fulfills the following various functions (1) through (4) according to a process by the speed analyzing unit 16.

(1) A function to cause the display unit 11 to display information in terms of a magnitude of frequency of passage of signals at each pin on the basis of a count value at each pin counted by the counter 27.

(2) A function to cause the display unit 11 to display only a result of a process in terms of an executing region set by the region setting unit 28.

(3) A function to cause display unit 11 to display a result of a tracing by the path trace unit 22 and a result of delay computation by the delay computing unit 21 as a list of trace destination pins (described later with reference to FIGS. 10 through 20).

Corresponding to the function in (3), the display control unit 12 has a sorting function to sort a display condition of the list according to pin names of the trace destination pins or a delay value of each of the trace destination pins (refer to FIGS. 11 through 13). In addition to this, the display control unit 12 has a function to cause the display unit 11 to hierarchically display the list (refer to FIG. 14), and causes the display unit 11 to display information of a lower hierarchy corresponding to information of an upper hierarchy selected when the information of the upper hierarchy on the display unit 11 is selected according to an instruction through the input unit 13.

Figures 14, 15:
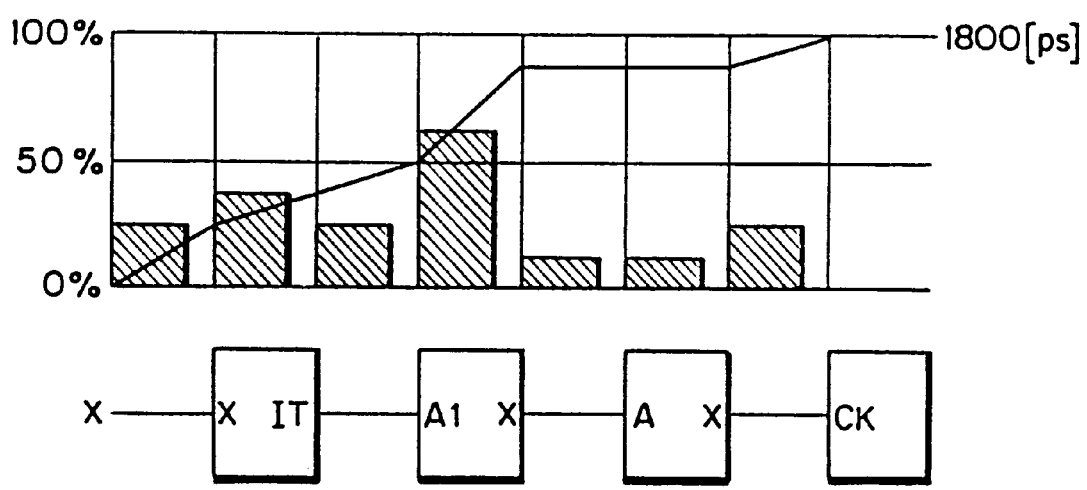
FIG. 14 shows an example of a hierarchical display of a list of a result of a tracing process and a result of a delay computation according to the embodiment.
FIG. 15 shows an example of a destination route display of a wiring path according to the embodiment.

(4) A function to cause the display unit 11 to display a result of a tracing by the path trace unit 22 as a schematic destination route diagram (refer to a lower part of FIG. 15), besides causing the display unit 11 to display a result of a delay computation by the delay computing unit 21 corresponding to the result of the tracing as a graph showing delay values and accumulated delay values corresponding respective positions on the schematic destination route diagram (refer to an upper part of FIG. 15).

Figure 17:
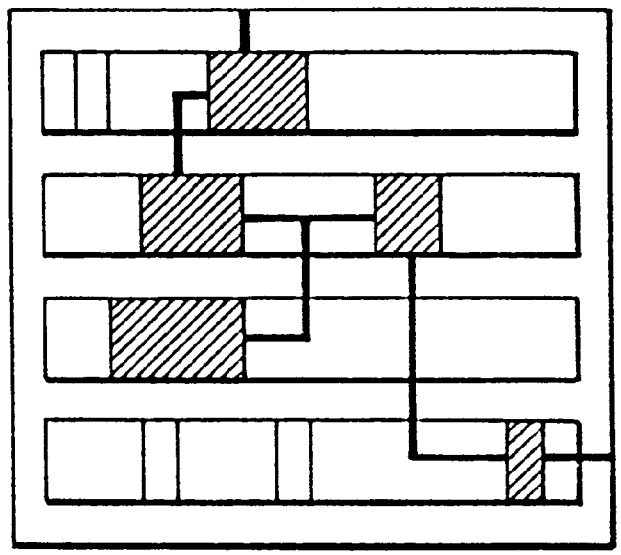
FIG. 17 shows an example of an emphatic display of an actual circuit part corresponding to a destination route according to the embodiment.
Figure 18:
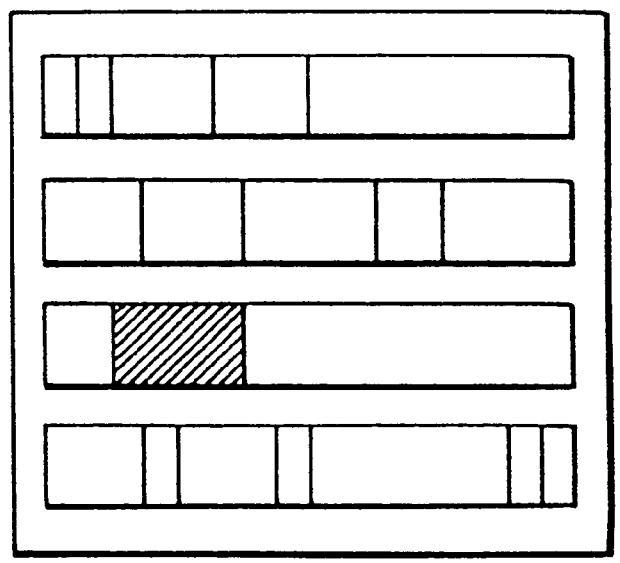
FIG. 18 shows an example of an emphatic display on an actual circuit of a specific cell on a destination route according to the embodiment.

Corresponding to the function in (4), the display control unit 12 has a function to cause the display unit 11 to simultaneously display the schematic destination route diagrams and the graphs of plural wiring paths in a multi-window form, or a function to cause the display unit 11 to display an actual circuit diagram corresponding to the schematic destination route diagram according to an instruction through the input unit 13 (refer to FIGS. 17 and 18). The display control unit 12 also has a function to cause display unit 11 to display all wiring paths each from a trace start pin to a trace destination pin traced by the path trace unit 22 with a pin name of a pin of each logic component in the form of a tree structure (refer to FIG. 19). The display control unit 12 further has a function to cause the display unit 11 to display detailed information including a delay value of a pin arbitrary selected when the pin is selected on the display of the wiring paths displayed in the form of a tree structure on the display unit 11 according to an instruction through the input unit 13 (refer to FIG. 20).

The display control unit 12 of this embodiment fulfills the following functions when causing the display unit 11 to display a result of a logic design by the logic design unit 14 or a result of a placement/wiring by the layout design unit 15 as a circuit design step (a wiring connection condition between characteristic points such as pins, vias or the like).

Namely, the display control unit 12 has a function to sort coordinates of characteristic points such as pins or vias of a cell in the order of their ascending or descending for each coordinate axis, substitute them with coordinate values in proportion to its order, and cause the display unit 11 to display the characteristic points.

At this time, points at both ends of a wire connecting pins of cells, internally dividing points on the wire (for example, an internally dividing point at one-fourth, a middle point, an internally dividing point at three-fourth, etc., as shown in FIG. 28) and four vertexes of a rectangular figure representing a pin (refer to FIGS. 26 through 28) are taken out along with pins or vias as characteristic points.

Figure 29:
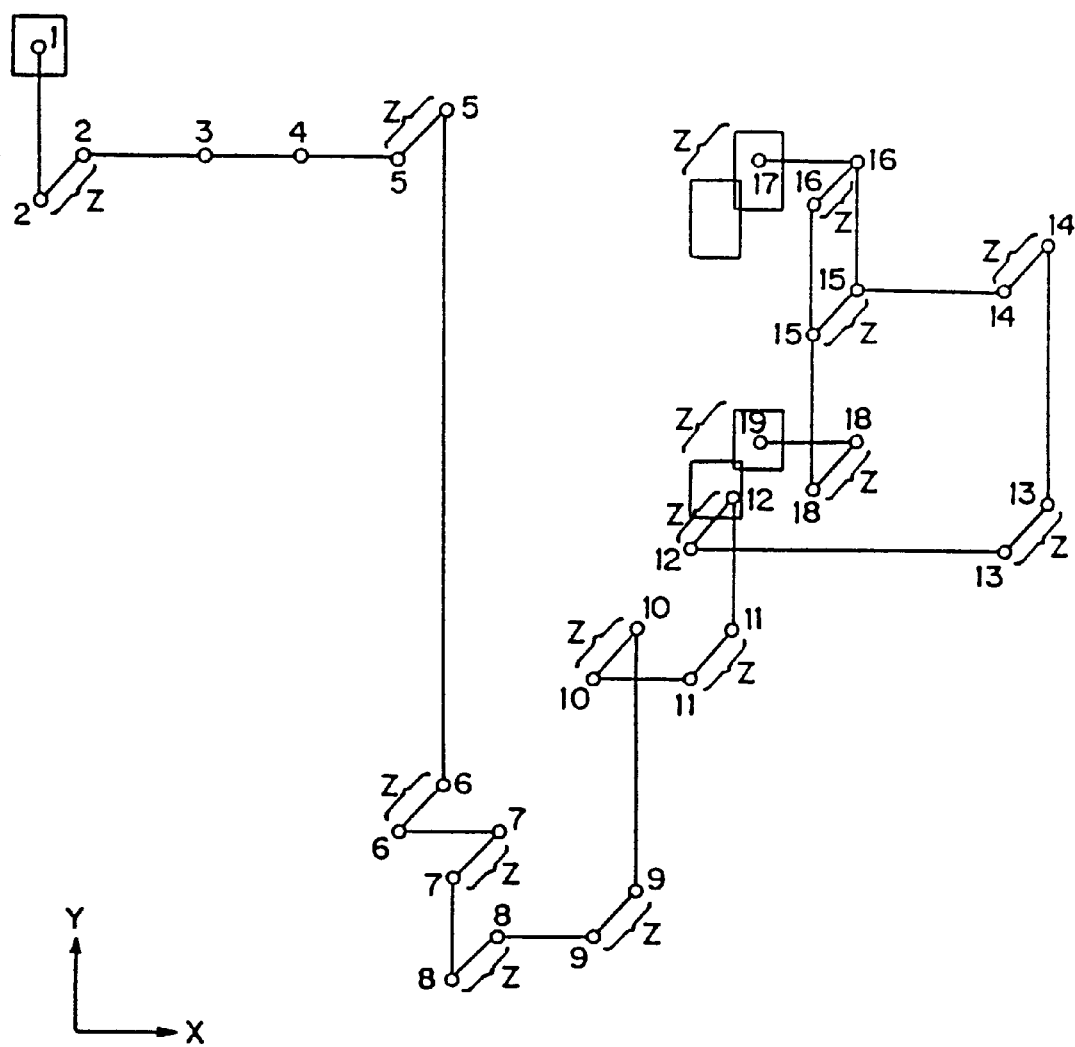
FIG. 29 shows an example in which an offset corresponding to a wiring layer is added to the circuit that is the object of the design which has been subjected to coordinate conversion by the order substitution.

If a wiring connection condition displayed on the display unit 11 extends over plural layers, the display control unit 12 has a function to add an offset proportional to the order of layer on which each characteristic point exists to coordinate values having been subjected to the above order substitution, and cause the display unit 11 to display that characteristic point, as will be described later with reference to FIG. 29.

An identifier common to before and after the substitution of the coordinates is set in advance to each characteristic point, and the wiring connection condition is displayed on the display unit 11 under a condition where the identifier is attached to each characteristic point, as shown in FIGS. 21 through 25.

Figure 3:
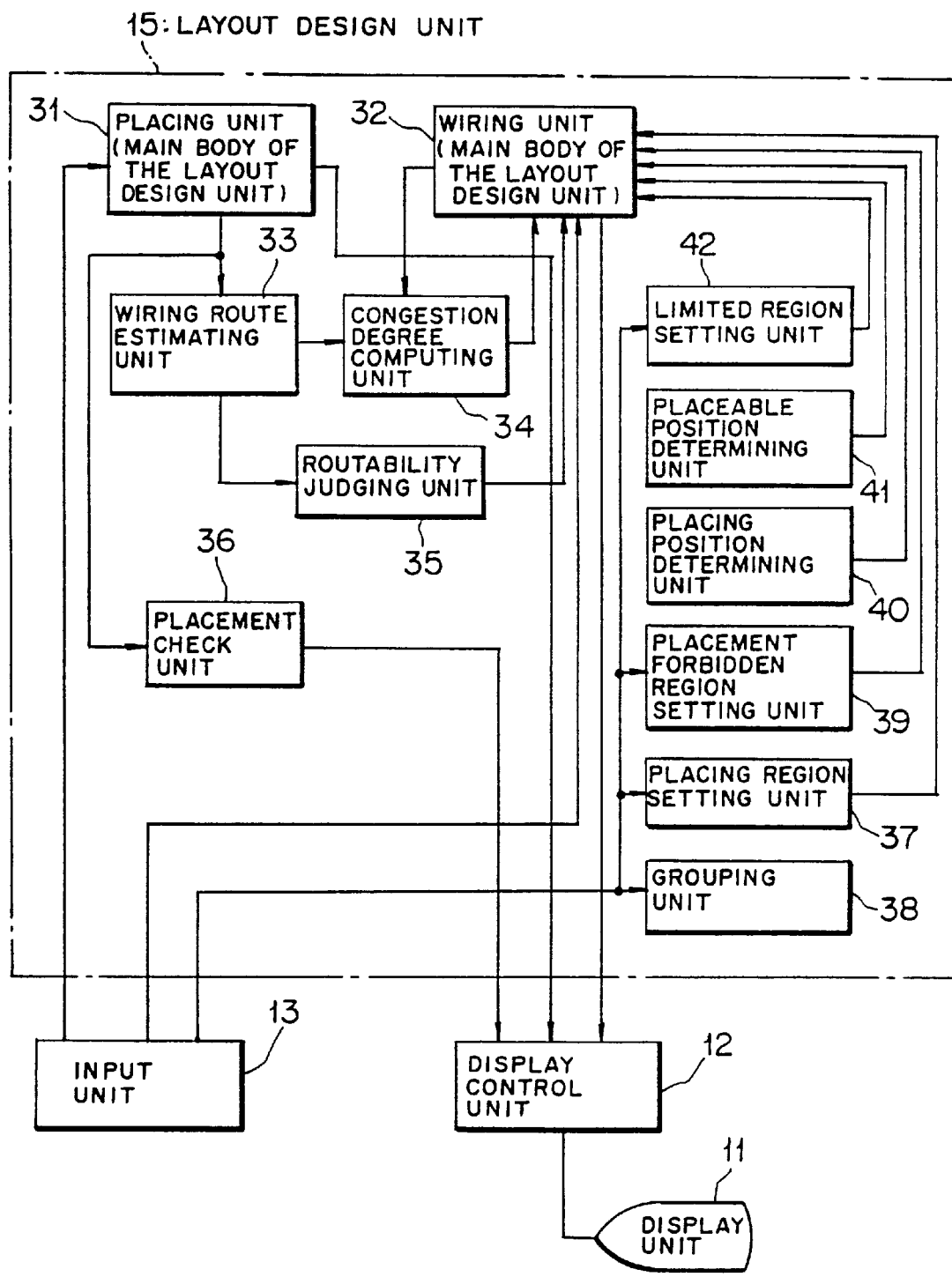
FIG. 3 is a block diagram showing a functional structure of a layout design unit according to the embodiment.

Meanwhile, the layout design unit 15 has, as shown in FIG. 3, a placing unit 31, a wiring unit 32, a wiring route estimating unit 33, a congestion degree computing unit 34, a routability judging unit 35, a placement check unit 36, a placing region setting unit 37, a grouping unit 38, a placement forbidden region setting unit 39, a placing position determining unit 40, a placeable position determining unit 41 and a limited region setting unit 42.

The placing unit 31 conducts a placement in mounting of each cell forming a circuit that is an object of a design on the basis of a result of a logic design by the logic design unit 14. The wiring unit 32 automatically wires between cells after the placing unit 31 has conducted a placement in mounting of the cells on the circuit that is an object of the design. The placing unit 31 and the wiring unit 32 fulfill functions as a main body of the layout design unit 15.

The wiring route estimating unit 33 estimates a wiring route by virtually wiring between cells in a stage where the placing unit 31 determines a placement in mounting of each cell. The congestion degree computing unit 34 divides a circuit that is an object of the design into plural grid-like regions, and computes a degree of congestion of wiring on the circuit that is an object of the design as a rate of the estimated number of used channels based on a result of the estimation by the wiring route estimating unit 33 to the number of usable channels within each grid to make a congestion degree map (refer to FIG. 30) by ranking each grid on the basis of a magnitude of a degree of the congestion. The routability judging unit 35 judges a routability (possibility of wiring) at a rate of roundabout designated previously on the basis of a result of the estimation by the wiring route estimating unit 33.

The wiring unit 32 determines the order of wiring and a rate of roundabout on the basis of a result of the estimation by the wiring route estimating unit 33, then actually wires between cells according to the order of wiring and the rate of roundabout having been determined. In practice, the wiring unit 32 ranks each grid on the basis of the congestion degree map made by the congestion degree computing unit 34, actually wires in a region having a higher degree of congestion preferentially, and determines a routable rate of roundabout if the routability judging unit 33 judges unroutable, as will be described later with reference to FIGS. 30 and 31.

If the wiring by the wiring unit 32 extends over plural layers, the wiring route estimating unit 33 estimates wiring route on each wiring layer, the congestion degree computing unit 34 computes a degree of congestion on the basis of a result of the estimation for each wiring layer by the wiring route estimating unit 33, and the wiring unit 32 actually wires a net having a higher degree of necessity of using a channel whose degree of congestion is estimated to be high on the basis of a degree of congestion of each wiring layer computed by the congestion degree computing unit 34, as will be described later with reference to FIG. 32.

If the wiring by the wiring unit 32 extends over plural layers and plural wiring layers having the same main wiring direction exist, wiring lengths different from wiring layer to wiring layer which have the same main wiring direction are designated previously, and the wiring unit 32 actually wires a wiring layer selected among said wiring layers according to the wiring direction and the wiring length.

Further, the wiring unit 32 can classify nets that are objects of a wiring according to a critical degree (a degree of a wiring margin to a delay value set in advance) to a delay, set an order of wiring and a rate of roundabout to each classified net that is an object of the wiring, and actually wire between logic components according to the order of wiring and the rate of roundabout. In this case, the wiring unit 32 sets a wiring tolerable degree of another net, which will be wired after, in adjacent to the net that is an object of the wiring, then actually wires another net according to the wiring tolerable degree after the actual wiring of the net that is an object of the wiring, as will be described later.

In the above example, there are used a degree of congestion, a critical degree and the like as elements used to determine an order of wiring by the wiring unit 32. Which element is used is set in advance in compliance with demands of a user of the apparatus, or according to an instruction through the input unit 13.

The wiring check unit 36 checks whether a cell causing a placement error after placement of each cell by the placing unit 31 exists or not. If the wiring check unit 36 judges that there is a cell causing a placement error, the display control unit 12 causes the display unit 11 to display a list of cells causing placement errors (refer to FIG. 35), besides fulfilling a function to emphatically display the cells causing placement errors on a placement map of the circuit that is an object of the design on the display unit 11 (refer to FIG. 35), according to this embodiment. At this time, the display control unit 12 has a function to emphatically display only a specific cell on the placement map selected on the cell list according to an instruction through the input unit 13.

The layout design unit 15 of this embodiment has re-wiring process functions (1) and (2), or a re-placing process function (3) as below.

(1) A re-wiring process function such that when an instruction to re-wire a net having been already wired adding a designated wiring length is inputted through the input unit 13, the wiring unit 32 selects a region having a lower degree of congestion on the basis of the congestion degree map of the congestion degree computing unit 34, and automatically conducts a designated length wiring adding a designated wiring length on the net having been wired within the region selected, as will be described later with reference to FIG. 36. Note that the congestion degree computing unit 34 computes a degree of congestion using an actual number of used channels obtained by an actual wiring instead of an estimated number of used channels mentioned above on the basis of a result of an actual wiring executed by the wiring unit 32 to make the congestion degree map.

(2) A re-wiring process function such that when an instruction to re-wire a net having been already wired adding a designated wiring length within a predetermined region including that net is inputted through the input unit 13, the wiring unit 32 automatically conducts a designated length wiring adding the designated wiring length within the predetermined region on the net having been wired in the predetermined region, as will be described later with reference to FIG. 37.

(3) A re-placing/re-wiring process function such that when an instruction to alter a placing position of a cell having been already placed is inputted through the input unit 13, the placing unit 31 alters (replaces) the placing position of the cell, after that, the wiring unit 32 automatically re-wires between the cell and a net if the net that should be linked to that cell is already wired, as will be described later with reference to FIG. 38.

The display control unit 12 of this embodiment has the following multi-window display function (described later with reference to FIGS. 39 and 40) as a function associating with a layout design process by the layout design unit 15. Namely, if the layout design unit 15 conducts a placing process or a wiring process on at least one placement map among plural placement maps according to an instruction through the input unit 13 under a condition where the display control unit 12 causes the display unit 11 to display the plural placement maps of a circuit that is an object of a design (i.e., in a multi-window display condition), the display control unit 12 has a function to display a result of that process in association even on another placement map showing a part that is an object of that process.

The placing region setting unit 37, the grouping unit 38, the placement forbidden region setting unit 39 and the placing position determining unit 40 are served to expand a function used in a hierarchical layout design by the layout design unit 15 (the wiring unit 32) of this embodiment. The placeable position determining unit 41 and the limited region setting unit 42 are served to expand a function used in a hierarchical layout design of a circuit having input/output terminals on a chip surface (a bumped LSI, for example; refer to FIG. 47) by the layout design unit 15 (the wiring unit 32) of this embodiment.

The placing region setting unit 37 sets a placing region in which a virtual (temporary) block terminal (called a tentative terminal on occasion, hereinafter) should be placed on a boundary of each layout hierarchical block (LSG) according to an instruction through the input unit 13, as will be described later with reference to FIGS. 41 and 42. The wiring unit 32 of this embodiment conducts a wiring process while placing a virtual block terminal within a placing region set by the placing region setting unit 37.

At this time, the grouping unit 38 which enters plural virtual block terminals as one group according to an instruction through the input unit 13 is provided to the placing region setting unit 37 so that the placing region setting unit 37 can set a placing region for each group entered by the grouping unit 38 according to an instruction through the input unit 13.

Figure 44:
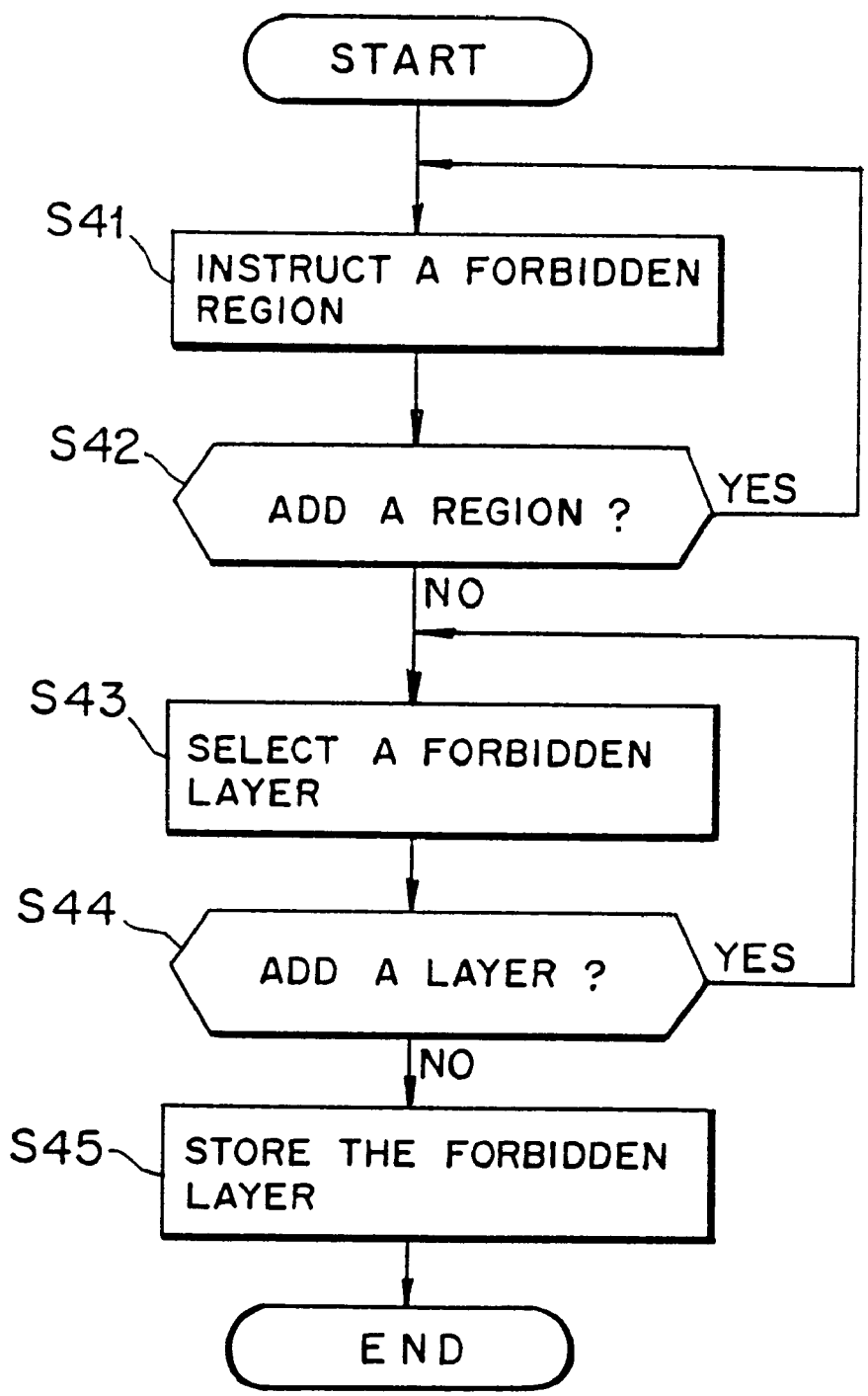
FIG. 44 is a flowchart for illustrating a procedure of a third temporary terminal position determining technique according to the embodiment.

The placement forbidden region setting unit 39 sets a forbidden region in which a virtual block terminal is forbidden to be placed on a boundary of each layout hierarchical block according to an instruction through the input unit 13, as will be described later with reference to FIG. 44. The wiring unit 32 of this embodiment conducts a wiring process while placing a virtual block terminal within a region excepting the forbidden region set by the placement forbidden region setting unit 39.

The placing position determining unit 40 determines a placing position of a virtual block terminal on a boundary of each layout hierarchical block in which the virtual block terminal should be placed, as will be described later with reference to FIGS. 45 and 46. The wiring unit 32 conducts a wiring process between plural layout hierarchical blocks while placing virtual block terminals in respective placing positions determined by the placing position determining unit 40.

The placeable position determining unit 41 determines an input/output terminal placeable position closest to a position of a pin of an input/output circuit if a placing position of the input/output circuit (a cell) that should be wired and connected to an input/output terminal (a bump) on a circuit that is an object of the design has been already determined. When the placeable position determining unit 41 operates, the wiring unit 32 conducts a wiring process between an input/output terminal placeable position determined by the placeable position determining unit 41 and a pin of the input/output circuit, as will be described later with reference to FIG. 48.

Further, if a placing position of an input/output terminal (a bump) on a circuit that is an object of the design has been already determined, the limited region setting unit 42 sets a limited region in which a placing position of the input/output circuit is so limited that a distance between the input/output terminal and a pin of the input/output circuit (a cell) that should be connected to the input/output terminal is below a predetermined value according to an instruction through the input unit 13. When the limited region setting unit 42 operates, the placing unit 31 places the input/output circuit within the limited region set by the limited region setting unit 42 and the wiring unit 32 conducts a wiring process between the pin of the input/output circuit and the input/output terminal.

(b) Description of a delay computation and a path tracing according to this embodiment [(b1) through (b11)]

(b1) First, description will be made of a delay computation in consideration of dullness of an input waveform done by the delay computing unit 21 in the speed analyzing unit 16 of this embodiment with reference to FIGS. 4 and 5.

A path delay value of a gate (a cell) has been computed as a static value according to a load capacitance of an input/output or a load drive capability of a gate. However, a path delay value of a gate is largely affected by dullness of a waveform of a signal (input waveform dullness) inputted to a remarked gate, as set forth above. Dullness of a signal waveform largely varies depending on a magnitude of a capacitance of a wiring path, In particular, a signal which has passed through a longer wiring path has a larger waveform dullness.

According to this embodiment, a function of a path delay value to an input waveform dullness is stored in advance in the database 10. When the delay computing unit 21 computes a delay value of a wiring path, a value according to dullness Tsin of a signal inputted to a remarked gate is computed on the basis of a function in the database 10, and set as a path delay value TO of the remarked gate. The path delay value TO is added to a delay value of a wiring path by the delay computing unit 21.

At this time, said function can be given as a linear function. Namely, at least one pair of an assumptive delay value in the case where some waveform dullness is contained and a predetermined inclination based on that assumptive delay value is stored in the database 10, whereby it is possible to dynamically set a path delay value TO of the remarked gate.

Figure 4:
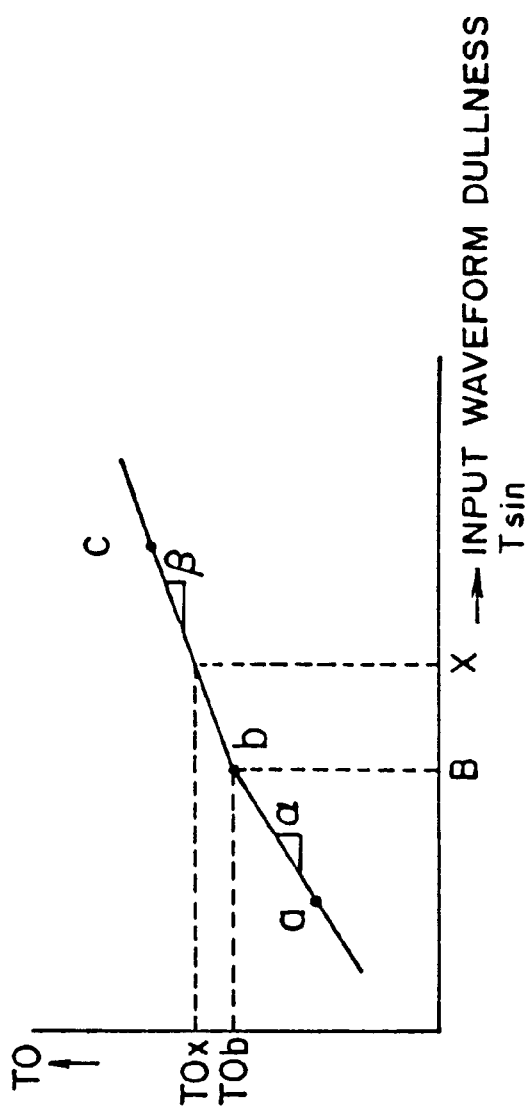
FIG. 4 is a graph showing a relation between input waveform dullness and path delay values.
Figure 5:
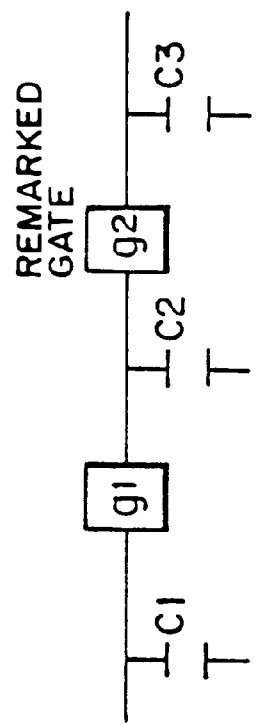
FIG. 5 is a block diagram for illustrating a delay computation in consideration of an input waveform dullness.

Now, an example where a path delay value of a remarked gate g2 in a circuit as shown in FIG. 5 is set will be described referring to a relation between an input waveform dullness Tsin and a path delay value TO as shown in FIG. 4.

It is assumed that data of three points of a, b and c in terms of a wiring capacitance (a load capacitance) are obtained as a relation between an input waveform dullness Tsin and a path delay value TO.

In a circuit shown in FIG. 5, there are provided two gates g1 and g2 on a wiring path, and a load capacitance of a net (wire) in the front stage of the gate g1 is C1, a load capacitance of a net between the gates g1 and g2 is C2, and a load capacitance of a net in the rear stage of the gate g3 is C3. A signal travels from the left to the right in FIG. 5. In FIG. 5, the gate g2 is a remarked gate. Accordingly, the gate g1 is a driver gate for the gate g2.

If a path delay value TO is given to an input waveform dullness Tsin from characteristics of the three points a, b and c as shown in FIG. 4, an input waveform dullness X of a signal inputted to the remarked gate g2 is computed based on the load capacitances C1 and C2 of a net, and a load drive ability of the driver gate g1 on the assumption that a signal having an input waveform dullness of an appropriate value (an average value) is inputted to the gate g1 in FIG. 5.

A path delay value TOx corresponding to the input waveform dullness X so computed is determined by an interpolation computation based on the known two points a and c. Then, α is determined from the two points a and b and β is determined from the two points b and c as an inclination of a graph shown in FIG. 4, and these values (α, β, B, X and TOx) are stored in the database 10 as path delay data of the remarked gate g2. Incidentally, B is an input waveform dullness at the known point b.

Here, when the input waveform dullness X is computed, an appropriate value is set to the gate in the front stage (the driver gate) g1 of the remarked gate g2, and a delay value of the remarked gate g2 is tentatively computed. Since this value is computed in consideration of an input waveform dullness in some degree, it is possible to compute a delay with some degree of accuracy even if a path trace is performed using a fixed gate delay value.

As above, a delay computation by a path trace and a simultaneous computation of an input waveform dullness at the gate allow an accurate, high-speed delay computation.

(b2) Delay of a net between gates can be roughly classified into three types depending on a mounting form of a circuit. The first is a delay before placement of gates (after a logic design by the logic design unit 14). The second is a delay after placement of gates (before an actual wiring). The third is a delay after an actual wiring. The apparatus of this embodiment makes a net list for each of these three mounting forms, calculates a delay value of a net through the same delay formula in each of the mounting forms, and takes the delay value into account in the circuit design.

A net list in each of the mounting forms is given below:

(1) Before placement of gates, a wiring length between a driver (D) and a receiver (R), a wiring length between a receiver (R) and a receiver (R) and a wiring length between LSGs can be designated, and a wiring length of a net is assumed on the basis of a result of a logic design using a designated wiring length. For instance, a wiring length between D and R is 100 grid (1 grid=1.6 µm), a wiring length between R and R is 100 grid and a wiring length between LSGs is 1000 grid with reference to an empirical delay value, and a wiring length of a net is tentatively calculated from a result of the logic design. As a wiring capacitance, a logical wiring capacitance set by suitably increasing and adding a wiring parasitic capacitance is used to an actual wiring capacitance per unit on the assumption that a suitable neighboring net exists (for instance, a neighboring net is assumed to exist on one side entirely).

(2) After placement of gates, the shortest distance is calculated using, for example, a Steiner tree, from pin positions of the gate, and the shortest distance is used as a logical wiring length. As a wiring capacitance at this time, the logical wiring capacitance mentioned above is used. If plural wiring layers exist, a rate of use, and a logical wiring capacitance and a logical wiring resistance per unit length are set for each of the layers.

(3) After an actual wiring between gates, an actual length of a wiring on each wiring layer is actually obtained. As a wiring capacitance, the actual length and an actual wiring capacitance calculated on the basis of a condition of adjacency to another net are used.

A delay value is estimated and calculated using the above wiring length and wiring capacitance for each of the mounting forms.

According to this embodiment, the speed analyzing unit 16 can estimate and calculate a delay value of a wiring path of a circuit that is an object of a design before placement of gates as above so that a result of the delay computation can reflect on a circuit design in an early stage. It is therefore possible to efficiently design a more minute and more highly integrated circuit.

After placement of gates, the speed analyzing unit 16 estimates a delay value on the basis of the shortest route between pins that should be connected with each other and calculates a delay value on the basis of a result of an actual wiring after the actual wiring. It is therefore possible to take a result of the delay computation into account in the placement design or the wiring design, and always consider the delay value in the circuit design.

(b3) When the path trace unit 22 of this embodiment traces a wiring path of a circuit that is an object of the design, routes (wiring paths) from a given pin to all destination pins (an input pins of an FF, a RAM and the like, an LSI output pin, and the like) are found out, and an input waveform dullness and a delay value corresponding to the input waveform dullness for each of the routes are calculated by the delay computing unit 21, and the delay value of each of the routes is calculated simultaneously with a tracing by successively propagating the delay value. Such tracing process and delay computation are applied in each of the above three mounting forms.

Figure 6:
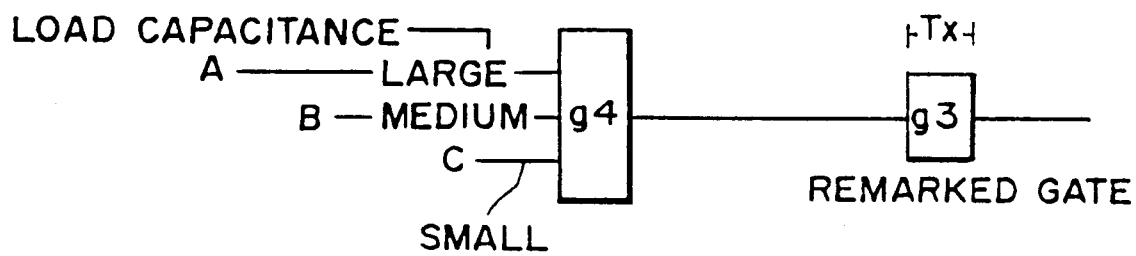
FIG. 6 is a block diagram for illustrating an example in which a gate path delay value is set and altered according to an input waveform dullness.

For example, assuming a wiring path in which a remarked gate g3 having a path delay value Tx and a driver gate g4 receiving signals from nets A, B and C disposed in the front stage of the gate g3 and having three different load capacitances, as shown in FIG. 6.

In a circuit as shown in FIG. 6, the path delay value Tx of the remarked gate g3 has been handled as a fixed value, and the same value has been employed as the path delay value Tx of the remarked gate g3 in the event of a delay computation in terms of a signal inputted from any of the three different nets A through C having different load capacitances linked to the front stage gate g4.

However, the path delay value of the remarked gate g3 actually varies depending on a magnitude of an input waveform dullness, as described above. If a path delay value according to the characteristic cannot be set, no accurate delay computation is feasible.

Among signals from the three nets A through C, a waveform dullness of a signal from the net A having a large load capacitance is, in general, the greatest. A waveform dullness of a signal from the net C having the smallest load capacitance is the smallest. But the waveform dullness successively propagates, so the signal dullness in the front stage of the net A may possibly be very small or a signal having an extremely large dullness may possibly be inputted to the front stage of the net C.

In consequence, it is possible to calculate an accurate path delay value at a high speed by computing a delay value along with a waveform dullness from a start point of the delay computation (a path trace) as this embodiment.

(b4) According to this embodiment, a path trace accompanied by a delay computation of a clock system and between FFs (flip-flop; an element for storing information) is performed by virtue of functions of the delay computing unit 21, the path trace unit 22, the timing check unit 23 and the flag setting unit 24 mentioned above, whereby it is possible to automatically check data paths between all FFs on the circuit that is an object of the design in consideration of a clock phase, a skew and the like.

If the clock system supplying a clock signal to each of the logic components has been already designed, a clock pin of the clock system that should be checked by the timing check unit 23, and an initial value and a phase of the clock signal inputted from that clock pin are inputted through the input unit 13.

The path trace unit 22 then traces a wiring path from the designated clock pin and searches all FFs, RAMs and the like connected to the clock pin, besides the delay computing unit 21 calculates a clock path delay value. This value is stored. At this time, the flag setting unit 24 attaches a flag used to discriminate that this is a route for a clock at each of the pins of the FFs and RAMs.

After that, the path trace unit 22 traces all the paths one by one from each of the clock input pins of all the FFs and RAMs having been searched, and the delay computing unit 21 determines a path delay value up to the data pin of each of the FFs and RAMs.

During this tracing, if the route joins a pin with a flag of ON set by the flag setting unit 24, that pin is a clock control point and one of objects of the timing check, so the timing check unit 23 is activated.

The timing check unit 23 can check a clock timing of an FF or a RAM to which the pin belongs on the basis of the delay value up to that pin calculated by the delay computing unit 21, the clock path delay value stored in advance, and the initial value and the phase of the clock signal designated through the input unit 13 while considering a clock skew.

The timing check unit 23 performs a check considering manufacturing variations using the following equations (1) and (2), for example, and the display control unit 12 causes the display unit 11 to display a check list of paths not meeting the conditions or a path delay distribution map or the like of a result of the check to notify it to the designer. Incidentally, the delay value is basically calculated as a typical value. However, manufacturing variations (approximately ±40%) occur in LSIs actually manufactured.

$$(Tp1+Tc1_{MAX})+Td_{MAX}-(Tp2+Tc2_{MIN})+Tsetup \leq \tau \quad (1)$$

$$(Tp1+Tc1_{MIN})+Td_{MIN}-(Tp2+Tc2_{MAX})+Thold \geq 0 \quad (2)$$

Figure 7:
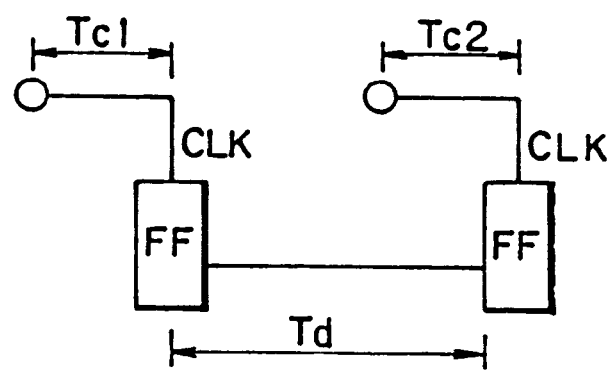
FIGS. 7 and 8 are block diagrams for illustrating respective clock timing check techniques according to the embodiment.

Here, the equation (1) is used to check an overdelay as a timing restriction, while the equation (2) is used to check a racing as a timing restriction. Each symbol in the equations (1) and (2) will be described with reference to FIGS. 7 and 8. In a circuit shown in FIG. 7, two FFs that are objects of a timing check are supplied clock signals from different clock terminals, respectively. In the circuit shown in FIG. 8, two FFs that are objects of a timing check are supplied a clock signal from same clock terminal.

In the equations (1) and (2), $\tau$ is a clock cycle time (a clock cycle), Tp1 and Tp2 are phases of clock signals that should be supplied to the respective FFs designated through the input unit 13, Tc1max and Tc2max are maximum values of clock path delay values for the respective FFs which are calculated and stored as described above, Tc1min and Tc2min are minimum values of clock path delay values for the respective FFs which are calculated and stored as described above, Tdmax and Tdmin are the maximum and minimum values of path delay values, respectively, which are calculated by the delay computing unit 21 following the path trace, and Tsetup and Thold are setup time and hold time, respectively, which are margins (delay values inside the FFs) for the respective FFs.

Figure 8:
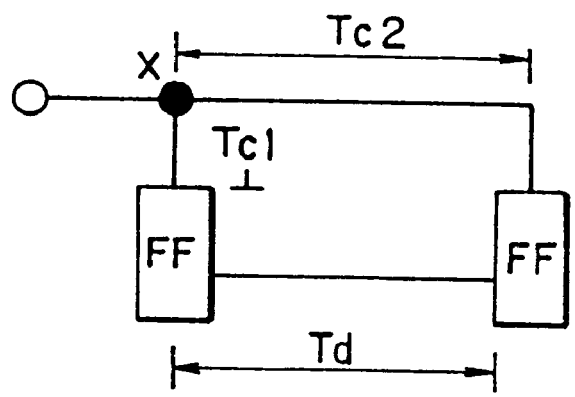

If the clock signal for the FF on the data transmitting side and the clock signal for the FF on the data receiving side are the same as in a circuit shown in FIG. 8, a clock route is already known. Accordingly, it is possible to perform a back trace from each of the FFs toward a clock terminal and search a bifurcating point X of a clock signal line.

According to this embodiment, it is possible to automatically and one-by-one perform a clock timing check on wiring paths of all combinations between enormous number of FFs and RAMs operating in response to a clock signal from the clock system, as above.

(b5) If there are plural clock systems having different clock cycle time within one LSI, FFs or RAMs connected to one clock system not designated are not recognized when the above clock timing check is performed by designating another clock system. It is therefore sufficient to separately perform a timing check between FFs operating in different clock cycle for each clock system.

Figure 9:
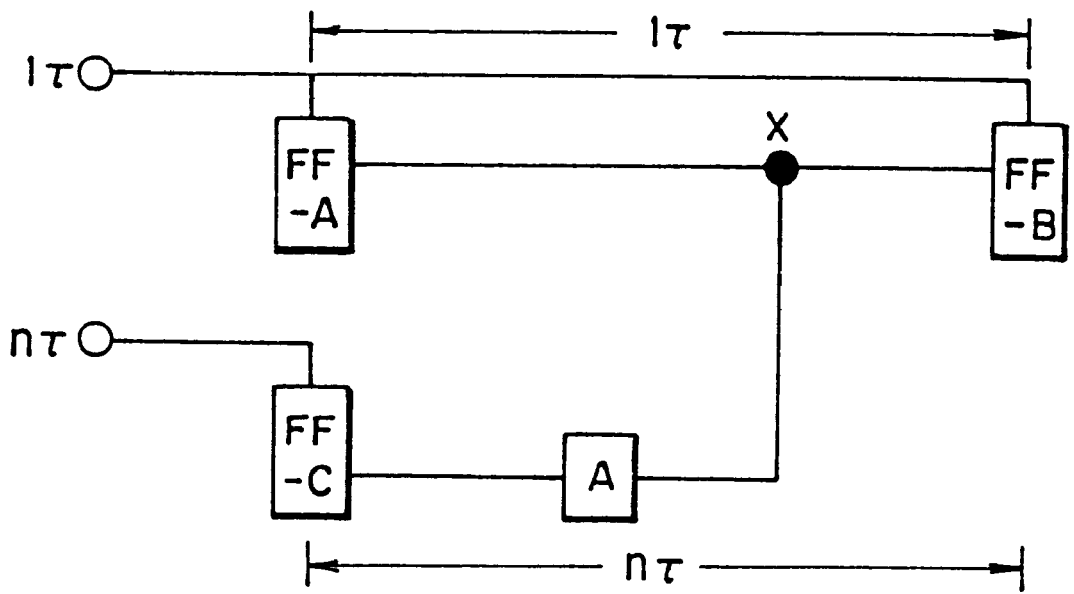
FIG. 9 is a block diagram for illustrating a technique to simultaneously conduct a timing check on clock systems having different clock cycles.

However, if one FF-B (a flip-flop) receives data from FF-A and FF-C driven in different clock cycles $1\tau$ and $n\tau$ as shown in FIG. 9, the above equations (1) and (2) cannot comply with since these equations (1) and (2) are on the presumption that the flip-flop is operated in a single clock cycle so that the timing check is impracticable.

According to this embodiment, it is possible to execute a check on a circuit as shown in FIG. 9 by the timing check unit 23 by virtue of a function of the above-mentioned delay value setting unit 24, as below.

Namely, the delay value setting unit 24 sets a predetermined delay value to a pin (for example, a pin A in FIG. 9) appearing in a tracing of a wiring path by the path tracing unit 22, and the predetermined delay value is automatically added to a path delay value when the delay computing unit 21 computes a delay.

The circuit shown in FIG. 9 will be now practically described. If a timing check is made on FF-C, which operates in a clock cycle $n\tau$ and requires $n\tau$ to transfer data to FF-B, and FF-B, a predetermined delay value $-(n-1)\cdot\tau$ is set to an arbitrary pin A existing on a wiring path from FF-C to a point X which is between FF-A and FF-B, the delay value $-(n-1)\cdot\tau$ is added as a delay value in the event of a path tracing from FF-C to FF-B, whereby the timing check unit 23 can conduct a timing check in a clock cycle of $1\tau$ using the above equations (1) and (2).

As above, it is possible to simultaneously conduct a clock timing check on a wiring path operating in response to (an asynchronous) clock signals having different cycles so that the clock timing check can be conducted efficiently by using the function of the delay value setting unit 24.

(b6) There is a case that a rough timing check between FFs is required in a condition where only a data system has been designed in the course of a design even if the clock system supplying a clock signal to FFs or RAMs is not yet designed. In such case, it is impossible to designate a clock as described above.

According to this embodiment, if the clock system has not yet been designed, the search unit 26 finds out all clock inputs of FFs and RAMs within an LSI by virtue of a function of the search unit 26 mentioned above, besides the flag setting unit 24 attaches a flag by which a clock route can be discriminated to each pin of the FFs and RAMs.

After that, the path trace unit 22 performs a path trace one-by-one on paths from every searched clock input pins, and the delay computing unit 21 determines a path delay value up to each of data pins of the FFs and RAMs.

During a tracing, if a traced route joins a pin with a flag of ON set by the flag setting unit 24, that pin is a clock control point and one of objects of a timing check, so the timing check unit 23 is activated.

If the timing check unit 23 performs a timing check using the above equations (1) and (2), Tp1, Tp2, Tc1max, Tc2max, Tc1min and Tc2min among the values mentioned above are set at zero since the clock system is not yet designed here, and a rough timing check is performed.

According to this embodiment, it is possible to, even if a clock system is not yet designed, automatically conduct a clock timing check one-by-one a wiring path of every combinations between enormous numbers of FFs or RAMs operation in response to a clock signal from the clock system by using the functions or the like of the search unit 26 so as to take a result of the check into account in a design of the clock system or the data system.

(b7) In this embodiment, the counter 27 is provided to each of all pins of gates, as having been described before. When a path trace is conducted from an input pin of an LSI, a clock pin of an FF and a clock pin of a RAM, the counter 27 provided to a pin counts one each time the trace passes through that pin.

When all traces are completed by the path trace unit 22, the designer can know a pin having the highest frequency of passage of signals by referring to a count value of the counter 27 at each pin. In other words, the designer can discriminate a pin exerting a great affect on delay improvement or the like and use a result of the discrimination as a guide to determine an priority when improving the placement or the wiring.

At this time, the display control unit 12 causes the display unit 11 to display information in terms of a magnitude of frequency of passage of signals at each pin on the basis of result of the count by the counter 27 in the form of a list or in highlighting in a mounting screen, whereby the designer can readily refer to or grasp the information.

(b8) According to this embodiment, a cutting of a path, an initialization of a delay value or a designation of addition are conducted by virtue of functions of the region setting unit 28 and the delay value setting unit 25. Incidentally, the adding process on a delay value by the delay value setting unit 25 has been described in the example of a timing check on clock systems of different clock cycles (described with reference to FIG. 9).

Namely, the path trace unit 22 conducts a tracing process of a wiring path and the delay computing unit 21 conducts a delay computing process only within an executing region set by the region setting unit 28 in response to an instruction through the input unit 13. Besides, the display control unit 12 causes the display unit 11 to display only a result of the process within the executing region set by the region setting unit 28.

By setting an executing region for a process to cut a path as above, it is possible to stop a process or a display of a loop, or stop a path delay computation at a designated pin for a circuit in which a signal is not theoretically propagated but propagated in the path delay computation.

If a forward trace is conducted by designating a trace start pin, the number of trace destination pins are enormous if a circuit has a large scale so that it becomes difficult to see if all paths are displayed or a considerable time is required to perform a trace process or a delay computation on all paths. However, the region setting unit 28 sets an executing region and a tracing process and a delay computation are possible on only necessary parts while the display unit 11 displays those parts, which can shorten a process time.

If a long time is required for a delay computation in the case of an extremely long path, the region setting unit 28 designates to conduct a process from a pin in the course of the path and the delay value setting unit 25 gives an appropriate initial value to the pin in the course of the path as a delay value to ignore a delay value up to the front stage of that pin, whereby a delay computation is conducted on only a path of the rear stage of that pin within a short time, and a result of the computation is displayed on the display unit 11.

By conducting and displaying a tracing process and a delay computing process in only a region required by the designer, it is possible to obtain only data of only necessary parts and improve efficiency of a circuit design. In addition, by initializing a delay value at an arbitrary pin, it is possible to realize a control of a path computation (a delay computation).

(b9) As tracing techniques by the path trace unit 22, there are three traces of a forward trace, a backward trace and a trace between two points. In this embodiment, the above three trace techniques are automatically switched according to a type of a trace pin designated to the path trace unit 22 through the input unit 13 by using a function of the trace control unit 29.

More specifically, if only a trace start pin (a source pin) is designated, the path trace unit 22 executes a forward trace from that trace start pin. If only a trace destination pin (a target pin) is designated, the path trace unit 22 executes a backward trace from the trace destination pin. If two points of a trace start pin and a trace destination pin are designated, the path trace unit 22 executes a trace between these two points.

At this time, it is impossible to conduct a delay computation simultaneously with the path trace in the case of the backward trace. Accordingly, after completion of the backward trace from the target pin to the source pin, the path trace unit 22 once more executes a forward trace (a back trace) from each of the source pins to the target pin, and the delay computing unit 21 conducts a delay computation at the same time. However, if the above process is performed on all the paths, an enormous time is required as the number of source pins searched in the backward trace increases.

To solve this problem, a mode as to whether a delay computation is conducted in the event of the backward trace or not is set in advance by virtue of a function of the mode setting unit 30, according to this embodiment. The delay computation is executed only when the designer wants. A switching by the mode switching unit 30 can be executed by switching whether a delay value is added or not in a path tracing.

If the designer does not want to spare time for the backward trace, the designer can so set not as to conduct a delay computation without adding a delay value through the mode setting unit 30. If the designer wants a delay computation even if it takes time, the designer adds a delay value through the mode setting unit 30.

If the number of source pins searched in the backward trace is large, only a tracing process is conducted without a delay computation and only a desirable path is selected on the display unit 11 through the above-mentioned region setting unit 28 to compute a delay. This manner can provide a desired delay value more quickly.

(b10) If a path is displayed on the display unit 11, a result of a tracing process by the path trace unit 22 and a result of a delay computation by the delay computing unit 21 are displayed as a list as shown, for example, in FIG. 10 in a window on the display unit 11 by the display control unit 12 so that the designer can easily make a judgement as to which path he should select.

In the list shown in FIG. 10, there are entered a pin number of a target pin obtained as a result of a path trace in an item of "No.", a path delay value of a rising signal (an up-edge) in an item of "UpDelay", a path delay value of a falling signal (a down-edge) in an item of "DnDelay" and a pin name of a target pin in an item of "Pin Name".

By displaying pin numbers, delay values and pin names in a list, it becomes easy to grasp a path having a large delay value. The designer refers to the list display and selects an arbitrary target pin on the list display through the input unit 13 so as to cause the display unit 11 to display a wiring path of that target pin in another window.

According to this embodiment, a function to sort a condition of a display of a list as shown in FIG. 10 according to pin names of target pins or delay values of trace destination pins is provided to the display control unit 12. By using this sorting function, it is possible to display a list in a sorted condition as shown in FIGS. 11 through 13 on the display unit 11. Such sort allows the designer to clearly and readily grasp a pin name of a target pin or a magnitude of a delay value from the display on the display unit 11.

However, the order of sorted delay values changes depending on a wiring length mode and a destination edge mode. For instance, if a sort is so performed as to meet conditions of the maximum wiring length mode and destination edge up, the delay values are sorted in order of magnitude of upside delay value. In other words, the delay values are always sorted in the worst order.

A list shown in FIG. 11 is a practical example where the pin names on the list in FIG. 10 are sorted in alphabetic order (a maximum wiring length mode, destination edge up). A list shown in FIG. 12 is an example where the delay values on the list in FIG. 10 are so sorted as to meet conditions of the maximum wiring length mode and destination edge up. A list shown in FIG. 13 is an example where the delay values on the list shown in FIG. 10 are so sorted as to meet conditions of the maximum wiring length mode and destination edge down.

According to this embodiment, a pin name retrieving function and a file outputting function are provided to the above list displaying function.

The pin name retrieving function allows a hierarchical display of a list as shown, for example, in FIG. 14 in order to easily grasp the display since the number of target pins obtained in a path trace is extremely large. Namely, in a display condition shown in FIG. 14, information of an upper hierarchy of the list shown in, for example, FIGS. 10 through 13 are displayed.

In the list shown in FIG. 14, a rage of pin numbers of target pins is entered in an item of "No.", the maximum value and the minimum value of an up-side delay value are entered in an item of "UpDelay", the maximum value and the minimum value of a down-side delay value are entered in an item of "DnDelay", and a pin name of the first target pin is entered in an item of "Pin Name".

If "1 through 20" that is information of the upper hierarchy of a pin number of a target pin is selected from the displayed list through the input unit 13, for example, the list of the pin numbers 1 through 20 as having been described with reference to FIGS. 10 through 13 is displayed as information of the lower hierarchy on the display unit 11. If "ADD BUF<8>.CK" is designated through the input unit 13 as a pin name in a condition of the list display shown in FIG. 14, for example, a list of twenty pins including the lower hierarchy information of the pin name "ADD BUF<8>.CK" is displayed on the display unit 11.

The sort display or the hierarchical display (a contents display) as above allows a compact and clear display of information about an enormous number of target pins on the display unit 11. In consequence, the designer can readily grasp a result of a tracing or a result of a delay computation from a display on the display unit 11 so as to immediately make various judgements in a circuit design.

On the other hand, the file outputting function uses the external file writing unit 18 mentioned hereinbefore. The file outputting function is to output information about all target pins (pin numbers, pin names, results of delay computations, and the like) in the form shown in FIGS. 10 through 13 displayed on the display unit 11 to the external file 18A and write it thereinto.

A sorting mode of a list upon a file output is the same as a sorting mode of a list at the time the list is being displayed on the display unit 11. Namely, if the list is sorted according to pin names on the display unit 11, a list to be written into the external file 18A is also sorted according to the pin names.

The external file writing unit 18 writes a list of target pins into the external file 18A, thereby storing the list in the external file 18A or saving it.

(b11) When the designer refers to the list display as above and selects an arbitrary target pin on the list display through the input unit 13, a destination route of a wiring path of that target pin is displayed in another window on the display unit 11.

According to this embodiment, the destination route is displayed as a schematic destination route diagram of a result of a trace in relation to that selected target pin (refer to the lower part of FIG. 15) and a graph of delay values at each gate and net of the wiring path (refer to the upper part of FIG. 15).

In the graph shown in the upper part of FIG. 15, a result of a trace and a result of a delay computation obtained by the delay computing unit 21 are displayed as a bar graph showing a delay value at each point (a gate or a net) in the destination route diagram shown in the lower part of FIG. 15, and a graph of broken lines showing an accumulated delay value at each point.

For instance, if a delay value at the target pin is 1800 ps, the graph of broken lines shows how the delay value increases on the path until reaching the target pin from the source pin, while the bar graph shows how much percentage a partial delay value on each position on the path accounts for of a total delay value (1800 ps in FIG. 15).

In the destination route diagram shown in the lower part of FIG. 15, each block shows a gate, a line connecting the blocks shows a net (a wiring), and alphabets entered in the diagram are information about pin names connected to the path.

Through the destination route display as shown in FIG. 15, the designer can discriminate a point on the wiring path where the signal requires a long time to pass through so as to immediately make various judgements upon a circuit design, for example, determination of a point requiring an improvement in placement or wiring.

In the destination route display as shown in FIG. 15, plural wiring paths can be simultaneously displayed on the display unit 11. In this case, the designer can compare delay conditions of the plural wiring paths while referring them on the display unit 11.

The destination route display displayed on the display unit 11 (a schematic destination route diagram and a graph) can be printed out on a predetermined paper by the printing unit 19, or outputted to and written in the external file 18A by the external file writing unit 18. Through a print-out on the predetermined paper, the designer can examine a delay condition of a wiring path while referring to a result of the print. In addition, by writing the destination route display into the external file 18A, the data can be stored or saved in the external file 18A.

A file output of the destination route display is in the form as shown, for example, in FIG. 16. Data shown in FIG. 16 corresponds to the destination route diagram shown in the lower portion of FIG. 15. The data shown in FIG. 16 includes data of up-side waveform dullness and down-side waveform dullness as "UpTsin" and "DnTsin", respectively.

It is possible to display an actual circuit diagram corresponding to the destination route diagram shown in FIG. 15 on the display unit 11 according to an instruction through the input unit 13, as shown in, for example, in FIG. 17. In the example shown in FIG. 17, the whole of the actual circuit portion corresponding to a desired destination route is emphasized in a technique such as alteration of a displaying color, a highlight display or the like (slanting lines represent cells and fat lines represent nets in FIG. 17) and displayed on a placement map of a circuit that is an object of the design on the display unit 11. At this time, it is possible to display a fan-out in this embodiment. By displaying a fan-out, a region on which the route affects is cleared.

By designating not only an actual circuit diagram of an entire route as shown in FIG. 17 but also a particular net or cell through the input unit 13, it is possible to emphasize and display only that net or cell on the placement map on the display unit 11 as shown in, for example, FIG. 18 [FIG. 18 shows an example where only one cell (represented by slanted lines) is emphasized and displayed].

The designer can specify a portion having a large delay value on an actual circuit diagram (a placement map) while comparing it with a delay value graph of a destination route display as shown in FIG. 15.

The apparatus of this embodiment is provided with a function to display all paths between source pins and target pins. This displaying function is used when the designer judges how far a moving process of a component affects if the part such as a cell is moved.

Figures 19, 20:
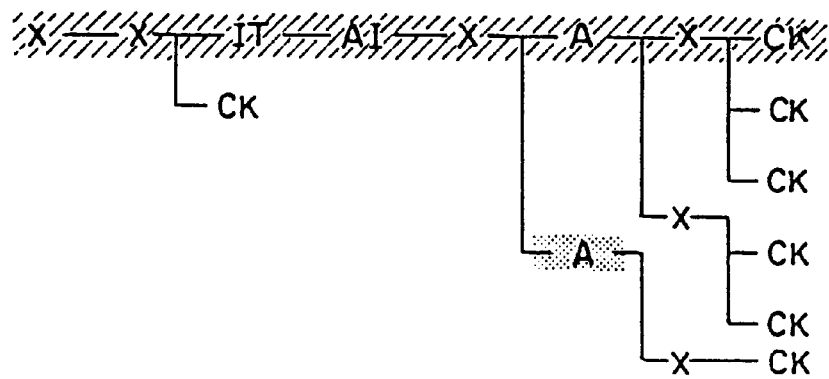
FIG. 19 shows an example of a wiring path in the form of a tree structure according to the embodiment.
FIG. 20 shows an example of a display of detailed information according to the embodiment.

At this time, an entire path is schematically displayed in the form of a tree structure as shown in, for example, in FIG. 19 so that the designer can clearly grasp it on the display unit 11. Namely, all wiring paths from a source pin to target pins traced by the path trace unit 22 is displayed with a pin name of a pin of each cell in the form of a tree structure on the display unit 11.

In this tree structure display, only pin names are displayed in order to provide a clear display condition. If an arbitrary pin is selected through the input unit 13, not only detailed information of that pin (a cell name, a library name, a delay value, a net name and the like), but also detailed information in terms of the preceding pin of that pin and detailed information in terms of the following pin of that pin are displayed in a window on the display unit 11, as shown in, for example, FIG. 20.

In FIG. 19, a path transversely lining up on the uppermost part (represented by slanted lines) is a destination route. This part is differently colored on the display screen and subjected to a process such as highlighting to be displayed.

In FIG. 19, if a pin A indicated by meshes is selected through the input unit 13, detailed information as shown in, for example, FIG. 20 is displayed in a window on the display unit 11 as described before. In FIG. 20, detailed information of the selected pin A [pin name (Pin), cell name (Cell), macro name (Macro), net name (Net), delay value (Delay: up-side, down-side), and waveform dullness (Tsin: up-side, down-side)] is displayed in the upper column, detailed information in terms of the preceding pin X of the pin A is displayed in the middle column, and detailed information in terms of the following pin X of the pin A is displayed in the lower column.

The designer can thereby readily obtain the detailed information about each of the pins while grasping the whole of the wiring path.

By displaying a result of a trace by the path trace unit 22 or a result of a computation by the delay computing unit 21 in various forms on the display unit 11 as above, the designer can readily grasp the result of the trace or the result of the delay computation. This largely contributes to simplification and improvement in efficiency of circuit design.

(c) Description of a displaying technique of this embodiment

Figure 21:
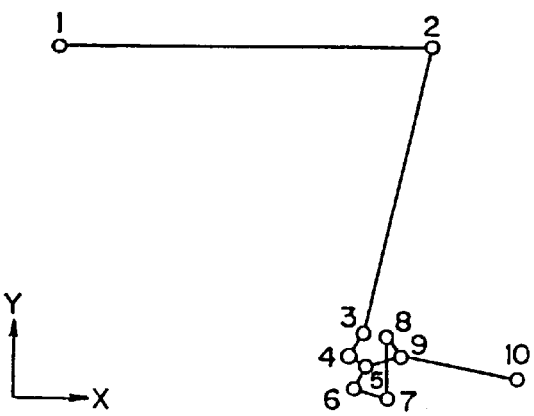
FIG. 21 shows an example of an entire display of characteristic points whose density locally differs.

If a finite number of points and lines connecting them exist on a plane, there is a case where the designer wants to know how the lines connect the points. When such figure is displayed in CAD, each point is placed in a position proportional to coordinate values of each point, and lines between such points are then placed to be displayed. However, if a large difference locally exists in a density of a group of points, a minute portion (point numbers 3 through 7) is hard to be recognized if the whole of the group of the points is displayed in a displayable magnitude as shown in FIG. 21 because of a limitation of sizes or resolutions of a screen, a printing apparatus and a printing medium. If the minute portion is enlarged to be displayed as shown in FIG. 22 in order to clearly show the minute portion, it becomes impossible to look out over the whole point group.

A problem of this sort also occurs in a circuit diagram (a diagram made up of pins, vias and the like as characteristic points and nets that are lines) in which a group of points are displayed on the display unit 11 of the circuit designing apparatus of an interactive type. According to this embodiment, to solve such problem, coordinates of characteristic points such as pins, vias or the like of cells are sorted (aligned; provided that the same coordinate values are considered to be in the same rank) by the display control unit 12 in the order of their ascending or descending for each coordinate axes (X, Y), each coordinates are substituted with coordinate values in proportion to its rank, and each of the characteristic points is displayed on the display unit 11. Groups of points as shown in FIGS. 21 and 22, for example, are displayed in a condition as shown in, for example, FIG. 23 by virtue of the above-mentioned function of the display control unit 12.

Figure 22:
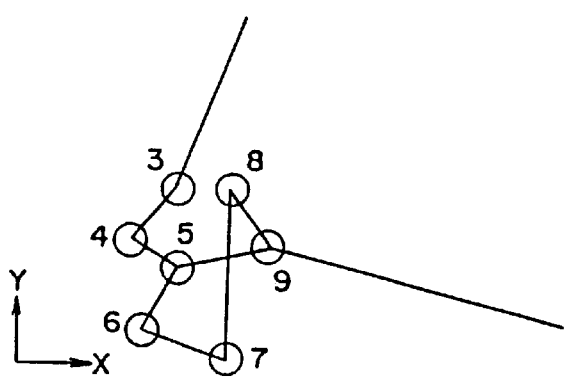
FIG. 22 shows an example of an enlarged display of the characteristic points in a high-density.
Figure 23:
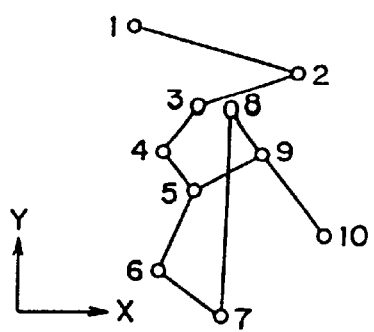
FIG. 23 shows an example of an entire display of the characteristic points after a coordinate conversion by an order substitution according to the embodiment.
Figure 24:
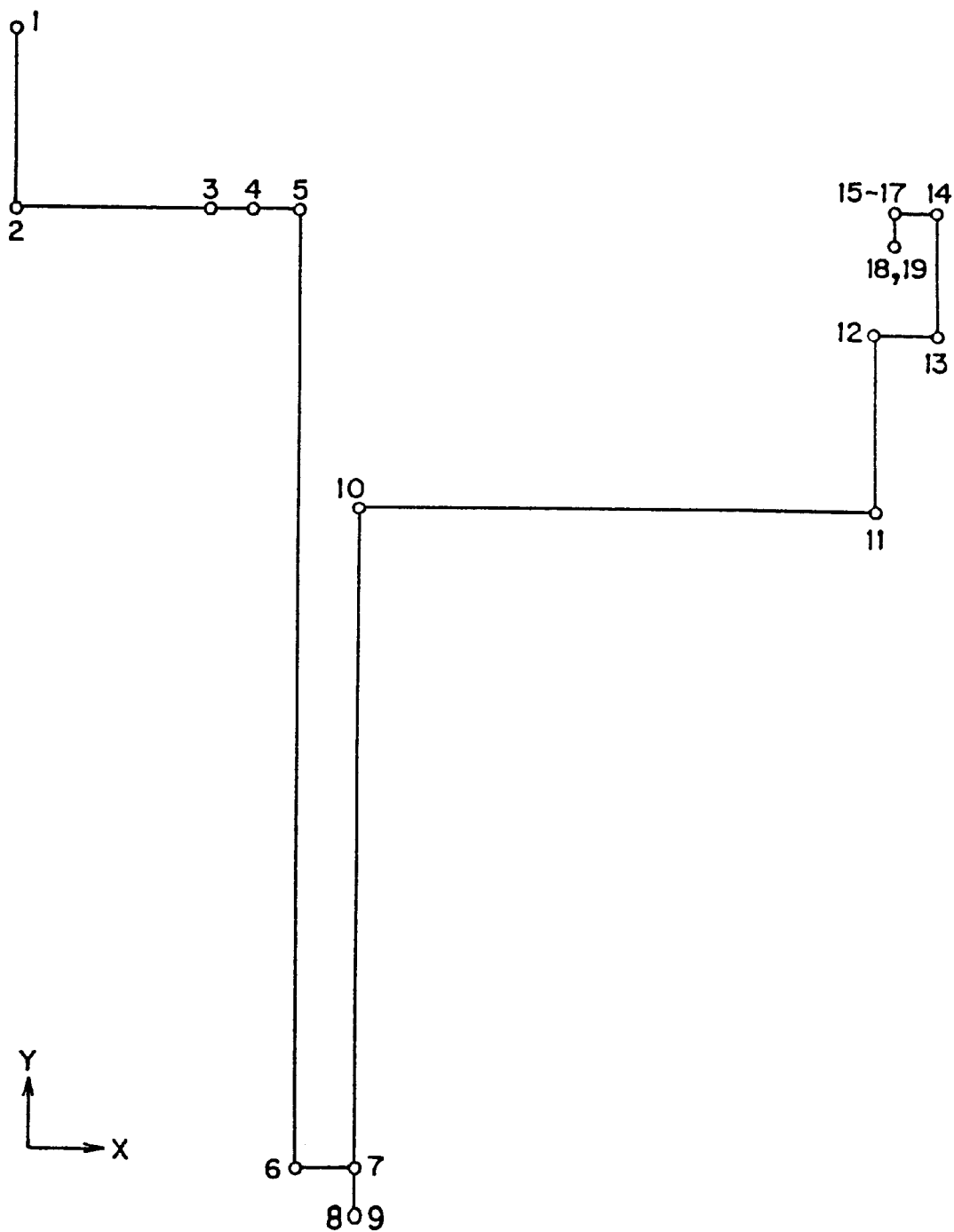
FIG. 24 shows an example of a display of a circuit that is an object of a design whose density locally differs.
Figure 25:
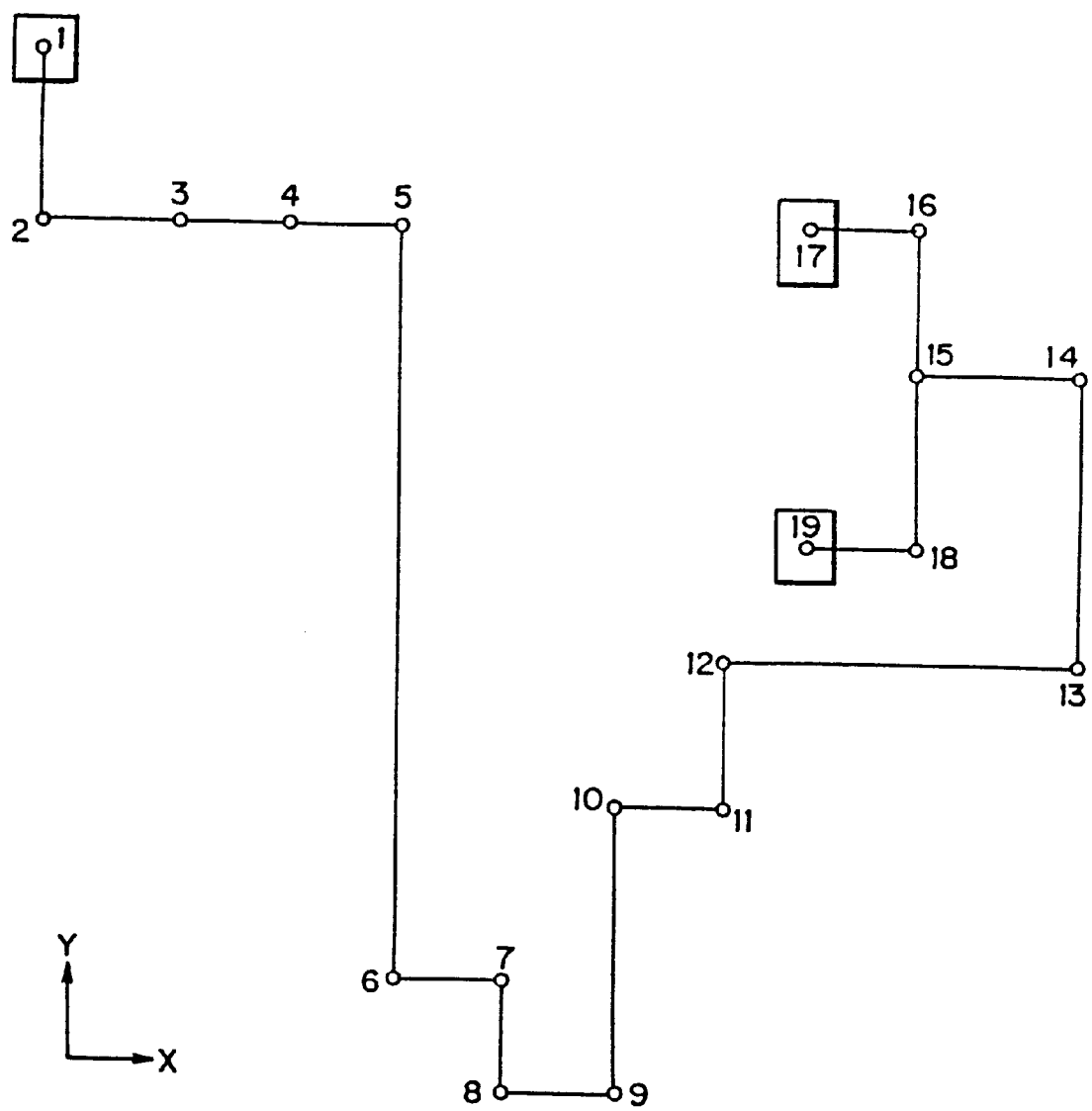
FIG. 25 shows an example of a display of the circuit that is the object of the design after coordinate conversion by the order substitution according to the embodiment.

If steps of a circuit design (a condition of wiring between characteristic points such as pins or vias) are displayed, lines as shown in FIGS. 21 through 23 do not extend in arbitrary directions but extend in the main wiring direction and the sub wiring direction crossing at right angle, practical examples of which are shown in FIGS. 24 and 25. In FIGS. 24 and 25, "○" represents a characteristic point on a circuit such as a pin or a via, while a line connecting these points represents a net (a wiring) on the circuit.

In FIG. 24, each point is placed in a position proportional to coordinate values of a characteristic point and a line is displayed between these points. On the other hand, FIG. 25 shows a result of an application of the above-mentioned order substitution by the display control unit 12 to the characteristic points shown in FIG. 24 to convert their coordinates. In positional relations of the point numbers 7 through 9 and 15 through 19 which cannot be recognized in a condition shown in FIG. 24, a local density of the points is uniformed by the coordinate conversion as shown in FIG. 25 so that a figure in which an entire connection relationship can be recognized at a glance even without a display partially enlarged.

By displaying a figure after the coordinate conversion as shown in FIG. 23 or 25 on the display unit 11 separately from a display of normal coordinates as shown in FIG. 21 or 24, the designer can see at a glance a condition of wiring connections of nets within a limited displaying region, and readily grasp the condition of the wiring connections of a circuit that is an object of the design from the display on the display unit 11. This contributes to simplification and improvement in efficiency of the circuit design.

Figure 26A:
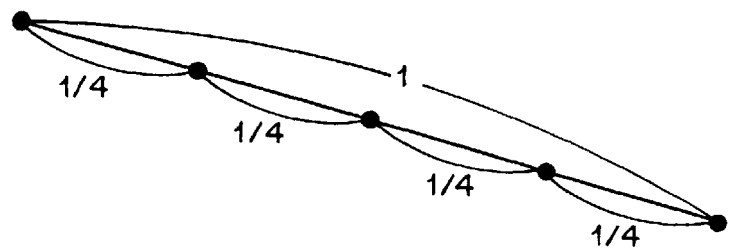
FIGS. 26(a) and 26(b) show examples in which characteristic points are taken out from a wire and a pin, respectively.
Figure 26B:
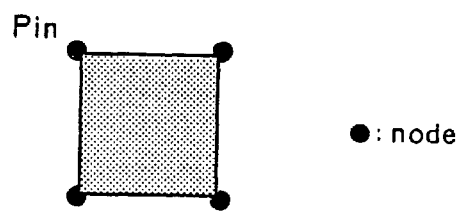

In a coordinate conversion by the order substitution as above, it is possible to take out points at both ends of a wire connecting pins of each cell, internally dividing points (for example, the one-fourth, middle and three-fourth internally dividing points as shown in FIG. 28) on the wire as shown in FIG. 26(a) and four vertexes of a rectangular figure displaying a pin as shown in FIG. 26(b) along with pins and vias as characteristic points (nodes), convert the coordinates of each of these characteristic points with the order substitution.

Figure 27A:
FIGS. 27(a) through 27(c) show an example in which points at both ends of a wire and four vertexes of pin are taken out as characteristic points, and subjected to a coordinate conversion by the order substitution.
Figure 27B:
Figure 27C:
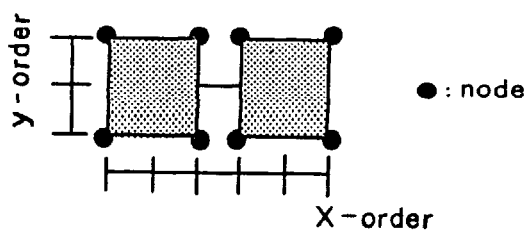

FIGS. 27(a) through 27(c) show an example where points at both ends of a wire and four vertexes of a rectangular figure representing a pin are taken out as characteristic points and the above conversion is done on them. FIG. 27(a) shows a display condition before the conversion, and FIG. 27(b) shows the characteristic points (nodes) taken out from the figure shown in FIG. 27(a). By doing the above conversion on the characteristic points taken out as shown in FIG. 27(b), the figure shown in FIG. 27(a) is displayed as shown in FIG. 27(c).

Figure 28A:
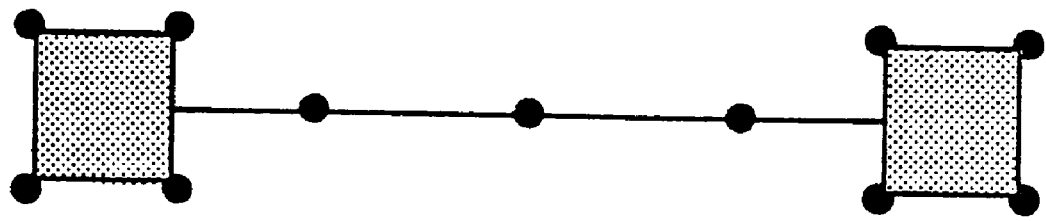
FIGS. 28(a) and 28(b) show an example in which points at both ends of a wire, internally dividing points of the wire and four vertexes of a pin are taken out as characteristic points, and subjected to a coordinate conversion by the order substitution.
Figure 28B:
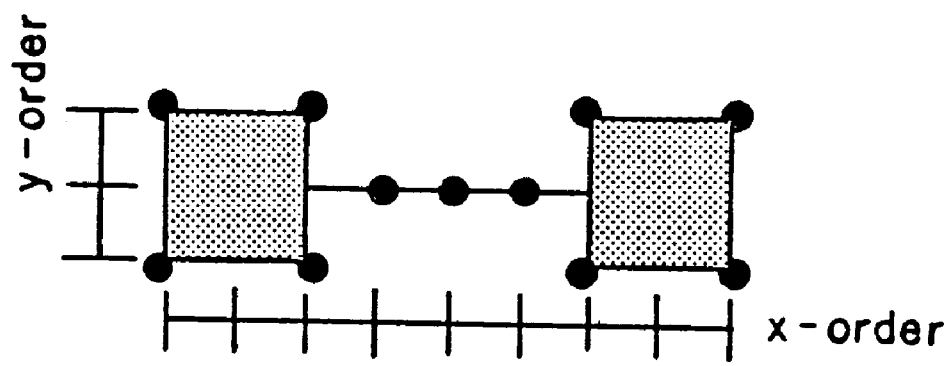

FIGS. 28(a) and 28(b) show an example where points at both ends of a wire, a one-fourth internally dividing point, a middle point, a three-fourth internally dividing point and four vertexes of a rectangular figure representing a pin are taken out as characteristic points, and the above conversion is done on them. FIG. 28(a) shows the characteristic points taken out from a figure similar to that in FIG. 27(a). By doing the above conversion on the characteristic points taken out as shown in FIG. 28(a), the figure shown in FIG. 28(a) is displayed as shown in FIG. 28(b).

Internally dividing points on a wire or four vertexes of a pin are taken out as characteristic points, converted and displayed as above so that the shortest length of a wire becomes larger than a rectangle of the pin to yield a figure display condition easier to recognize as shown in FIG. 28(b). This is helpful to grasp a condition of wiring connections.

If the wiring connection condition displayed on the display unit 11 extends over plural layers, the display control unit 12 adds an offset proportional to the order of layers to coordinate values after the above order substitution, and the display unit 11 displays the characteristic points, whereby the designer can readily grasp wiring lines overlapping through the layers on the display unit 11. FIG. 29 shows an example where an offset as above is added the figure shown in FIG. 25 and displayed. In the example shown in FIG. 29, an offset z is added at an angle of 45° to the X and Y axes to one of the two wiring layers in the case of a display extending over the two layers.

In FIGS. 21 through 25 and 29, a point number as an identifier used commonly before and after the substitution of coordinate values is set to each characteristic point. Normally, a wiring connection condition or the like is displayed on the displayed unit 11 in a condition where the identifier is attached to each characteristic point. The designer can thereby readily recognize correspondence between characteristic points obtained before and after the substitution. A common identifier is not always necessarily a number, but it is sufficient that the same symbol is given and displayed.

A displaying technique by the above coordinate substitution is applicable to a display for displaying a figure (the display unit 11), or a print on a paper or the like (print-out by the printing unit 19). This technique can provide the same advantage in either case.

(d) Description of a wiring process according to this embodiment

According to this embodiment, when the layout design unit 15 proceeds to a wiring process by the wiring unit 32 from a condition where the placing unit 31 completes a placement in mounting of cells, the wiring route estimating unit 33 virtually wires the cells to estimate a wiring route without a practical wiring. As a technique for estimation by the wiring route estimating unit 33, some known techniques can be used to perform a schematic wiring to determine a wiring on meshes, or make a Steiner tree between the cells.

On the basis of a result of estimation by the wiring route estimating unit 33, the congestion degree computing unit 34 computes and specifies a degree of local congestion on a circuit that is an object of the design. The congestion degree computing unit 34 divides the circuit that is an object of the design into plural grid-like (mesh-like) regions (for example, refer to FIG. 30; dividing into 5×6=30 regions in FIG. 30), and computes a degree of congestion of wirings on the circuit that is an object of the design as a rate Pi/Ai of the estimated number of used channels Pi based on the result of the estimation by the wiring route estimating unit 33 to the number of usable channels Ai within each grid for each of the regions. If plural wiring layers exist, the maximum value of the rate Pi/Ai of each wiring layer is determined as a degree of congestion of that region.

The congestion degree computing unit 34 ranks the grid (mesh) regions on the basis of a magnitude of a congestion degree computed as above, and makes a congestion degree map in which numbers 1 through 30 are given in the order of magnitude of congestion degree to the respective regions as shown in FIG. 30, for example. The wiring unit 32 automatically determines an order of wiring (a rank of priority) on the basis of the numbers of the congestion degree map as follows. Namely, the wiring unit 32 gives a higher priority of wiring to a net having pins existing in a region attached a small number (i.e., a region having a higher degree of congestion). Incidentally, if plural pins exist within the same region, a net having pins of a larger number is given a higher priority.

In terms of a rate of roundabout, if a wiring region is blocked by a mesh region having a high degree of congestion as shown in FIG. 31(a), the wiring unit 32 automatically determines a rate of roundabout at which the wiring can go around that mesh region. Incidentally, regions attached the rank of congestion of 2, 3, 4 and 5 in FIGS. 31(a) and 31(b) are mesh regions having higher degree of congestion mentioned above (a region having a degree of congestion Pi/Ai above 80%, for example).

As a rate of roundabout, a value of about 5% is set in advance. In this embodiment, the routability judging unit 35 judges a routability at a rate of roundabout set in advance on the basis of the congestion degree map shown in FIG. 30 obtained from a result of estimation by the wiring route estimating unit 33. If the routability judging unit 33 judges that it is impossible to go around a mesh region having a high degree of congestion at the present rate of roundabout so that the wiring is unfeasible, the wiring unit 32 automatically determines a rate of roundabout at which the wiring can go around the mesh region having a high degree of congestion on the basis of information such as the congestion degree map.

By determining a rate of roundabout as above, a wiring region in which a wiring cannot go around the mesh region having a higher degree of congestion as shown, for example, in FIG. 31(a) is expanded as indicated by a broken line as shown in FIG. 31(b), whereby the wiring becomes feasible by going around the mesh region having the high degree of congestion. Incidentally, "◯" shows a position of a pin or a via that should be wired in FIGS. 31(a) and 31(b).

If a wiring by the wiring unit 32 extends over plural layers, the wiring route estimating unit 33 estimates a wiring route on each wiring layer, and the congestion degree computing unit 34 makes a congestion degree map similar to that having been described above on the basis of a result of estimation for each wiring layer by the wiring route estimating unit 33. The wiring unit 32 sets a higher priority of the wiring order to a net having a high degree of necessity of using a channel whose degree of congestion is assumed to be high on the basis of the congestion degree map for each wiring layer from the congestion degree computing unit 34, then an actual wiring is conducted according to that priority.

Figure 32A:
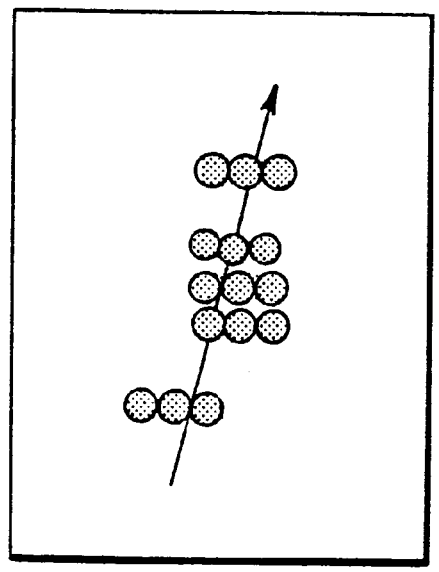
FIGS. 32(a) and 32(b) illustrate a wiring priority according to a degree of congestion of each wiring layer.
Figure 32B:
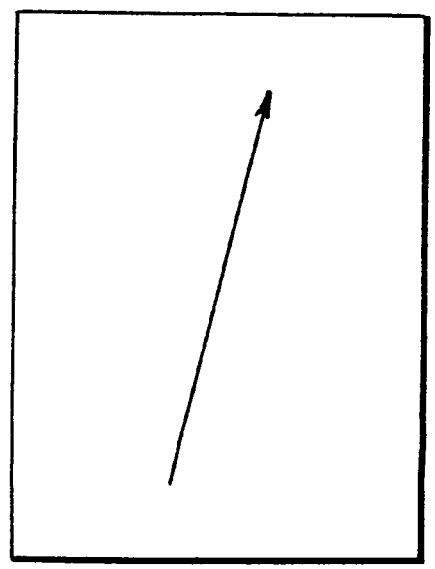

For instance, assuming that there are two layers of a wiring layer whose main wiring direction is a vertical direction (a vertical main wiring layer) as shown in FIG. 32(a) and a wiring layer whose main wiring direction is a horizontal direction (a horizontal main wiring layer) as shown in FIG. 32(b). If a degree of congestion of the vertical main wiring layer is higher than that of the horizontal main wiring layer as shown in FIGS. 32(a) and 32(b), the order of wiring of a net having a longer length in the vertical direction [refer to arrows in FIGS. 32(a) and 32(b)] is set higher by virtue of a function of the wiring unit 32 of this embodiment. Namely, a net which needs to pass through a congested part by all means is given a higher priority in the wiring and actually wired in an early stage by the wiring unit 32. In FIG. 32(a), a crosshatched dot represents a mesh region having a higher degree of congestion.

In this embodiment, a condition of wiring is estimated before an actual wiring so that an efficient actual wiring is feasible, as above. In addition, a routable rate of roundabout is automatically determined to reduce parts in which a wiring is unfeasible as many as possible, whereby a wiring efficiency can be largely improved.

If a wiring by the wiring unit 32 extends over plural layers and plural wiring layers having the same main wiring direction exist, wiring lengths different from wiring layer to wiring layer having the same main wiring direction are set in advance, according to this embodiment. The wiring unit 32 conducts an actual wiring on a wiring layer selected among wiring layers according to a wiring direction and a wiring length. For instance, if there are two wiring layers having the same main wiring direction, the wiring unit 32 allots the layers such that a short net is wired preferentially on one wiring layer, while a long net is wired preferentially on another wiring layer.

Figure 33:
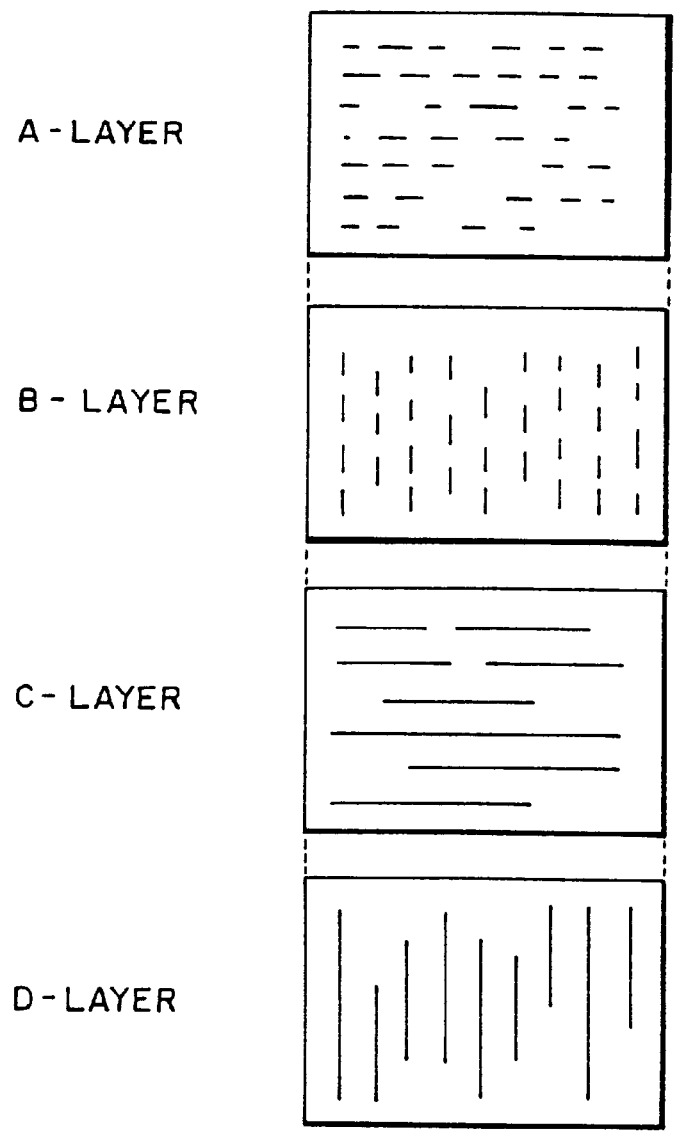
FIG. 33 shows an example of a wiring technique according to the embodiment.

A more practical example is shown in FIG. 33. As shown in FIG. 33, if there are four wiring layers in total, which are A layer, B layer, C layer and D layer. The A and C layers are horizontal main wiring layers, while the B and D layers are vertical main wiring layers. Here, a rule is made that the A and B layers are layers on which a wiring in short section nets should take a preference while the C and D layers are layers on which a wiring in long section nets should take a preference.

If a number of short wirings scatter within a wiring layer, a long wiring cannot be wired as a continuous long wire, resulting in small pieces. According to this embodiment, the wiring unit 32 conducts an actual wiring according to the above rule. As a result, a short distance wiring is conducted preferentially on the A and B layers, and a long distance wiring is conducted preferentially on the C and D layers, as shown in FIG. 33. Accordingly, it becomes possible to use effectively each wiring layer and improve a wiring efficiency.

A wiring as shown in FIG. 33 can be practically realized by controlling a wiring cost. If a wiring cost is designated as "COST (wiring layer)" when the wiring is conducted on each wiring layer, it is sufficient to so set a wiring cost for each wiring layer as to be COST(A)<COST(C), and COST(B)<COST(D) in the case where a net having a small extent is wired. For example, COST(A)=COST(B)=10/grid, and COST(C)=COST(D)=100/grid.

In the case of a wiring of a net having a large extent, a wiring cost of each wiring layer is so set as to be COST(A)>COST(C), and COST(B)>COST(D), conversely. For example, COST(A)=COST(B)=100/grid, and COST(C)=COST(D)=10/grid.

As having been described an example with reference to FIGS. 30 through 32 where a wiring order and a rate of roundabout are automatically determined on the basis of a congestion degree map, it is possible that the wiring unit 32 sets a wiring order and a rate of roundabout according to a critical degree to a delay of a net that is an object of a wiring.

Here, a critical degree is a degree of a wiring margin to a delay value set in advance. In practice, a condition of a high critical degree is that, if a limit value 10 ns of a delay is set as a wiring design condition from a certain pin to a certain pin, a wiring meeting that condition is possible but the wiring should be in a shortest distance between the pins, and if the wiring deviates only a little, the wiring comes to exceed 10 ns that is the limit value of a delay. In contrary, a condition of a low critical degree is a state where a wiring is possible with a margin of a delay value of, for example, about 5 ns, which leaves a margin up to the limit value of 10 ns.

The wiring unit 32 then classifies a net that is an object of the wiring according to a critical degree to a delay, and sets a wiring order and a rate of roundabout to the net that is an object of the wiring. A classification of a critical degree of a net that is an object of the wiring is conducted in, for example, the following techniques (1) and (2).

(1) Classifying according to a signal of a net on the basis of logic information. As a signal of a net, there are, for example, a clock signal, a general signal (a signal of a data system), a signal of a test system, etc. It is possible to classify these signals such that a clock signal has the highest critical degree, a general signal is the next, and a signal of a test system is the last.

(2) Classify according to a critical degree of a critical path in a net.

With the above classification, the wiring unit 32 wires a path having a higher critical degree preferentially. The wiring unit 32 sets a small rate of roundabout to a net having a high critical degree, and the maximum tolerable rate of roundabout to a net having a low critical degree. Whereby, a net having a high critical degree is given a high priority in an actual wiring so as to be wired in a condition where a wiring delay is decreased as much as possible besides a rate of roundabout is held low.

If a net that is an object of the wiring is classified according to a magnitude of a critical degree, a net having a high critical degree should be wired at a small wiring delay as much as possible. In order to hold the wiring delay to a small value, it is necessary to not only shorten in wiring length but also decrease the number of nets wired in adjacent to that net as much as possible to decrease a wiring parasitic capacitance. For instance, if there is a part in which another net is wired in adjacent to a remarked net as shown in FIG. 34, a wiring parasitic capacitance builds up in that part so that a wiring delay increases because of that capacitance.

By virtue of a function of the wiring unit 32 of this embodiment, a wiring tolerable degree of another net that will be, after, wired adjacent to a net that is an object of the wiring (a remarked net) is set according to a critical degree, and another net is actually wired according to the wiring tolerable degree after an actual wiring of the remarked net so that a degree of adjacency of another net to the remarked net can be controlled.

Figure 34:
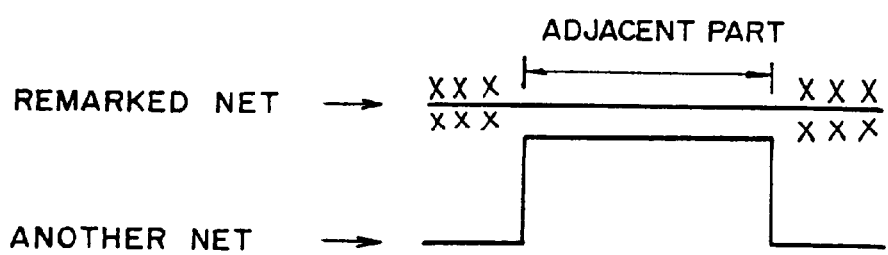
FIG. 34 shows an example of setting a wiring forbidden data according to the embodiment.

In practice, after a remarked net having a high critical degree has been wired, a wiring forbidden data is set to an appropriate section on both sides of a wiring of the remarked net from a receiver side according to an adjacency tolerable degree (for example, data "X" set to each grid as shown in FIG. 34), and the wiring is so controlled that a net, which will be wired after, does not pass through a part to which the wiring forbidden data is set. As this, it is possible to prevent, with certainty, a wiring parasitic capacitance from building up to a net having a high critical degree and a wiring delay from increasing.

(e) Description of a technique to cope with occurrence of placement error according to this embodiment As having been described hereinbefore, cells all have had the same shape and same size. Once a position in which a cell is placed is determined, no placement error such as overlapping or the like occurs. In recent years, there is a case where cells having different sizes are placed on the same circuit by virtue of a change in LSI technology, causing occurrence of a placement error such as overlapping or the like.

According to this embodiment, the placement check unit 36 checks as to whether there is a cell causing a placement error or not after placement of each cell by the placing unit 31. As check items by the placement check unit 36, there are overlapping of cells, placement of a cell within a forbidden region such as a reserve region, etc.

Figures 35A, 35B:
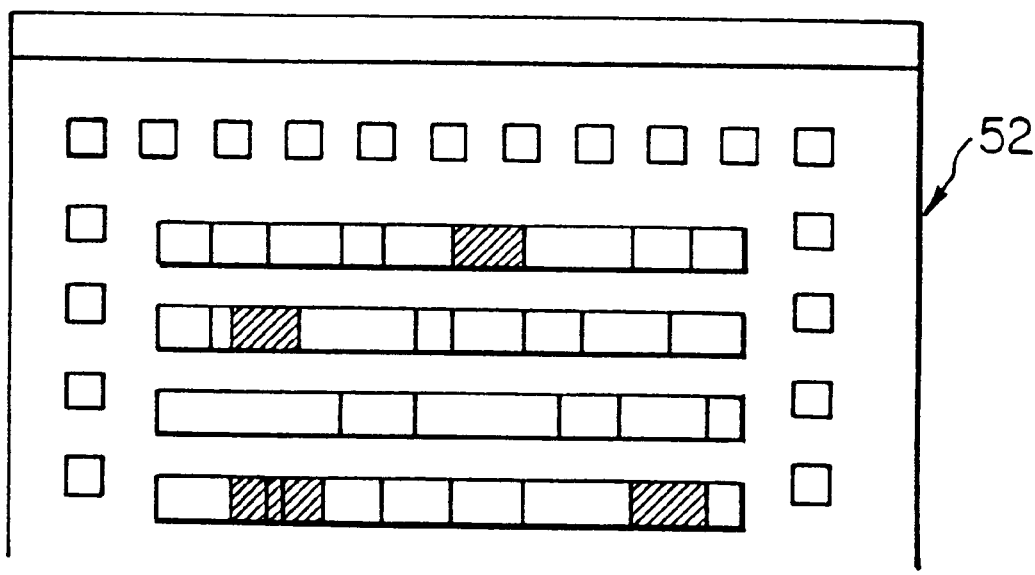
FIGS. 35(a) and 35(b) show examples of displays if an error cell list and a placement map, respectively, according to the embodiment.

If the placement check unit 36 judges that there is a cell causing a placement error, a list of cells causing placement errors is displayed on the displayed unit 11 as an error cell list 51 as shown in, for example, FIG. 35(a).

By switching a mode according to an instruction through the input unit 13, cells [parts indicated by slanted lines in FIG. 35(b)] causing errors are automatically emphasized in a display of a placement map 52 as shown in, for example, in FIG. 35(b). At this time, error cells are displayed in different colors according to the check item (overlapping, placement in a forbidden region, etc.).

Further, the error cell list 51 and the placement map 52 are simultaneously displayed in different window screens on the same display unit 11. By hitting a cell name retrieved on the error cell list 51 through a mouse (the input unit 13), it is possible to emphatically display only a specific error cell on the placement map 52.

Displays of the error cell list 51 or the placement map 52 is helpful for the designer to immediately recognize occurrence of a placement error, or confirm the specific error cell or contents of the error on the placement map 52 so that it becomes possible to readily and certainly avoid a placement error by a re-placing process.

(f) Description of a re-wiring process and a re-placing process according to this embodiment A re-wiring process and a re-placing process by the layout design unit 15 (the placing unit 31 and the wiring unit 32, respectively) of this embodiment will be next described with reference to FIGS. 36 and 37.

According to a function of the layout design unit 15 (the wiring unit 32) of this embodiment, there are two techniques to re-wire a net having been already wired by adding a designated wiring length. One is a technique for a wide area in which a designated wiring length is added to an entire net having been already wired to conduct a re-wiring. The other is a technique for a local area in which a designated wiring length is added to a region instructed on the net to conduct a re-wiring.

Figure 36A:
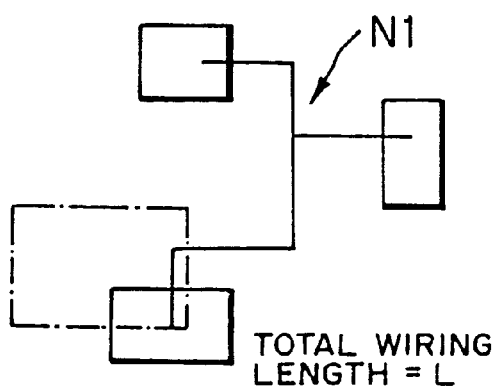
FIGS. 36(a) and 36(b) are diagrams for illustrating a wide area re-wiring process according to the embodiment.
Figure 36B:
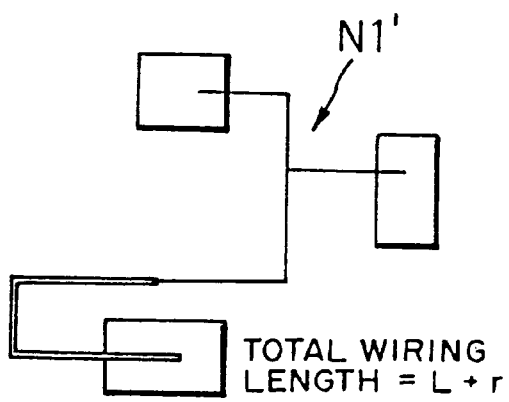

First, the former technique for a wide area will be described with reference to FIGS. 36(a) and 36(b). When an instruction to add a designated wiring length r to a net N1 (a total wiring length=L) that has been already wired as shown in FIG. 36(a) to re-wire the net N1 is input, a congestion degree map similar to that shown in FIG. 30 is made by the congestion degree computing unit 34 on the basis of a result of an actual wiring, and a region having a low congestion degree [a rectangular region surrounded by a dot-dash line in FIG. 38(a), for example] within an entire wiring region of the net N1 is selected by referring to the congestion map.

The wiring unit 32 conducts a designated wiring length wiring adding a designated wiring length r on the net N1 having been wired within the selected region. A re-wiring program executed at this time is an automatic wiring program. A part indicated by a double line shown in FIG. 36(b) is added the designated wiring length r and re-wired, whereby a net N1' of a total wiring length =L+r is obtained.

Figure 37A:
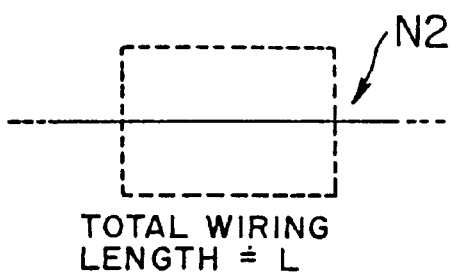
FIGS. 37(a) and 37(b) are diagrams for illustrating a local area re-wiring process according to the embodiment.
Figure 37B:
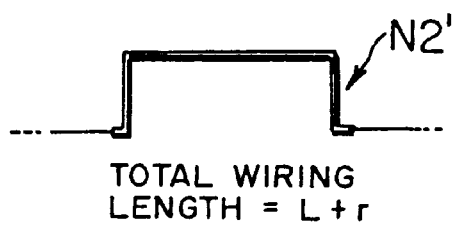

The later technique for a local area will be next described with reference to FIGS. 37(a) and 37(b). According to the technique for a local area, when a re-wiring is conducted adding a designated wiring length r to a net N2 that has been already wired, as shown in FIG. 37(a), information about in which region including the net N2 the re-wiring should be conducted is inputted along with an instruction of the re-wiring through the input unit 13. In an example shown in FIG. 37(a), a rectangular region surrounded by a broken line is designated as a region for the re-wiring, for example.

The wiring unit 32 conducts a designated length wiring adding a designated wiring length r on the net N2 having been wired within the instructed region. A re-wiring program executed at this time is also an automatic wiring program. A part indicated by a double line shown in FIG. 37(b) is added the designated wiring length r and re-wired, whereby a net N2' of a total wiring length=L+r is obtained.

As above, in either of re-wiring techniques, it is possible to automatically conduct a re-wiring where a designated wiring length r is added on the net N1 or the net N2 which has been already wired in response to an instruction through the input unit 13, thereby simplifying a re-wiring process and largely reducing a burden on the designer.

By virtue of a function of the layout design unit 15 (the placing unit 31 and the wiring unit 32) of this embodiment, a re-placing process to alter a placed position of a cell which has been already placed is performed according to a flowchart (Steps S1 through S8) shown in FIG. 38. In an example of this embodiment, if a net linked to a cell whose placement is altered has been already wired, a wiring between the net and the cell whose placement is altered is automatically conducted according to a re-wiring program after the alteration of placement of the cell by the placing unit 32.

An operation of the process will be now described with reference to the flowchart shown in FIG. 38. If a placing position of a cell having been already placed is altered, a process shown in FIG. 38 is initiated. First, whether a position of the cell after the placement alteration is the same as before or not is judged (Step S1). If the same (in the case of a YES judgement), there is no need to conduct a re-wiring process or the like, particularly, so the process is terminated at that point (Step S2).

If it is judged that a position of the cell after the placement alteration is different from before at Step S1 (in the case of a NO judgement), all nets linked to that cell are searched (Step S3). It is then judged as to whether any wire or via exists in each net (Step S4). If a wire or a via exists, net information is collected in a table (Step S5).

The wiring unit 32 refers to the table collected at Step S5 (Step S6), deletes a wiring which has been already wired (Step S7), and executes an automatic wiring between the cell after the placement alteration and all nets linked to that cell (Step S8).

According to this embodiment, it is possible to set a mode to so designate that the process having been described with reference to FIG. 38 is not performed constantly. By switching the mode according to an instruction through the input unit 13, it is possible to set an execution/non-execution of the re-wiring process resulted from a re-placing process, according to this embodiment.

If there is a wired net linked to a cell which is replaced, a re-wiring between the cell after the replacement and a wired net is automatically conducted. It is therefore unnecessary to conduct a re-wiring process after re-placement by the designer so that a replacing process can be simplified and a burden on the designer can be largely reduced.

(g) Description of multi-window display according to this embodiment

Next, description will be made of a multi-window display function according to this embodiment with reference to FIGS. 39 and 40.

In a general system of an interactive type operating placement or wiring of cells which is used with a display unit on which an exclusive placement map is displayed, it is possible to simultaneously display plural placement maps (so called a multi-window displaying function).

The display control unit 12 of this embodiment has such multi-window displaying function. Placement information or wiring information of cells exists as a space in the system. At the same time, figure information based on the placement information or the wiring information is made exist as a space (figure information space) and plural placement maps are linked to the figure information space, thereby realizing the multi-window displaying function for the placement maps.

According to a function of the display control unit 12 of this embodiment, when the layout design unit 15 (the placing unit 31 or the wiring unit 32) conducts a placing process or a wiring process on at least one placement map among plural placement maps in response to an instruction through the input unit 13 in a condition where the plural placement maps are displayed on the display unit 11 as above, the display control unit 12 displays a result of that process in association even on another placement map displaying a part that is an object of that process.

Figure 39:
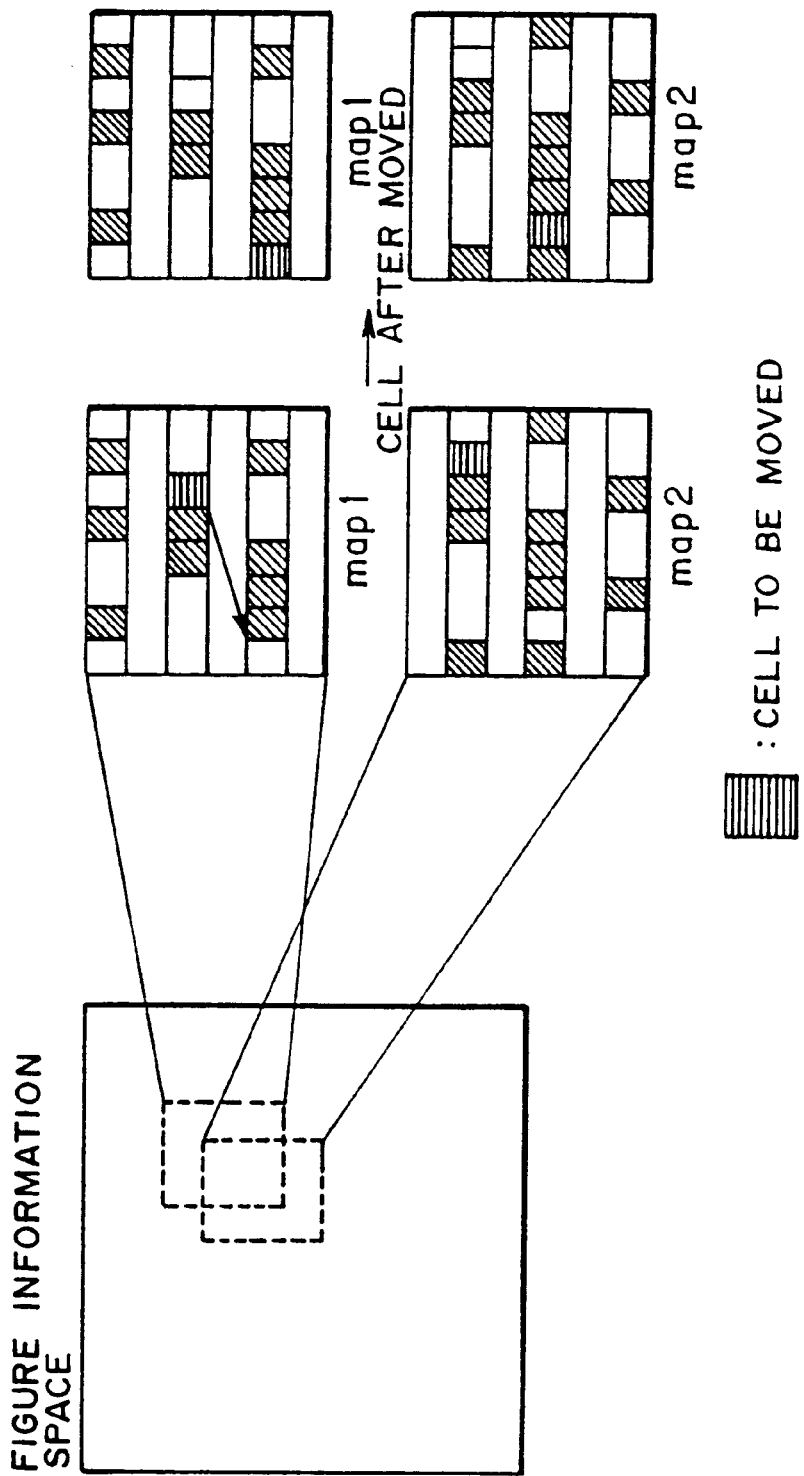
FIGS. 39 and 40 are diagrams both for illustrating a multi-window display function according to the embodiment.
Figure 40:
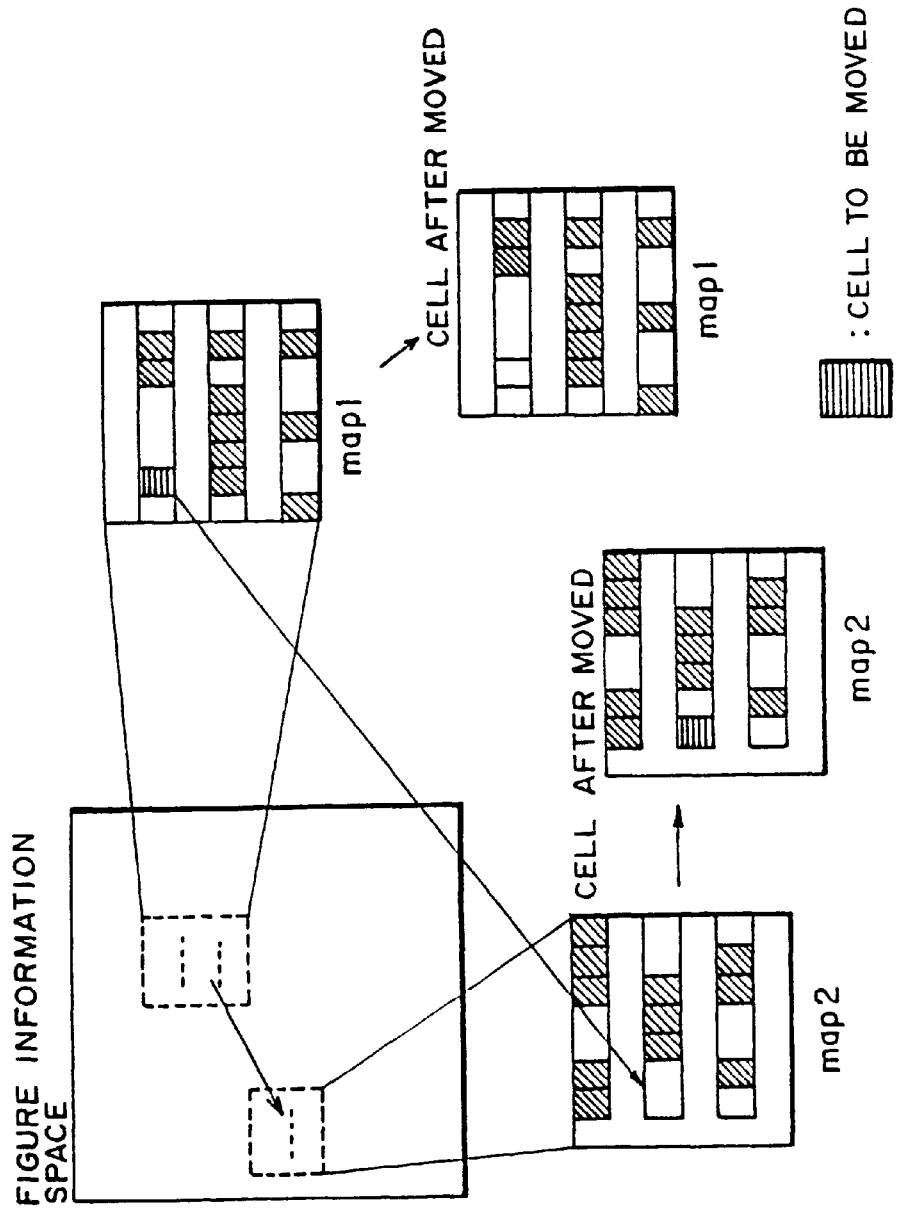

Description will be now made more specifically with reference to FIGS. 39 and 40. For instance, if two placement maps map1 and map2 have an overlapping part as shown in FIG. 39, when a cell is moved within the placement map map1, the cell that is an object of the movement follows and is moved to a corresponding position to be simultaneously displayed even on another placement map map2 on which the cell that is an object of the movement is displayed.

If a cell is moved from an end to another end of an LSI, it is possible that these two placement maps map1 and map2 are associated with each other in a condition where a movement originating region of the cell and a movement destination region of the cell are displayed on these two placement maps map1 and map2, respectively, as shown in FIG. 40, and the cell on the placement map map1 is moved to a predetermined position on the placement map map2, for example.

According to this embodiment, if a placing process or a wiring process is conducted on one placement map in a condition where the placement maps are displayed in multi-windows, it is possible to display that process in association with another placement map. In addition, a placing process or a wiring process is feasible using plural placement maps simultaneously. It is therefore possible to realize not only a multi-window display without causing a confusion of the designer, but also an efficient circuit design utilizing the multi-window display.

(h) Description of a temporary terminal position determining technique in hierarchical layout design according to this embodiment Next description will be made of a temporary terminal position determining technique (h1) through (h5) in a hierarchical layout design according to this embodiment with reference to FIGS. 41 through 46.

(h1) In a first temporary terminal position determining technique, a function of the above-mentioned placing region setting unit 37 is used. More specifically, in a hierarchical layout design, the wiring unit 32 conducts a wiring process while placing a temporary terminal within a placing region set by the placing region setting unit 37 so that the temporary terminal can be automatically placed while respecting an intention of the designer.

A procedure to set a placing region by the placing region setting unit 37 will be next described with reference to a flowchart (Steps S11 through S17) shown in FIG. 41. A setting process according to the flowchart in FIG. 41 is performed by operating the input unit 13 by the designer for each temporary terminal if there is a region in which the designer wants to place an individual terminal.

When the placing region setting process is initiated, the designer selects a temporary terminal (Step S11). The designer then instructs a region (a rectangle) in which the selected terminal should be placed on the display unit 11 as shown in, for example, FIG. 42 (Step S12). In FIG. 42, LSG1 and LSG2 represent layout hierarchical blocks, respectively, divided on a circuit that is an object of the design.

After that, the designer judges whether another region is added or not (Step S13). If another region is added, the procedure returns to Step S12. If not, the designer selects whether the temporary terminal is placed on a boundary of the block LSG1 within the region instructed at Step S12 or the terminal is placed in any place within the region (Step S14).

If plural wiring layers exist, the designer selects a using layer on which the temporary terminal should be placed (Step S15). Here, the temporary terminal is placed on a specific layer selected at Step S15. It is, however, possible to place the temporary terminal on a layer automatically selected.

After that, the designer judges whether another layer is added or not (Step S16). If another layer is added, the procedure returns to Step S15. If not, the designer adds region information set in the above procedure to the temporary terminal (Step S17), and terminates the placing region setting process.

The designer conducts a process to select a temporary terminal, a process to select a region in which the designer wants to place the temporary terminal, and a process to select a layer on which the designer wants to place the temporary terminal, as above. The temporary terminal is selected in a group of temporary terminals included in that block LSG1. A region in which the temporary terminal is desired to be placed is instructed by a region surrounded by one or more rectangles (refer to FIG. 42). Further, it is possible to select whether only on a boundary of the block LSG1 is used or within the region is used. A layer on which the designer wants to place the temporary terminal is selected among layers forming an integrated circuit. It is possible to select one or more layers. If plural layers are selected, a priority is given to each layer in the order selected. Selections of coordinates in the region at which the temporary terminal is placed and a using layer at that time are automatically conducted in the post-treatment.

(h2) In a second temporary terminal position determining technique, functions of the placing region setting unit 37 and the grouping unit 38 mentioned hereinbefore are used. More specifically, in a hierarchical layout design, a placing region set by the placing region setting unit 37 is set to a group of temporary terminals entered by the grouping unit 38. The wiring process is conducted by the wiring unit 32 while placing temporary terminals belonging to that group in the placing region. Accordingly, it is possible to readily instruct to place plural temporary terminals for signals of the same type within the same placing region.

Figure 43:
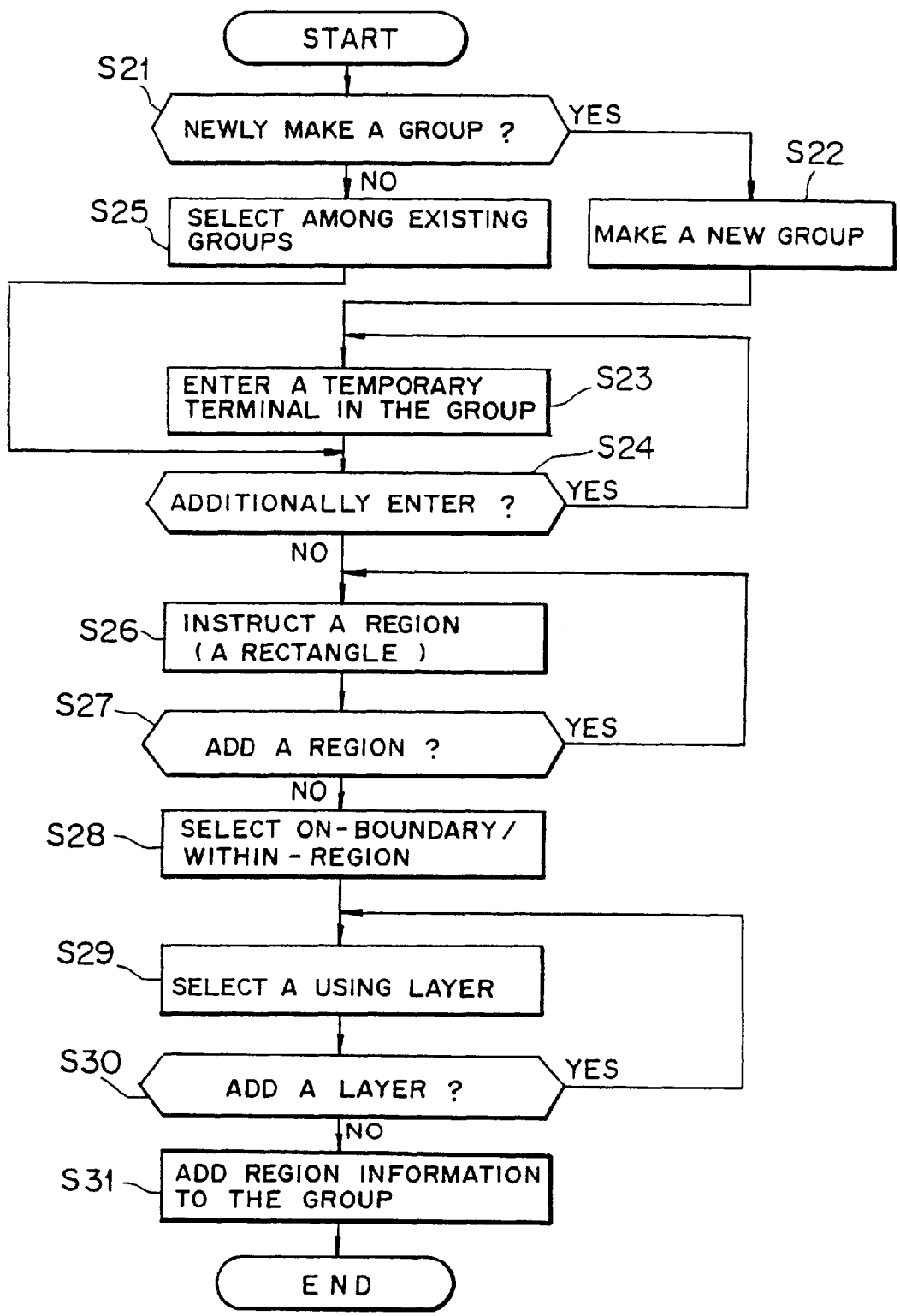
FIG. 43 is a flowchart for illustrating a procedure of a second temporary terminal position determining technique according to the embodiment.

A procedure to set a placing region by the placing region setting unit 37 and the grouping unit 38 will be next described with reference to a flowchart (Steps S21 through S31) shown in FIG. 43. The designer can gather nets (temporary terminals) connecting the blocks (LSGs) into one group or plural groups, and set a region in which the designer wants to place the group.

When the placing region setting process is initiated, the designer judges whether a group of temporary terminals is newly formed or not (Step S21). If a group is newly formed, the designer forms a new group (Step S22), then enters temporary terminals to that group by virtue of the function of the grouping unit 38 (Step S23). The designer then judges whether a temporary terminal is added and entered to that group or not (Step S24). If a temporary terminal is added and entered, the procedure returns to Step S23. If not, the procedure proceeds to the next Step S26.

At Step S21, if the designer judges that the group is not newly formed, the designer selects a desired group among existing groups (Step S25), and judges whether a temporary terminal is added and entered to that group or not (Step S24). If a temporary terminal is added and entered, the procedure proceeds to Step S23. If not, the procedure proceeds to the next Step S26.

Figure 41:
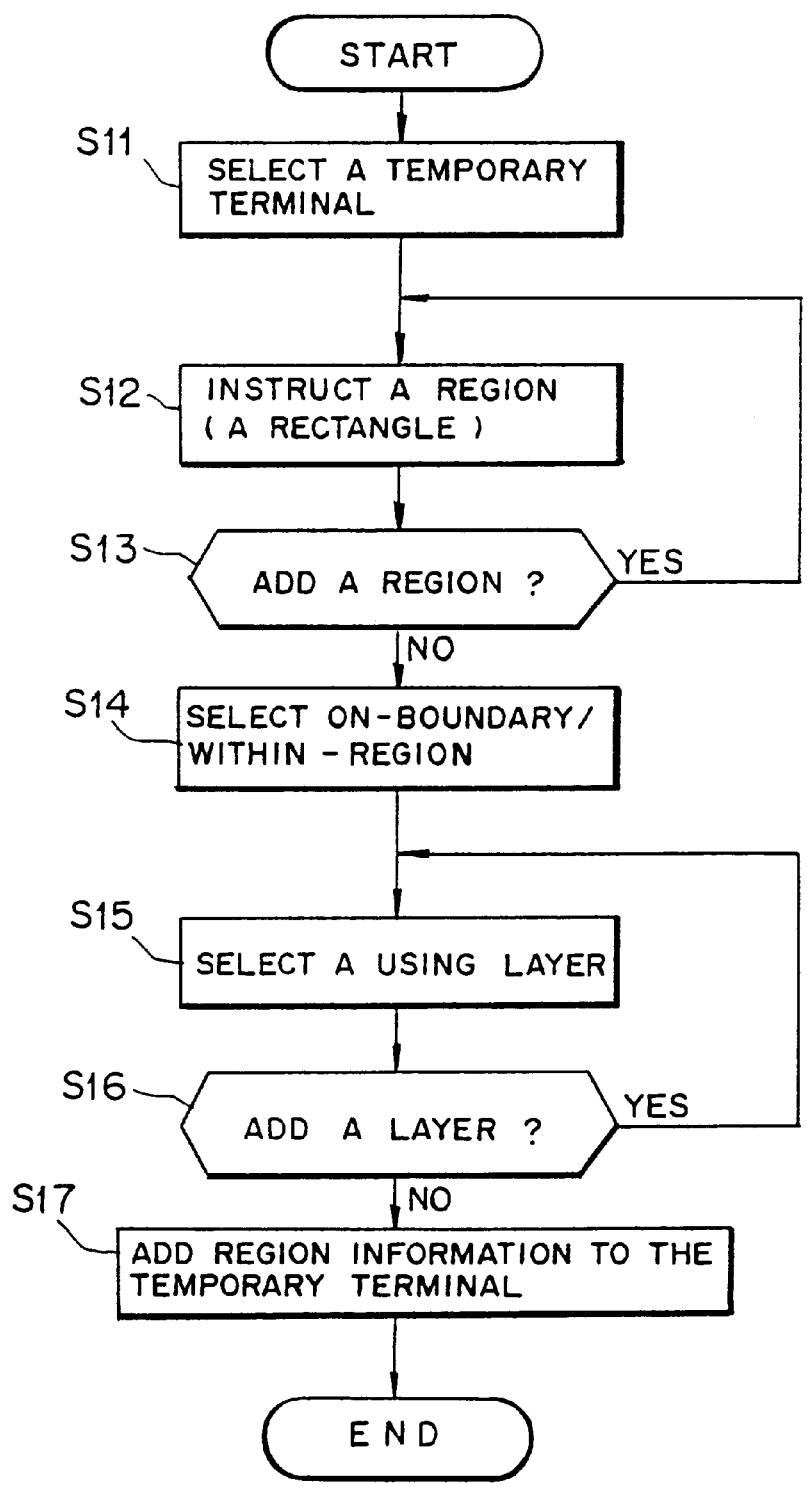
FIG. 41 is a flowchart for illustrating a procedure of a first temporary terminal position determining technique according to the embodiment.
Figure 42:
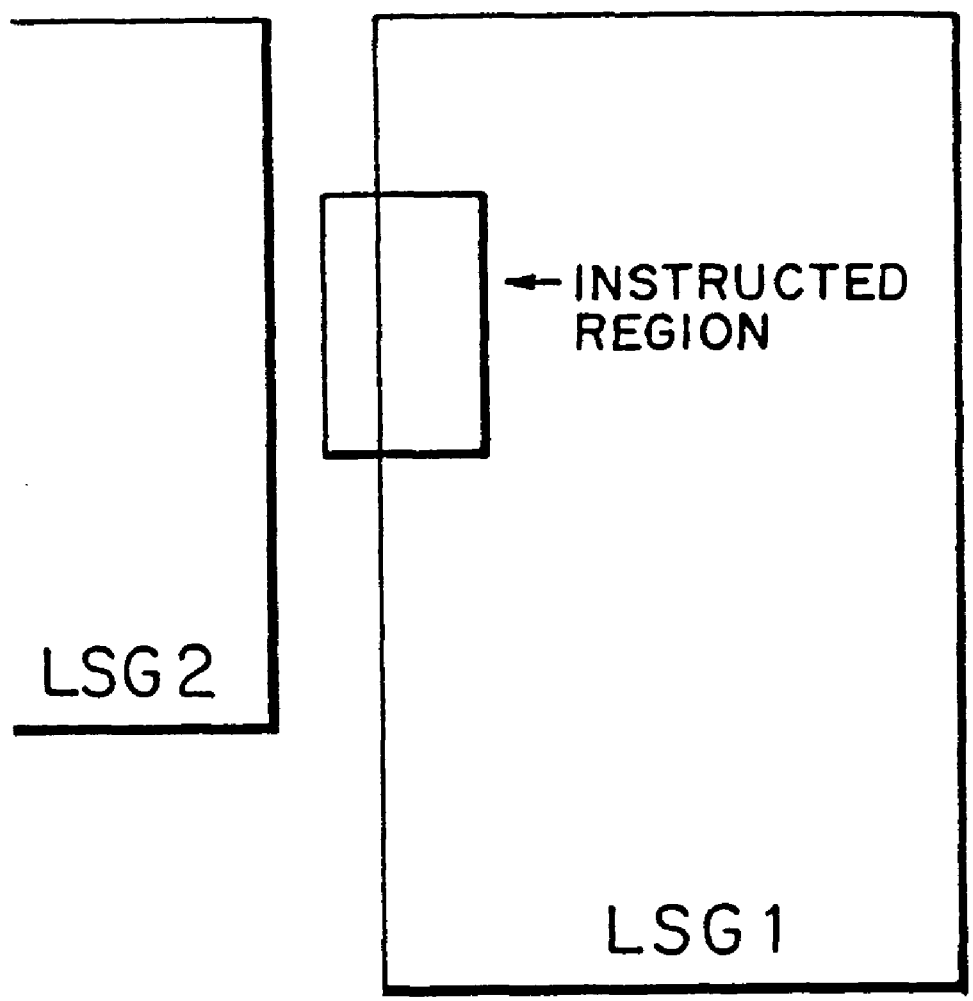
FIG. 42 shows an example of instructing a placing region according to the embodiment.

The process at Steps S26 through S30 is performed by virtue of the function of the placing region setting unit 37, which is quite the same as the process at Steps S12 through S16 in FIG. 41. A description of the procedure at Step S26 through S30 is therefore omitted here. When region information is set in the process at Steps S26 through S30, the designer adds that region information to the group that is an object of the region setting (Step S31), and terminates the placing region setting process.

The designer conducts a process to select and enter temporary terminals and make a group, a process to select a group of temporary terminals that should be placed, a process to select a region in which the designer wants to place the temporary terminals included in that group, and a process to select a layer on which the terminals included in the group are placed, as above. The temporary terminals selected and entered when a group is formed are selected in a group of temporary terminals included in that block. One temporary terminal cannot be simultaneously included in plural groups. However, it does not matter if there is a terminal not belonging any group. A region in which the designer wants to place a group of temporary terminals is instructed by a region surrounded by one or more rectangles. Further, it is possible to select whether only on a boundary of a block is used or inside of the region is used. A layer on which the designer wants to place a group of temporary terminals is selected among layers forming an integrated circuit. It is possible to select one or more layers. If plural layers are selected, a priority is given to each of the layers in the order selected. Selections of coordinates in a region at which a temporary terminal is placed and a layer used at that time are automatically conducted in the post-treatment.

(h3) In a third temporary terminal position determining technique, a function of the placement forbidden region setting unit 39 mentioned hereinbefore is used. Namely, in a hierarchical layout design, the wiring unit 32 conducts a wiring process while placing a temporary terminal in a region excepting a forbidden region set by the placement forbidden region setting unit 39. It is therefore possible to automatically place a temporary terminal while respecting an intention of the designer.

A procedure to set a forbidden region by the placement forbidden region setting unit 39 will be next described with reference to a flowchart (Steps S11 through S17) shown in FIG. 44. The designer can definitely set a place in which a temporary terminal should not be placed by designating a region (including a layer) in which a temporary terminal is forbidden to be placed.

When a forbidden region setting process is initiated, the designer instructs a forbidden region (a rectangle) on the display unit 11 (Step S41), judges whether another forbidden area is added or not (Step S42). If another forbidden area is added, the procedure returns to Step S41. If not, the designer selects a layer on which placement of a temporary terminal is forbidden within the designated forbidden area (Step S43).

After that, the designer judges as to whether another forbidden layer is added or not (Step S44). If another layer is added, the procedure return to Step S43. If not, the designer stores the forbidden region and the forbidden layer set in the above procedure (Step S45), and terminates the forbidden region setting process.

As above, the designer conducts a process to select a region in which placement of a temporary terminal of a block (LSG) is forbidden and a process to select a layer in the region on which placement of a temporary terminal is forbidden. A forbidden area is instructed by a region surrounded by one or more rectangles. Further, it is possible to select whether only on a boundary of the block is forbidden or inside the region is forbidden (this selecting process is not shown in FIG. 44). A forbidden layer is selected among layers composing an integrated circuit. It is possible to select one or more forbidden layers. Information of a placement forbidden area for a temporary terminal is referred in the post-treatment.

(h4) In a fourth temporary terminal position determining technique, a function of the placing position determining unit 40 mentioned hereinbefore is used. The wiring unit 32 conducts a wiring process between plural layout hierarchical blocks while placing a virtual block terminal in a placing position (on a block boundary) determined by the placing position determining unit 40.

The fourth temporary terminal position determining technique by the placing position determining unit 40 will be next described with reference to FIG. 45.

Figure 45:
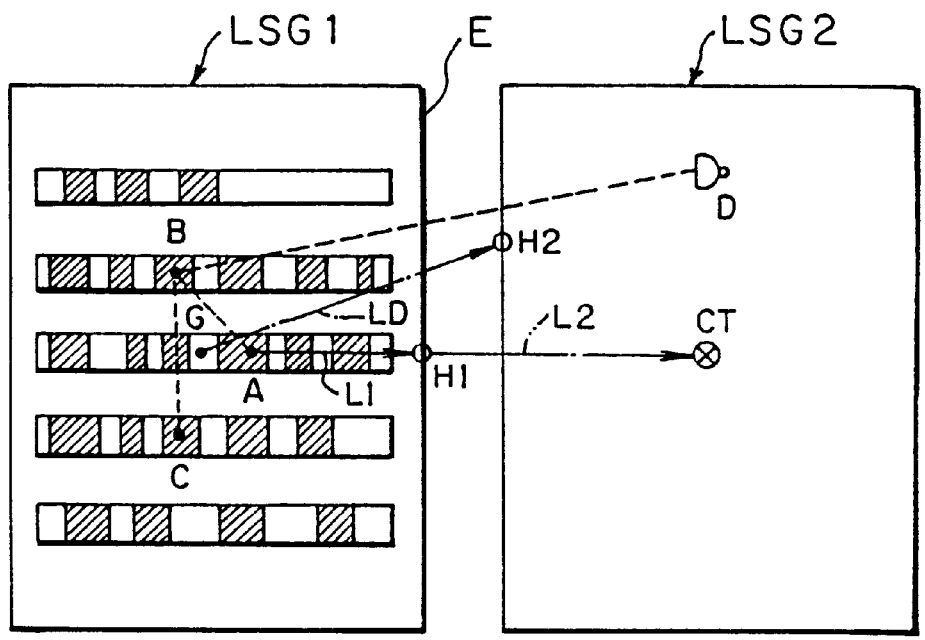
FIG. 45 is a diagram for illustrating a procedure of a fourth temporary terminal position determining technique according to the embodiment.
Figure 46:
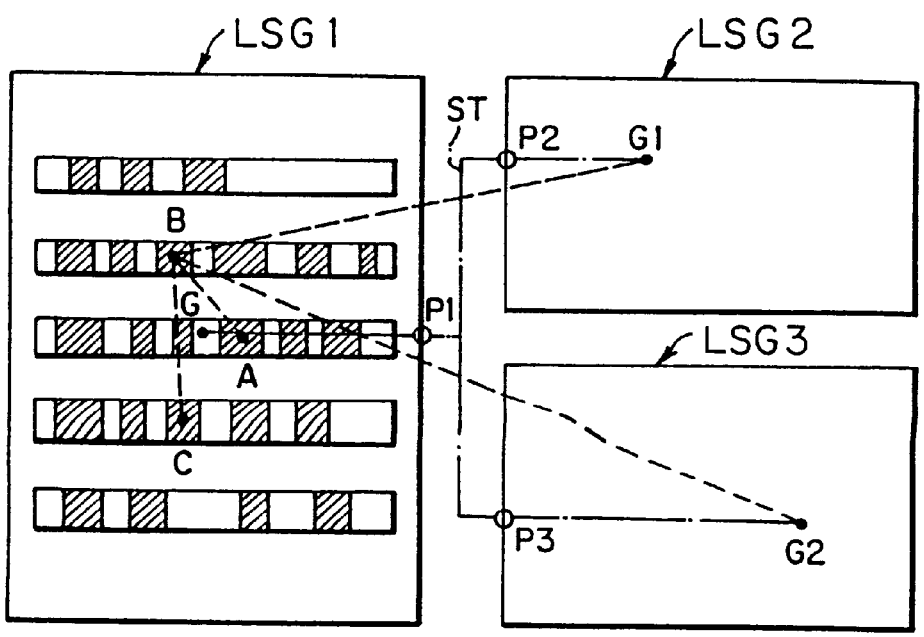
FIG. 46 is a diagram for illustrating a procedure of a fifth temporary terminal position determining technique according to the embodiment.

Here, if cell placement within the block LSG1 is completed (a part indicated by slanted lines represents a placement completed cell in FIG. 45), a placing position for a temporary terminal in the layout hierarchical block LSG1 is determined in consideration of placing coordinates of the cell.

First, in the block LSG1 in which a placing position of a temporary terminal should be determined, a center of gravity G of pin coordinates A, B and C of cells linked to a net connected to the temporary terminal is determined. Incidentally, a relation of connection of the cells is indicated by a broken lines in FIG. 45. In FIG. 45, D shows a position of a connection destination cell in the LSG2.

Then, a side E of the block LSG1 which a straight line extending from a position of the center of gravity G toward another layout hierarchical block LSG2 that should be connected to the temporary terminal crosses, is determined, and the temporary terminal is allocated on the side E.

At this time, as the straight line extending in a direction of another block LSG2, a straight line L0 extending toward a position of a temporary terminal H2 is used if the temporary terminal H2 to which a temporary terminal of the own block LSG1 should be connected has been already placed in the another block LSG2. If the temporary terminal H2 is not yet placed in another block LSG2, a straight line L2 extending toward a position of a center CT of another block LSG2 is used.

If three or more blocks are connected to the net, straight lines toward another block are considered to be vectors and the straight lines are composed, then a temporary terminal is allocated on a side E of the block LSG1 over which the composed vector crosses.

When a block side E in which the temporary terminal should be placed is determined as above, a cell terminal A closest to the block side E is determined, and a position H1 at which a straight line L1 extending from the coordinates of the terminal A in a vertical direction or a horizontal direction crosses the block side E is determined as a placing position of the temporary terminal.

If a preferential wiring direction is determined in the wiring, a wiring layer each side of which a temporary terminal is placed on is selected. If the placing position H1 determined as above is already used for another terminal placement, a region which is not yet used and is adjacent to the placing position of another terminal is searched on the same side and a placing position for a temporary terminal is so determined as to keep a shortest distance between terminals determined by the designer.

As above, it is possible to automatically determine a position for a temporary terminal to place it while respecting an intention of the designer and taking placement or wiring of cells within the layout hierarchical block LSG1 into consideration.

(h5) A fifth temporary terminal position determining technique also uses a function of the above placing position determining unit 40. The fifth temporary terminal position determining technique by the placing position determining unit 40 will be now described with reference to FIG. 46. Here, if cell placement in blocks LSG1 through LSG3 connected with each other is completed (parts indicated by slanted lines are respective placement completed cells in FIG. 46), placing positions for respective temporary terminals in the layout hierarchical blocks LSG1 through LSG 3 are determined while taking placing coordinates of cells within these LSG1 through LSG3 into consideration.

First, centers of gravity G, G1, G2 of coordinates of pins of cells linked to nets connected to temporary terminals are determined in the blocks LSG1 through LSG3 in which placing positions of the temporary terminals should be determined, respectively. Incidentally, a connection relation of cells is indicated by broken lines in FIG. 46.

Next, the centers of gravity G, G1 and G2 determined in the respective blocks LSG1 through LSG3 are connected by making a Steiner tree ST irrespective of boundaries of the blocks LSG1 through LSG3 to estimate a wiring route.

Points P1 through P3 at which the Steiner tree crosses the respective block boundaries are determined as placing position of the temporary terminals for the blocks LSG1 through LSG3, respectively.

When a Steiner tree ST is formed, a condition as to whether a branching within each of the blocks LSG1 through LSG3 is possible or not according to the number of temporary terminals of each of the blocks LSG1 through LSG3 is added. If a branching within a block is possible, it is possible to branch the Steiner tree within that block and place block temporary terminals in plural directions. If a branching within the block is not possible, the Steiner tree ST is so formed as to be branched using a region among the blocks LSG1 through LSG3.

As above, it is possible to automatically position the temporary terminals and place them while respecting an intention of the designer and taking placement or wiring of cells within the layout hierarchical block LSGL into consideration in the fifth temporary terminal position determining technique as well.

Figure 47A:
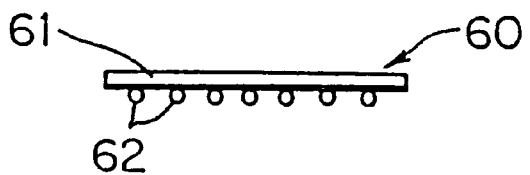
FIGS. 47(a) and 47(b) are side view of a bumped LSI and a perspective view of a bottom surface of the bumped LSI, respectively.
Figure 47B:
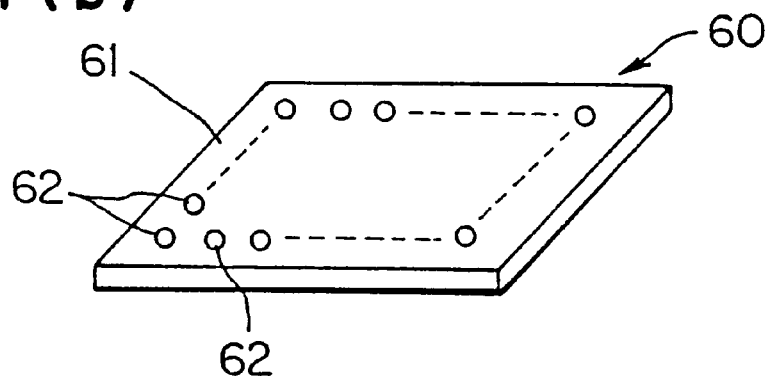
Figure 48:
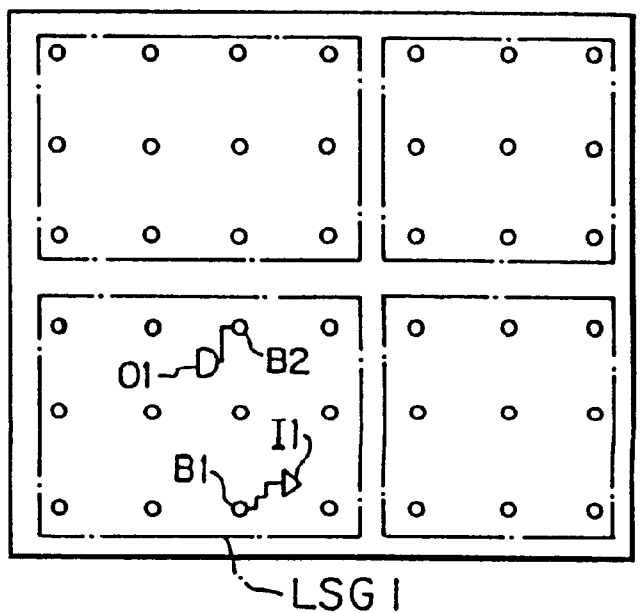
FIG. 48 is a diagram for illustrating a first position determining technique upon a circuit design for a bumped circuit according to the embodiment.
Figure 49:
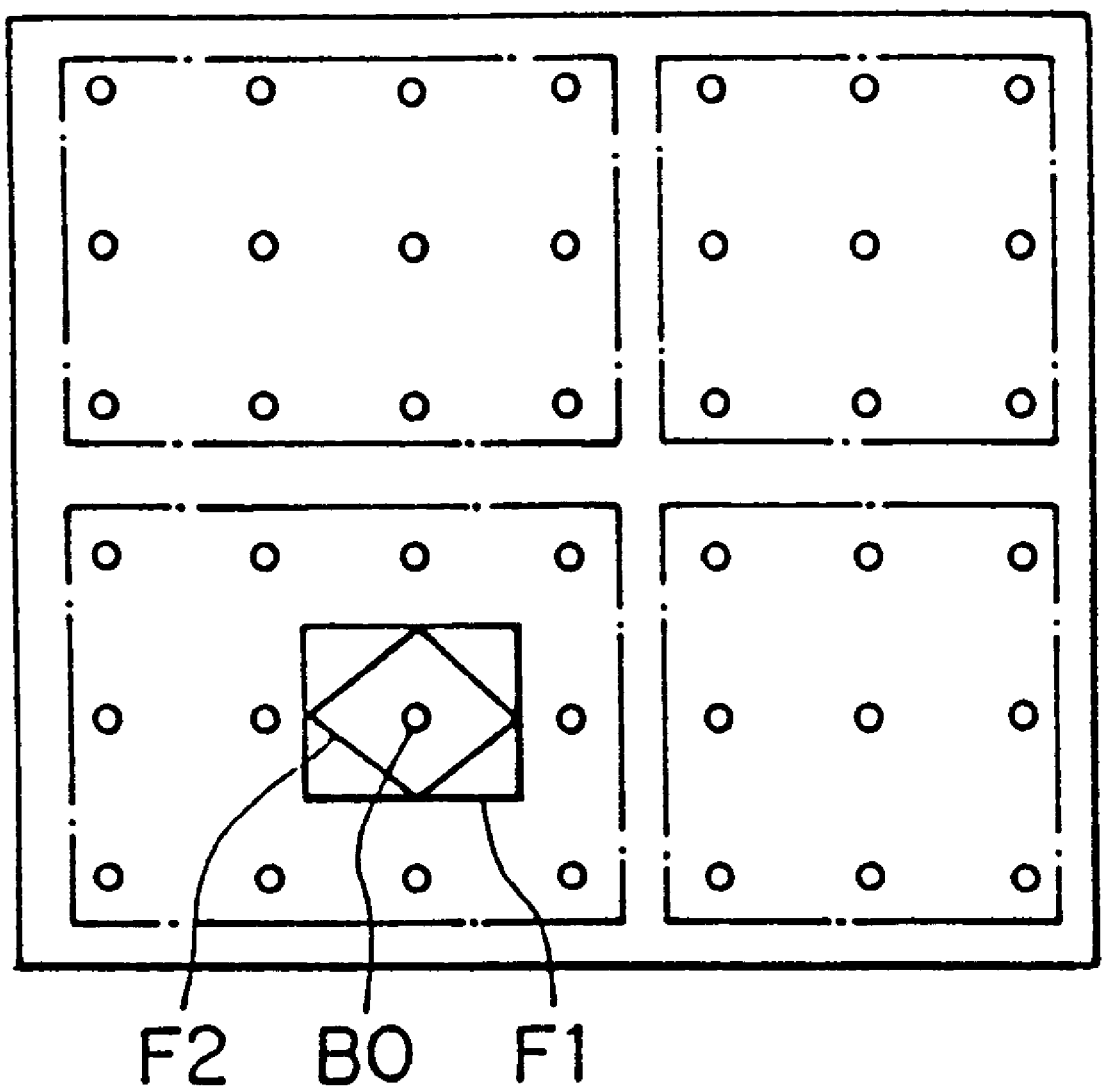
FIG. 49 is a diagram for illustrating a second position determining technique upon a circuit design for a bumped circuit according to the embodiment.

(i) Description of a position determining technique for a bump or an input/output circuit in a design of a bumped circuit according to this embodiment Description will be next made of techniques (i1) and (i2) for determining positions of a bump and an input/output circuit, respectively, in a design of a bumped circuit according to this embodiment with reference to FIGS. 47 through 49.

To begin with, an example of a bumped circuit will be described with reference to FIGS. 47(*a*) and 47(*b*). As shown in FIGS. 47(*a*) and 47(*b*), a bumped LSI 60 employing a system in which bumps (spherical terminals) 62 are arranged as input/output terminals on a surface of an LSI body (a chip) 61 becomes popular in recent years.

Hereinafter, a technique for determining a position of a bump 62 and a position of an input/output circuit connected to the bump 62 on a chip 61 upon a hierarchical layout design of a circuit of such a bumped LSI 60 will be described.

(i1) In a first position determining technique, a function of the placeable position determining unit 41 mentioned hereinbefore is used. If placeable coordinates of signal terminals are determined in advance on a chip surface, this technique is used to allocate the signal in an appropriate place among these coordinates. From coordinates of an input/output circuit inside a block (LSG) mounted individually and from coordinates of that block within the chip, the closest signal terminal placeable coordinates are selected as input/output terminal coordinates.

This first position determining technique will be described with reference to FIG. 48. In FIG. 48, "◯"indicates a position of a chip input/output terminal (bump), and regions of rectangles surrounded by dot-dash lines indicate layout hierarchical blocks.

According to the first position determining technique, if a placing position for an input circuit I1 that should be wired and connected to a chip input/output terminal (bump) and a placing position of an output circuit O1 are already determined on a circuit that is an object of the design in a block LSG1 as shown in FIG. 48, the placeable position determining unit 41 determines placeable positions for input/output terminals closest to positions of pins of the input circuit I1 and the output circuit O1, respectively.

Namely, placing coordinates of the chip input/output terminals are so determined as that wiring distances between the chip input/output terminal and the input circuit I1 and between the chip input/output terminal and the output circuit O1, which are placed in an internal region of the chip, are small. In an example shown in FIG. 48, a position B1 is determined as an input/output terminal placeable position for the input circuit I1, and a position B2 is determined as an input/output terminal placeable position for the output circuit O1.

In practice, an input/output circuit within a region designated by the designer is detected, and a coordinates of a terminal connected to the chip input/output terminal is determined within that input/output. circuit. From that terminal coordinates, a chip input/output terminal placeable position that is closest and unused is determined. As above, when the placeable position determining unit 41 completes a temporary allocation of the chip input/output terminals for all input/output circuits within the instructed region, the allocation is so improved that a total wiring length between the input/output circuits and the chip input/output terminals is the shortest.

When a circuit such as a bumped LSI or the like is designed in a hierarchical layout design, it is possible to wire between the input/output terminal and a pin of the input/output circuit in a wiring length within a limit value even if the input/output terminal and the input/output circuit belong to different layout hierarchy blocks so as to conduct a hierarchical layout design with certainty.

(i2) In a second position determining technique, a function of the restricted region setting unit 42 mentioned hereinbefore is used. When an inside of an individual block (LSG) is mounted after placement of signal terminals on a chip surface, this technique is used to place an input/output circuit within a fixed distance from the terminal. Signal terminal placing coordinates are converted into coordinates inside the block, and a placement limited region determined from those coordinates are used as placement limiting data for the input/output circuit. The placement limiting data is displayed on the display unit 11 upon an interactive placement, which becomes a guide of placement in manual work.

The second position determining technique will be described with reference to FIG. 49. In FIG. 49, "O" represents a position of a chip input/output terminal (a bump), a region of a rectangle surrounded by a dot-dash line represents a layout hierarchical block, and a region of a rectangle F1 surrounded by a solid line represents a limited region which will be described later.

According to the second position determining technique, if a placing position B0 for a chip input/output terminal (a bump) is already determined on a circuit that is an object of the design and a signal is already allocated to that terminal as shown in FIG. 49, placement of the input/output circuit is limited by virtue of the function of the limited region setting unit 42. A limited region is so determined that a distance between the chip input/output terminal and a terminal (pin) of the input/output circuit is below a predetermined value determined (inputted through the input unit 13) by the designer.

A limited region set by the limited region setting unit 42 limits a region in which a placement reference point for an element is placed. Accordingly, a limited region differs depending on a positional relation between the element placement reference point and the terminal. The limited region is expressed as a simple rectangle Fl as shown in FIG. 49, but an actual placement limited region is a rhombus F2 that is the largest and can be drawn within the rectangle F1.

As above, it is possible to wire between the input/output terminal and a pin of the input/output circuit in a wiring length within a limit value so as to conduct hierarchical layout design with certainty in the second position determining technique as well.

The circuit designing apparatus of an interactive type of this invention can be applied similarly in a circuit design for not only an integrated circuit such as an LSI but also a printed circuit board, providing the features and advantages as same as in the above embodiment.

What is claimed is:

1. A circuit designing apparatus of an interactive type having a display unit for displaying circuit design steps and an input unit for inputting responsive information to displayed data on said display unit and information necessary for a circuit design in order to conduct said circuit design in an interactive form comprising:

a layout design unit for conducting a placement in mounting of each of logic components composing a circuit that is an object of a design on the basis of a result of a logic design and wiring between said logic components;

a display control unit for causing said display unit to display a result of the placement and the wiring conducted by said layout design unit; and a placing position determining unit for determining a placing position on a boundary of each layout hierarchy block in which a virtual block terminal is placed whenever said layout design unit divides a region that is an object of a design into plural layout hierarchy blocks to conduct a wiring design, said placing position determining unit determining a center of gravity of coordinates of pins that are logic components linked to a net connected to a virtual block terminal in a layout hierarchy block in which a placing position of said virtual block terminal should be determined, determining a side of said layout hierarchy block which a straight line extending from a position of said center of gravity toward another layout hierarchy block that should be connected to said virtual block terminal crosses, determining a pin of said net closest to said side, and determining a position at which a straight line extending from a position of said pin in a main wiring direction or a sub wiring direction and said side cross as a placing position of said virtual block terminal, said layout design unit conducting a wiring process between said plural layout hierarchy blocks while placing said virtual block terminal in the placing position determined by said placing position determining unit.

2. A circuit designing apparatus of an interactive type having a display unit for displaying circuit design steps and an input unit for inputting responsive information to displayed data on said display unit and information necessary for a circuit design in order to conduct said circuit design in an interactive form comprising:

a layout design unit for conducting a placement in mounting of each of logic components composing a circuit that is an object of a design on the basis of a result of a logic design and wiring between said logic components;

a display control unit for causing said display unit to display a result of the placement and the wiring conducted by said layout design unit; and a placing position determining unit for determining a placing position on a boundary of each of layout hierarchy blocks in which a virtual block terminal is placed whenever said layout design unit divides a region that is an object of a design into plural layout hierarchy blocks to conduct a wiring design, said placing position determining unit determining a center of gravity of coordinates of pins that are logic components linked to a net connected to said virtual block terminal in each of said layout hierarchy blocks connected to one another, connecting centers of gravity determined in respective layout hierarchy blocks with one another with a Steiner tree to estimate wiring paths, and determining positions in each of said estimated wiring path and a boundary of said layout hierarchy block cross as a placing position of a virtual bock terminal of each of said layout hierarchy blocks, said layout design unit conducting a wiring process among said plural layout hierarchy blocks while placing said virtual block terminals in the respective placing positions determined by said placing position determining unit.

3. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting at least two pins of the multiple components, in an interactive manner based on a logic design of the object integrated circuit to be designed, which logic design defines both the required multiple components of the object circuit and the interconnection relationship between the multiple components, said apparatus comprising:

(I) a layout design unit for carrying out layout designing of the object circuit based on the logic design of the object circuit, said layout design unit including:
  (i) a placing unit for placing the multiple components in the predetermined area on the substrate based on the logic design of the object circuit, and
  (ii) a routing unit for routing the multiple wires to interconnect pins of the multiple components placed by said placing unit based on the logic design of the object circuit;

(II) a display unit for displaying various data concerning the layout designing by said layout design unit, which data includes both a result of placement by said placing unit and a result of routing by said routing unit;

(III) a display control unit, responsive to said layout design unit, for controlling said display unit such that said display unit displays data appropriate to a current stage of the layout designing by said layout design unit; and (IV) an input unit for inputting to said layout design unit various items of information necessary for circuit designing in response to the current data displayed by said display unit, thereby allowing circuit designing to be carried out in an interactive manner, said layout design unit being cooperatively connected with both said display control unit and said input unit in a manner so as to facilitate both the inputting operation of said input unit and the display controlling operation of said display control unit, thereby causing improved efficiency of interactive operations in circuit designing, wherein when said display unit displays a floor plan representing both positions of one or more logic components in the multiple components and routes of one or more wires interconnecting between pins of the one or more components in the predetermined area of the substrate in terms of characteristic points and lines interconnecting the characteristic points, said display control unit is operable:
  (i) to select the pins of the one or more components as the characteristic points,
  (ii) to decide a first coordinate value of each characteristic point for each coordinate of a coordinate system according to the positions of the one or more components in the predetermined area,
  (iii) to sort the characteristic points in ascending or descending order of the first coordinate values of the characteristic points for each coordinate,
  (iv) to substitute the first coordinate value of each characteristic point with a second coordinate value proportional to a rank of each characteristic point in the ascending or descending order of the first coordinate values for each coordinate, and
  (v) to cause said display unit to display the characteristic points and the lines interconnecting between the characteristic points in the coordinate system using the second coordinate value of each characteristic point for each coordinate.

4. An interactive circuit designing apparatus according to claim 3, wherein said display control unit is operable to select at least one of an end-point and an internally dividing point of the one or more wires also as the characteristic points.

5. An interactive circuit designing apparatus according to claim 3, wherein when the predetermined area has a plurality of layers in which the multiple wires are to be routed, said display control unit is operable to calculate a third coordinate value of each characteristic point for each coordinate by adding a predetermined offset value to the second coordinate value of each characteristic point n times when the last-named characteristic point exists in the n-th layer from a predetermined one of the bottom and the top of the plural layers, and to cause said display unit to display the charateristic points and the lines interconnecting the characteristic points in the coordinate system using the third coordinate value of each characteristic point for each coordinate.

6. An interactive ircuit designing apparatus according to claim 3, wherein said display control unit is operable to assign an identifier to each characteristic point before substitution of coordinate values, and to cause said display unit to display the characteristic points while designating each characteristic point by the same identifier before and after the substitution of coordinate values.

7. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting between at least two pins of the multiple components, in an interactive manner based on a logic design of the object integrated circuit to be designed, which logic design defines both the required multiple components of the object circuit and the interconnection relationship between the multiple components, said apparatus comprising:

(I) a layout design unit for carrying out layout designing of the object circuit based on the logic design of the object circuit, said layout design unit including:

(i) a placing unit for placing the multiple components in the predetermined area on the substrate based on the logic design of the object circuit, and (ii) a routing unit for routing the multiple wires to interconnect between pins of the multiple components placed bv said placing unit based on the logic design of the object circuit;

(II) a display unit for displaying various data concerning the layout designing by said layout design unit, which data including both a result of placement by said placing unit and a result of routing by said routing unit;

(III) a display control unit, responsive to said layout design unit, for controlling said display unit such that said display unit displays data appropriate to a current stage of the layout designing by said layout design unit; and (IV) an input unit for inputting to said layout design unit various information necessary for circuit designing in response to the current data displayed by said display unit, thereby allowing circuit designing to be carried out in an interactive manner;

wherein said layout design unit further includes:

(iii) a wiring route estimating unit for estimating a result of the routing in said routing unit by routing a multiplicity of provisional wires between the pins of the multiple components based on a result of the placement of the multiple components by said placing unit, and (iv) a congestion degree estimating unit for estimating a congestion degree of the multiple wires of the object circuit for each of local subareas of the predetermined area based on a result of the estimation by said wiring route estimating unit, and said routing unit is operable to determine a routing order of the multiple wires and a roundabout rate for routing each wire based on the congestion degree estimated for each local subarea by said congestion degree estimating unit, and then to carry out the routing of the multiple wires according to both the routing order and the roundabout rate.

8. An interactive circuit designing apparatus for designing an integrated circuit which includes a multiplicity of logic components placed in a predetermined area on a substrate, each component having at least one pin and a multipilicity of wires routed in the predetermined area on the substrate, each wire interconnecting at least two pins of the multiple components, in an interactive manner based on a logic design of the object integrated circuit to be designed which logic design defines both the required multiple components of the object circuit and the interconnection relationship between the multiple components, said apparatus comprising:

(I) a layout design unit for carrying out layout designing of the object circuit based on the logic design of the object circuit, said layout design unit including:

(i) a placing unit for placing the multiple components in the predetermined area on the substrate based on the logic design of the object circuit, and (ii) a routing unit for routing the multiple wires to interconnect pins of the multiple components placed by said placing unit based on the logic design of the object circuit;

(II) a display unit for displaying various data concerning the layout designing by said layout design unit, which data includes both a result of placement by said placing unit and a result of routing by said routing unit;

(III) a display control unit, responsive to said layout design unit, for controlling said display unit such that said display unit displays data appropriate to a current stage of the layout designing by said layout design unit; and (IV) an input unit for inputting to said layout design unit various items of information necessary for circuit designing in response to the current data displayed by said display unit, thereby allowing circuit designing to be carried out in an interactive manner, said layout design unit being cooperatively connected with both said display control unit and said input unit in a manner so as to facilitate both the inputting operation of said input unit and the display controlling operation of said display control unit, thereby causing improved efficiency of interactive operations in circuit designing, wherein said layout design unit further includes a wiring route estimating unit for estimating a result of the routing in said routing unit by routing a multiplicity of provisional wires between the pins of the multiple components based on a result of the placement of the multiple components by said placing unit, wherein said routing unit is operable to determine a routing order of the multiple wires and a roundabout rate of the routing based on a result of estimation by said wiring route estimating unit, and then to carry out the routing of the multiple wires according to both the routing order and the roundabout rate, and wherein said layout design unit further includes a congestion degree estimating unit for estimating a congestion degree of the multiple wires of the object circuit by:

(i) dividing the predetermined area of the substrate into a multiplicity of squares arranged in a checkerboard pattern, (ii) assigning to each of the multiple squares one or more channels available for the routing of the multiple wires, (iii) counting the number of channels used for the routing of the multiple provisional wires among the available channels of each square based on a result of the estimation by said wiring route estimating unit, (iv) estimating the congestion degree for each square by a proportion of the number of the used channels to the number of the available channels for each square, and (v) ranking the multiple squares according to the congestion degree for each square, and said routing unit is operable to assign to each square a relative priority proportional to a rank of each square according to the congestion degree, and to carry out the routing of the multiple wires in the multiple squares according to the priority assigned for each square.

9. An interactive circuit designing apparatus according to claim 8, wherein when the predetermined area has a plurality of layers in which the multiple wires are to be routed, said wiring route estimating unit is operable to carry out the estimation of the result of the routing for each of the plural layers, said congestion degree estimating unit is operable to carry out the estimation of the congestion degree based on a result of the estimation for each layer by said wiring route estimating unit, and said routing unit is operable to carry out the routing of the multiple wires with giving high priorities to wires using a channel in a square having a high congestion degree based on the congestion degree estimated for each wiring layer by said congestion degree estimating unit.

10. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting at least two pins of the multiple components, in an interactive manner based on a logic design of the object integrated circuit to be designed, which logic design defines both the required multiple components of the object circuit and the interconnection relationship between the multiple components, said apparatus comprising:

(I) a layout design unit for carrying out layout designing of the object circuit based on the logic design of the object circuit, said layout design unit including:
  (i) a placing unit for placing the multiple components in the predetermined area on the substrate based on the logic design of the object circuit, and
  (ii) a routing unit for routing the multiple wires to interconnect pins of the multiple components placed by said placing unit based on the logic design of the object circuit;

(II) a display unit for displaying various data concerning the layout designing by said layout design unit, which data includes both a result of placement by said placing unit and a result of routing by said routing unit;

(III) a display control unit, responsive to said layout design unit, for controlling said display unit such that said display unit displays data appropriate to a current stage of the layout designing by said layout design unit; and (IV) an input unit for inputting to said layout design unit various items of information necessary for circuit designing in response to the current data displayed by said display unit, thereby allowing circuit designing to be carried out in an interactive manner, said layout design unit being cooperatively connected with both said display control unit and said input unit in a manner so as to facilitate both the inputting operation of said input unit and the display controlling operation of said display control unit, thereby causing improved efficiency of interactive operations in circuit designing, wherein said layout design unit further includes a wiring route estimating unit for estimating a result of the routing in said routing unit by routing a multiplicity of provisional wires between the pins of the multiple components based on a result of the placement of the multiple components by said placing unit, wherein said routing unit is operable to determine a routing order of the multiple wires and a roundabout rate of the routing based on a result of estimation by said wiring route estimating unit, and then to carry out the routing of the multiple wires according to both the routing order and the roundabout rate, wherein said layout design unit further includes a routability judging unit for judging a routability of the multiple wires with a predetermined roundabout rate based on the estimation by said wiring route estimating unit, and wherein said routing unit is operable to redetermine a roundable rate with which the multiple wires is assumed to be routable when said routability judging unit has judged unroutable with the predetermined roundabout rate.

11. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting at least two pins of the multiple components, in an interactive manner based on a logic design of the object integrated circuit to be designed which logic design defines both the required multiple components of the object circuit and the interconnection relationship between the multiple components, said apparatus comprising:

(I) a layout design unit for carrying out layout designing of the object circuit based on the logic design of the object circuit, said layout design unit including:
  (i) a placing unit for placing the multiple components in the predetermined area on the substrate based on the logic design of the object circuit, and
  (ii) a routing unit for routine the multiple wires to interconnect pins of the multiple components placed by said placing unit based on the logic design of the object circuit;

(II) a display unit for displaying various data concerning the layout designing by said layout design unit which data includes both a result of placement by said placing unit and a result of routing by said routing unit;

(III) a display control unit, responsive to said layout design unit, for controlling said display unit such that said display unit displays data appropriate to a current stage of the layout designing by said layout design unit; and (IV) an input unit for inputting to said layout design unit various items of information necessary for circuit designing in response to the current data displayed bv said display unit, thereby allowing circuit designing to be carried out in an interactive manner, said layout design unit being cooperatively connected with both said display control unit and said input unit in a manner so as to facilitate both the inputting operation of said input unit and the display controlling operation of said display control unit, thereby causing improved efficiency of interactive operations in circuit designing, wherein when the predetermined area has a plurality of layers in which the multiple wires are to be routed and each ofthe plural layers has a specific wiring direction in which wires are to be routed, said routing unit is operable to assign different ranges of wire length respectively to layers having a same wiring direction, and to carry out the routing of the multiple wires in the plural layers according to the wiring direction and the ranges of wire lengths.

12. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting between at least two pins of the multiple components, in an interactive manner based on a logic design of the object integrated circuit to be designed, which logic design defines both the required multiple components of the object circuit and the interconnection relationship between the multiple components, said apparatus comprising:

(I) a layout design unit for carrying out layout designing of the object circuit based on the logic design of the object circuit said layout design unit including:
  (i) a placing unit for placing the multiple components in the predetermined area on the substrate based on the logic design of the object circuit, and
  (ii) a routing unit for routing the multiple wires to interconnect between pins of the multiple components placed by said placing unit based on the logic design of the object circuit;
(II) a display unit for displaying various data concerning the layout designing by said layout design unit which data including both a result of placement by said placing unit and a result of routing by said routing unit;
(III) a display control unit, responsive to said layout design unit, for controlling said display unit such that said display unit displays data appronriate to a current stage of the layout designing by said layout design unit; and
(IV) an input unit for inputting to said layout design unit various information necessary for circuit designing in response to the current data displayed by said display unit, thereby allowing circuit designing to be carried out in an interactive manner;
wherein said routing unit is operable
  (i) to calculate a critical degree for each of the multiple wires based on a predetermined delay value of each wire;
  (ii) to classify the multiple wires according to the critical degree calculated for each wire,
  (iii) to determine a routing order of the multiple wires and a roundable rate for routing of each wire based on the classification of the multiple wires according to the critical degree of each wire, and
  (iv) to carry out the routing of the multiple wires according to the routing order and the roundabout rate.

13. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting at least two pins of the multiple components, in an interactive manner based on a logic design of the object integrated circuit to be designed, which logic design defines both the required multiple components of the object circuit and the interconnection relationship between the multiple components, said apparatus comprising:
  (I) a layout design unit for carrying out layout designing of the object circuit based on the logic design of the object circuit, said layout design unit including:
    (i) a placing unit for placing the multiple components in the predetermined area on the substrate based on the logic design of the object circuit, and
    (ii) a routing unit for routing the multiple wires to interconnect pins of the multiple components placed by said placing unit based on the logic design of the object circuit,
  (II) a display unit for displaying various data concerning the layout designing by said layout design unit, which data includes both a result of placement by said placing unit and a result of routing by said routing unit;
  (III) a display control unit, responsive to said layout design unit, for controlling said display unit such that said display unit displays data appropriate to a current stage of the layout designing by said layout design unit; and
  (IV) an input unit for inputting to said layout design unit various items of information necessary for circuit designing in response to the current data displayed by said display unit, thereby allowing circuit designing to be carried out in an interactive manner,
  said layout design unit being cooperatively connected with both said display control unit and said input unit in a manner so as to facilitate both the inputting operation of said input unit and the display controlling operation of said display control unit, thereby causing improved efficiency of interactive operations in circuit designing,
  wherein said routing unit is operable to classify the multiple wires to be routed according to a critical degree to a delay value of each of the multiple wires, to determine a routing order of the multiple wires and a roundable rate for each wire, and to carry out the routing of the multiple wires according to the routing order and the roundabout rate, and
  wherein said layout design unit is operable to set a wiring tolerable degree of one wire according to the critical degree for another wire which is to be routed adjacent to the one wire prior to the routing of the one wire, and to carry out the routing of the one wire according to the wiring tolerable degree after the routing of the one wire.

14. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting between at least two pins of the multiple components, in an interactive manner based on a logic design of the object integrated circuit to be designed, which logic design defines both the required multiple components of the object circuit and the interconnection relationship between the multiple components, said apparatus comprising:
  (I) a layout design unit for carrying out layout designing of the object circuit based on the logic design of the object circuit, said layout design unit including:
    (i) a placing unit for placing the multiple components in the predetermined area on the substrate based on the logic design of the object circuit, and
    (ii) a routing unit for routing the multiple components placed by said placing unit based on the logic design of the object circuit;
  (II) a display unit for displaying various data concerning the layout designing by said layout design unit, which data including both a result of placement by said placing unit and a result of routing by said routing unit;
  (III) a display control unit, responsive to said layout design unit, for controlling said display unit such that said display unit displays data appropriate to a current stage of the layout designing by said layout design unit; and
  (IV) an input unit for inputting to said layout design unit various information necessary for circuit designing in response to the current data displayed by said display unit, thereby allowing circuit designing to be carried out in an interactive manner;
  wherein said layout design unit further includes a placement check unit for checking whether there is any error component, which causes a placement error, among the multiple components based on a result of the placement of the multiple components by said placement unit, and when one or more error components are found during the checking by said placement check unit, said display control unit is operable to control said display unit such that said display unit displays both a list of the error components and a placement map of the object circuit, which placement map represents the placement result of the multiple components by said placement unit, and to highlight one or more parts of the placement map displayed on said displayed unit, said parts corresponding to the one or more error components.

15. An interactive circuit designing apparatus according to claim 14, wherein when said input unit inputs an instruction to select one of the error components included in the list, said display control unit is operable to highlight the selected error component on said placement map.

16. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting at least two pins of the multiple components, in an interactive manner based on a logic design of the object integrated circuit to be designed, which logic design defines both the required multiple components of the object circuit and the interconnection relationship between the multiple components, said apparatus comprising:
 a layout design unit for carrying out layout designing of the object circuit based on the logic design of the object circuit, said layout design unit including:
  (i) a placing unit for placing the multiple components in the predetermined area on the substrate based on the logic design of the object circuit, and
  (ii) a routing unit for routing the multiple wires to interconnect pins of the multiple components placed by said placing unit based on the logic design of the object circuit;
 (II) a display unit for displaying various data concerning the layout designing by said layout design unit, which data includes both a result of placement by said placing unit and a result of routing by said routing unit;
 (III) a disolay control unit, responsive to said layout design unit, for controlling said display unit such that said display unit displays data appropriate to a current stage of the layout designing by said layout design unit; and
 (IV) an input unit for inputting to said layout design unit various items of information necessary for circuit designing in response to the current data displayed by said display unit, thereby allowing circuit designing to be carried out in an interactive manner,
 said layout design unit being cooperatively connected with both said display control unit and said input unit in a manner so as to facilitate both the inputting operation of said input unit and the display controlling operation of said display control unit, thereby causing improved efficiency of interactive operations in circuit designing,
 wherein said layout design unit further includes a congestion degree computing unit for dividing the predetermined area into a plurality of local subareas and computing a congestion degree of the multiple wires in each of the plural local subareas of the predetermined area based on the result of routing of the multiple wires by said routing unit, and
 when said input inputs an instruction to re-route a selected one of the multiple wires while adding a specified length to a current wire length of the selected wire after the routing of the multiple wires by said routing unit, said routing until is operable to select a local subarea across which the selected wire is routed and which has a low congestion degree among the plural local subareas based on a result of the computation by said congestion degree computing unit, and to automatically carry out the re-routing of the selected wire while adding the specified length within the selected subarea.

17. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting between at least two pins of the multiple components, in an interactive manner based on a logic design of the object integrated circuit to be designed, which logic design defines both the required multiple components of the object circuit and the interconnection relationship between the multiple components, said apparatus comprising:
 (I) a layout design unit for carrying out layout designing of the object circuit based on the logic design of the object circuit, said layout design unit including:
  (i) a placing unit for placing the multiple components in the predetermined area on the substrate based on the logic design of the object circuit, and
  (ii) a routing unit for routing the multiple components placed by said placing unit based on the logic design of the object circuit;
 (II) a display unit for displaying various data concerning the layout designing by said layout design unit which data including both a result of placement by said placing unit and a result of routing by said routing unit;
 (III) a display control unit, responsive to said layout design unit, for controlling said display unit such that said display unit displays data appropriate to a current stage of the layout designing by said layout design unit; and
 (IV) an input unit for inputting to said layout design unit various information necessary for circuit designing in response to the current data displayed by said display unit, thereby allowing circuit designing to be carried out in an interactive manner;
 wherein after the routing of the multiple wires is carried out by said routing unit and when said input unit inputs data selecting one of the multiple wires which is to be re-routed, data specifying a length which is to be added to a current wire length of the selected wire, and data specifying a local subarea of the predetermined area within which area the selected wire is to be re-routed, said routing unit is operable to automatically carry out the re-routing of the selected wire within the selected subarea while adding the specified length to the current wire length of the selected wire.

18. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting between at least two pins of the multiple components, in an interactive manner based on a logic design of the object integrated circuit to be designed, which logic design defines both the required multiple components of the object circuit and the interconnection relationship between the multiple components, said apparatus comprising:

(I) a layout design unit for carrying out layout designing of the object circuit based on the logic design of the object circuit, said layout design unit including:
  (i) a placing unit for placing the multiple components in the predetermined area on the substrate based on the logic design of the object circuit, and
  (ii) a routing unit for routing the multiple components placed by said placing unit based on the logic design of the object circuit;
(II) a display unit for displaying various data concerning the layout designing by said layout design unit which data including both a result of placement by said placing unit and a result of routing by said routing unit;
(III) a display control unit, responsive to said layout design unit for controlling said display unit such that said display unit displays data appropriate to a current stage of the layout designing by said layout design unit; and
(IV) an input unit for inputting to said layout design unit various information necessary for circuit designing in response to the current data displayed be said display unit, thereby allowing circuit designing to be carried out in an interactive manner;

wherein when said input unit inputs an instruction to replace a selected one ofthe multiple components in a specified position on the predetermined area after the placement of the selected component by said placing unit and the routing of one or more wires associated with the selected component are carried out, said associated wires interconnecting between the selected component and one or more other components by said routing unit, said placing unit is operable to replace the selected component in the specified position according to the instruction, and said routing unit is operable to automatically re-route the associated wires in accordance with the specified position in which the selected component is replaced by said placing unit.

19. An interactive circuit designing apparatus for designing an integrated circuit which includes a multiplicity of logic components placed in a predetennined area on a substrate, each component having at least one pin, and a multiplicity of wires routed in the predetermined area on the substrate, each wire interconnecting between at least two pins of the multiple components, in an interactive manner based on a logic design of the object integrated circuit to be designed, which logic design defines both the required multiple components of the object circuit and the interconnection relationship between the multiple components, said apparatus comprising:
  (I) a layout design unit for carrying out layout designing of the object circuit based on the logic design of the object circuit, said layout design unit including:
    (i) a placing unit for placing the multiple components in the predetermined area on the substrate based on the logic design of the object circuit, and
    (ii) a routing unit for routing the multiple components placed by said placing unit based on the logic design of the object circuit;
  (II) a display unit for displaying various data concerning the layout designing by said layout design unit, which data including both a result of placement by said placing unit and a result of routing by said routing unit;
  (II) a display control unit, responsive to said layout design unit, for controlling said display unit such that said display unit displays data appropriate to a current stage of the layout designing by said layout design unit; and
  (IV) an input unit for inputting to said layout design unit various information necessary for circuit designing in response to the current data displayed by said display unit, thereby allowing circuit designing to be carried out in an interactive manner;

wherein said display unit is operable to display a plurality of placement maps each representing a part of the placement result of the multiple components by said placement unit, and when one or more components included in a selected one of the plural placement maps are replaced by said placing units, or one or more wires included in the selected map are re-routed by said routing unit, in response to an external instruction through said input unit, said display control unit is operable to automatically renew both the selected map and any other one or more maps each including the one or more components, or the one or more wires, according to the replacement by said placing unit, or the re-routing by said routing unit.

20. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting at least two pins of the multiple components, in an interactive manner based on a logic design ofthe object integrated circuit to be designed, which logic design defines both the required multiple components of the object circuit and the interconnection relationship between the multiple components, said apparatus comprising:
  (I) a layout design unit for carrying out layout designing of the object circuit based on the logic design of the object circuit, said layout design unit including:
    (i) a placing unit for placing the multiple components in the predetermined area on the substrate based on the logic design of the object circuit, and
    (ii) a routing unit for routing the multiple wires to interconnect pins of the multiple components placed by said placing unit based on the logic design of the object circuit;
  (II) a display unit for displaying various data concerning the layout designing by said layout design unit, which data includes both a result of placement by said placing unit and a result of routing by said routing unit;
  (III) a display control unit, responsive to said layout design unit, for controlling said display unit such that said display unit displays data appropriate to a current stage of the layout designing by said layout design unit; and
  (IV) an input unit for inputting to said layout design unit various items of information necessary for circuit designing in response to the current data displayed by said display unit, thereby allowing circuit designing to be carried out in an interactive manner, said layout design unit being cooperatively connected with both said display control unit and said input unit in a manner so as to facilitate both the inputting operation of said input unit and the display controlling operation of said display control unit, thereby causing improved efficiency of interactive operations in circuit designing, wherein said layout design unit is operable to divide the predetermined area into a plurality of layout hierarchy blocks in which the multiple components are to be disposed in a predetermined distribution and further includes a placing region setting unit for setting a placing region, within which a block terminal is to be placed, on a boundary of each layout hierarchy block according to an instruction through said input unit, where the block terminal is a logical component which is to be placed in one layout hierarchy block and connected to a logical component which is to be placed in another layout hierarchy block adjacent to the one layout hierarchy block, and wherein said routing unit is operable to carry out the routing with placing the block terminal inside the placing region set for each layout hierarchy block by said placing region setting unit.

21. An interactive circuit designing apparatus according to claim 19, wherein said layout design unit further includes a grouping unit for grouping a plurality of block terminals and registering the plural terminals as a terminal group according to an instruction through said input unit for each layout hierarchy block, and said placing region setting unit is operable to set the placing region for each group registered by said grouping unit according to an instruction through said input unit.

22. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting at least two pins of the multiple components, in an interactive manner based on a logic design ofthe object integrated circuit to be designed, which logic design defines both the required multiple components of the object circuit and the interconnection relationship between the multiple components, said apparatus comprising:

(I) a layout design unit for carrying out layout designing of the object circuit based on the logic design of the object circuit, said layout design unit including:
   (i) a placing unit for placing the multiple components in the predetermined area on the substrate based on the logic design of the object circuit, and
   (ii) a routing unit for routing the multiple wires to interconnect pins of the multiple components placed by said placing unit based on the logic design of the object circuit;

(II) a display unit for displaying various data concerning the layout designing by said layout design unit, which data includes both a result of placement by said placing unit and a result of routing by said routing unit;

(III) a display control unit, responsive to said layout design unit, for controlling said display unit such that said display unit displays data appropriate to a current stage of the layout designing by said layout design unit; and (IV) an input unit for inputting to said layout design unit various items of information necessary for circuit designing in response to the current data displayed by said display unit, thereby allowing circuit designing to be carried out in an interactive manner, said layout design unit being cooperatively connected with both said display control unit and said input unit in a manner so as to facilitate both the inputting operation of said input unit and the display controlling operation of said display control unit, thereby causing improved efficiency of interactive operations in circuit designing, wherein said layout design unit is operable to divide the predetermined area into a plurality of layout hierarchy blocks in which the multiple components are to be disposed in a predetermined distribution and further includes a forbidden region setting unit for setting a forbidden region, within which a block terminal is not to be placed, on a boundary of each layout hierarchy block according to an instruction through said input unit, where the block terminal is a logical component which is to be placed in one layout hierarch block and connected to a logical component which is to be placed in another layout hierarchy block adjacent to the one layout hierarchy block, and wherein said routing unit is operable to carry out the routing with placing the block terminal outside the forbidden region set for each layout hierarchy bock by said forbidden region setting unit.

23. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting at least two pins of the multiple components, in an interactive manner based on a logic design of the object integrated circuit to be designed, which logic design defines both the required multiple components of the object circuit and the interconnection relationship between the multiple components, said apparatus comprising:

(I) a layout design unit for carrying out layout designing of the obiect circuit based on the logic design of the object circuit, said layout design unit including:
   (i) a placing unit for placing the multiple components in the predetermined area on the substrate based on the logic design of the object circuit, and
   (ii) a routing unit for routing the multiple wires to interconnect pins of the multiple components placed by said placing unit based on the logic design of the object circuit;

(II) a display unit for displaying various data concerning the layout designing by said layout design unit, which data includes both a result of placement by said placing unit and a result of routing by said routing unit;

(III) a display control unit, responsive to said layout design unit, for controlling said display unit such that said display unit displays data appropriate to a current stage of the layout designing by said layout design unit; and an input unit for inputting to said layout design unit various items of information necessary for circuit designing in response to the current data displayed by said display unit, thereby allowing circuit designing to be carried out in an interactive manner, said layout design unit being cooperatively connected with both said display control unit and said input unit in a manner so as to facilitate both the inputting operation of said input unit and the display controlling operation of said display control unit, thereby causing improved efficiency of interactive operations in circuit designing, wherein said layout design unit further includes a placeable position determining unit responsive to an instruction through said input unit, said placeable position determining unit being operable, when the multiple components of the object circuit include both an input/output circuit, which is to be placed in a predetermined position on a substrate, and one or more input/output terminals, which are to be placed on a surface of the substrate and to be interconnected with one or more pins of the input/output circuit, to determine a placeable position, in which the one or more input/output terminals are to be placed, based on the predetermined position in which the input/output circuit is to be placed in such a manner as to diminish distances between the one or more input/output terminals and a respective one of the one or more pins of the input/output circuit, and wherein said routing unit is operable to carry out the routing of a wire between the each of the one or more input/output terminals and the respective one of the one or more pin of the input/output circuit based on the placeable position of the one or more input/output terminals determined by said placeable position determining unit.

24. An interactive circuit designing apparatus for designing an integrated circuit which includes a multiplicity of logic components placed in a predetermined area on a substrate, each component having at least one pin, and a multiplicity of wires routed in the predetermined area on the substrate, each wire interconnecting at least two pins of the multiple components, in an interactive manner based on a logic design of the object integrated circuit to be designed, which logic design defines both the required multiple components of the object circuit and the interconnection relationship between the multiple components said apparatus comprising:

(I) a layout design unit for carrying out layout designing of the object circuit based on the logic design of the object circuit, said layout design unit including:

(i) a placing unit for placing the multiple components in the predetermined area on the substrate based on the logic design of the object circuit, and (ii) a routing unit for routine the multiple wires to interconnect pins of the multiple components placed by said placing unit based on the logic design of the object circuit;

(II) a display unit for displaying various data concerning the layout designing by said layout design unit, which data includes both a result of placement by said placing unit and a result of routing by said routing unit;

(III) a display control unit, responsive to said layout design unit, for controlling said display unit such that said display unit displays data appropriate to a current stage of the layout designing by said layout design unit; and (IV) an input unit for inputting to said layout design unit various items of information necessary for circuit designing in response to the current data displayed by said display unit, thereby allowing circuit designing to be carried out in an interactive manner, said layout design unit being cooperatively connected with both said display control unit and said input unit in a manner so as to facilitate both the inputting operation of said input unit and the display controlling operation of said display control unit, thereby causing improved efficiency of interactive operations in circuit designing, wherein said layout design unit further includes a limited region setting unit responsive to an instruction through said input unit, said limited region setting unit being operable, when the multiple components of the object circuit include an input/output circuit and one or more input/output terminals, which are to be placed in predetermined positions on a surface of the substrate and to be interconnected with one or more pins of the input/output circuit, to set a limited region, within which the input/output circuit is to be placed, based on the predetermined positions in which the one or more input/output terminals are to be placed in such a manner that each of distances between the one or more input/output terminals and a respective one of the one or more pins of the input/output circuit is below a predetermined value, and wherein said placing unit is operable to place the input/output circuit inside the limited region set by said limited region setting unit.

* * * * *